(12) United States Patent
Lin et al.

(10) Patent No.: US 9,082,636 B2
(45) Date of Patent: Jul. 14, 2015

(54) PACKAGING METHODS AND STRUCTURES FOR SEMICONDUCTOR DEVICES

(71) Applicant: Taiwan Semiconductor Manufacturing Company, Ltd., Hsin-Chu (TW)

(72) Inventors: Chih-Wei Lin, Zhubei (TW); Kuei-Wei Huang, Hsin-Chu (TW); Yu-Peng Tsai, Taipei (TW); Chun-Cheng Lin, New Taipei (TW); Meng-Tse Chen, Changzhi Township (TW); Chen-Hua Yu, Hsin-Chu (TW); Mirng-Ji Lii, Sinpu Township (TW); Chung-Shi Liu, Hsin-Chu (TW); Bor-Ping Jang, Chu-Bei (TW); Hsiu-Jen Lin, Zhubei (TW); Wen-Hsiung Lu, Jhonghe (TW); Ming-Da Cheng, Jhubei (TW); Wei-Hung Lin, Xinfeng Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/523,248

(22) Filed: Oct. 24, 2014

(65) Prior Publication Data

US 2015/0044819 A1 Feb. 12, 2015

Related U.S. Application Data

(62) Division of application No. 13/228,768, filed on Sep. 9, 2011, now Pat. No. 8,884,431.

(51) Int. Cl.
*H01L 21/00* (2006.01)
*H01L 25/065* (2006.01)
(Continued)

(52) U.S. Cl.
CPC ............ *H01L 25/0657* (2013.01); *H01L 21/52* (2013.01); *H01L 21/565* (2013.01); *H01L 21/568* (2013.01); *H01L 21/6835* (2013.01); *H01L 23/49816* (2013.01); *H01L 23/49822* (2013.01); *H01L 23/49827* (2013.01); *H01L 23/5389* (2013.01); *H01L 24/03* (2013.01); *H01L 24/11* (2013.01); *H01L 24/92* (2013.01); *H01L 24/97* (2013.01); *H01L 25/0652* (2013.01); *H01L 25/0655* (2013.01); *H01L 25/50* (2013.01); *H01L 21/76898* (2013.01); *H01L 23/3128* (2013.01); *H01L 24/05* (2013.01); *H01L 24/09* (2013.01); *H01L 24/13* (2013.01);
(Continued)

(58) Field of Classification Search
None
See application file for complete search history.

(56) References Cited

U.S. PATENT DOCUMENTS

| 7,915,622 | B2 | 3/2011 | Wang |
| 8,149,585 | B2 | 4/2012 | Kawano |

(Continued)

OTHER PUBLICATIONS

Zhang, Y. et al., "Lead-Free Bumping and its Challenges," IWLPC Conference Proceedings, Oct. 10, 2004, 8 pages.

*Primary Examiner* — Sonya D McCall Shepard
(74) *Attorney, Agent, or Firm* — Slater & Matsil, L.L.P.

(57) ABSTRACT

Packaging methods and structures for semiconductor devices are disclosed. In one embodiment, a packaged semiconductor device includes a redistribution layer (RDL) having a first surface and a second surface opposite the first surface. At least one integrated circuit is coupled to the first surface of the RDL, and a plurality of metal bumps is coupled to the second surface of the RDL. A molding compound is disposed over the at least one integrated circuit and the first surface of the RDL.

20 Claims, 67 Drawing Sheets

(51) Int. Cl.
  *H01L 23/498* (2006.01)
  *H01L 21/56* (2006.01)
  *H01L 23/00* (2006.01)
  *H01L 21/683* (2006.01)
  *H01L 25/00* (2006.01)
  *H01L 23/538* (2006.01)
  *H01L 21/52* (2006.01)
  *H01L 21/768* (2006.01)
  *H01L 23/31* (2006.01)
  *H01L 25/03* (2006.01)
  *H01L 25/10* (2006.01)

(52) U.S. Cl.
  CPC .............. *H01L 24/16* (2013.01); *H01L 24/81* (2013.01); *H01L 25/03* (2013.01); *H01L 25/105* (2013.01); *H01L 2221/68331* (2013.01); *H01L 2221/68345* (2013.01); *H01L 2221/68377* (2013.01); *H01L 2224/0231* (2013.01); *H01L 2224/0401* (2013.01); *H01L 2224/04105* (2013.01); *H01L 2224/06515* (2013.01); *H01L 2224/09181* (2013.01); *H01L 2224/131* (2013.01); *H01L 2224/13082* (2013.01); *H01L 2224/13147* (2013.01); *H01L 2224/16225* (2013.01); *H01L 2224/16238* (2013.01); *H01L 2224/81005* (2013.01); *H01L 2224/81191* (2013.01); *H01L 2224/81815* (2013.01); *H01L 2224/9202* (2013.01); *H01L 2224/97* (2013.01); *H01L 2225/06513* (2013.01); *H01L 2225/06517* (2013.01); *H01L 2225/06524* (2013.01); *H01L 2225/06541* (2013.01); *H01L 2225/06548* (2013.01); *H01L 2924/14* (2013.01); *H01L 2924/1461* (2013.01); *H01L 2924/15311* (2013.01); *H01L 2924/15321* (2013.01); *H01L 2924/15322* (2013.01); *H01L 2924/19107* (2013.01)

(56) References Cited

U.S. PATENT DOCUMENTS

| | | |
|---|---|---|
| 8,357,563 B2 | 1/2013 | Chin et al. |
| 2002/0117743 A1 | 8/2002 | Nakatani et al. |
| 2004/0256731 A1 | 12/2004 | Mao et al. |
| 2004/0262774 A1 | 12/2004 | Kang et al. |
| 2005/0179025 A1 | 8/2005 | Okuyama et al. |
| 2005/0205981 A1 | 9/2005 | Yoshimura et al. |
| 2007/0161266 A1 | 7/2007 | Nishizawa |
| 2008/0093717 A1 | 4/2008 | Huang et al. |
| 2008/0142976 A1 | 6/2008 | Kawano |
| 2008/0233676 A1 | 9/2008 | Tsai |
| 2009/0057862 A1 | 3/2009 | Ha et al. |
| 2009/0057917 A1 | 3/2009 | Takaike |
| 2010/0237482 A1 | 9/2010 | Yang et al. |
| 2011/0062592 A1 | 3/2011 | Lee et al. |
| 2011/0186960 A1 | 8/2011 | Wu et al. |
| 2011/0215458 A1 | 9/2011 | Camacho et al. |
| 2012/0223429 A1 | 9/2012 | Khan et al. |
| 2012/0326296 A1 | 12/2012 | Choi et al. |
| 2013/0009303 A1 | 1/2013 | Tsai et al. |

PACKAGING METHODS AND STRUCTURES FOR SEMICONDUCTOR DEVICES

CROSS-REFERENCE TO RELATED APPLICATIONS

This application is a divisional of U.S. patent application Ser. No. 13/228,768, filed on Sep. 9, 2011, and entitled "Packaging Methods and Structures for Semiconductor Devices," which application is incorporated herein by reference.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Some smaller types of packaging for semiconductors include quad flat pack (QFP), pin grid array (PGA), ball grid array (BGA), flip chips (FC), three dimensional integrated circuits (3D ICs,) wafer level packages (WLPs), bond-on-trace (BOT) packages, and package on package (PoP) structures. However, these packaging techniques require organic substrates, which have a high cost and a large form factor.

What are needed in the art are improved packaging structures and methods for semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packaging of semiconductor devices. Several embodiments of packaging one or more ICs singly or multiply, laterally or vertically, or combinations thereof, with a variety of manufacturing methods and configurations will be described herein.

Figure 1:
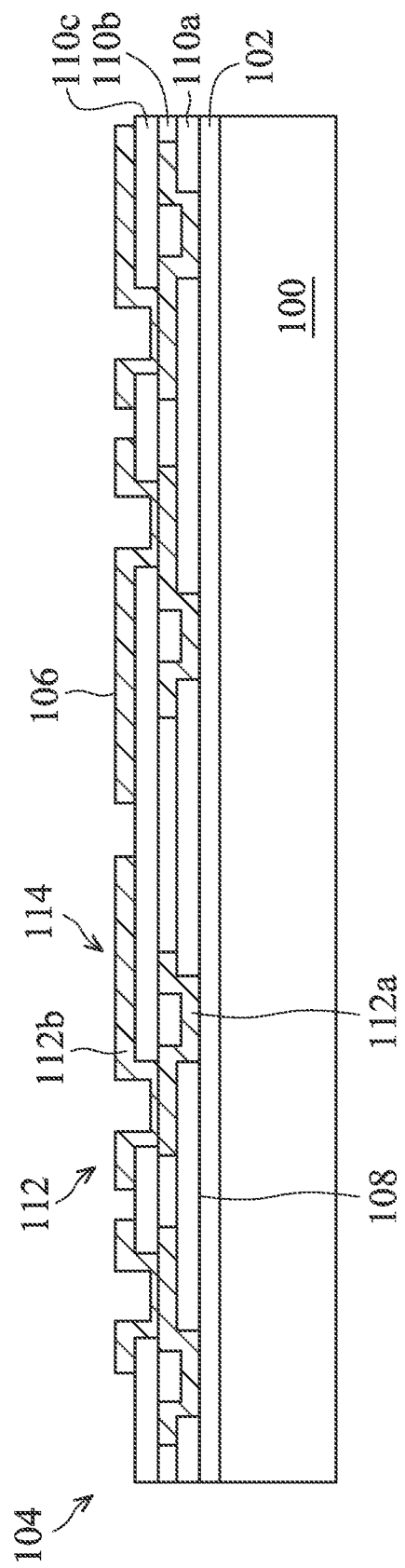
FIGS. 1 through 7 show cross-sectional views of a method of packaging a semiconductor device in accordance with an embodiment of the present disclosure, wherein a single integrated circuit (IC) is packaged using a redistribution layer (RDL) and a molding compound.

FIGS. 1 through 7 show cross-sectional views of a method of packaging a semiconductor device in accordance with an embodiment of the present disclosure. Referring first to FIG. 1, a carrier wafer 100 is provided. The carrier wafer 100 may comprise glass, silicon (e.g., a silicon wafer), silicon oxide, metal plate, or a ceramic material, as examples. An adhesive 102 is applied over the carrier wafer 100. The adhesive 102 may comprise epoxy, silicone rubber, polyimide (PI), phenylenebenzobisoxazole (PBO), benzocyclobutene (BCB), a polymer, or a metal, as examples, although other materials may also be used. The adhesive 102 may be applied by spin-coating, printing, chemical vapor deposition (CVD), or physical vapor deposition (PVD), as examples.

An RDL 104 is formed over the carrier wafer 100, e.g., over the adhesive 102. The RDL 104 may comprise one or more insulating layers and wiring layers. The RDL 104 may include inter-level dielectrics (ILDs) 110a, 110b, 110c with wiring 112 in metallization layers disposed or formed therein. The wiring 112 may comprise one or more vias and/or conductive lines, for example. One or more of the vias and/or conductive lines may be coupled together within the ILDs 110a, 110b, 110c, as shown. The wiring 112 comprises first wiring 112a and second wiring 112b in the example shown.

The RDL 104 may be formed by forming or coating a first ILD 110a over the adhesive 102. The ILD 110a is exposed and developed, patterning the ILD 110a with openings to expose portions of the adhesive 102 in predetermined locations. First wiring 112a is formed by depositing a first layer of photoresist (not shown) over the patterned ILD 110a, patterning the first layer of photoresist, and plating the first wiring 112a over the patterned ILD 110a. The first layer of photoresist is removed. ILDs 110b and 110c, which comprise a single layer in this embodiment, are formed or coated over the first wiring 112a and exposed portions of ILD 110a. The ILD 110b/110c is exposed and developed, patterning the ILD 110b/110c with openings to expose portions of the underlying first wiring 112a and ILD 110a in predetermined locations. Second wiring 112b is formed by depositing a second layer of photoresist (also not shown) over the patterned ILD 110b/110c, patterning the second layer of photoresist, and plating the second wiring 112b over the patterned ILDb/ILDc. The second layer of photoresist is then removed.

Alternatively, the wiring 112 of the RDL 104 may be formed by one or more single or dual damascene techniques by patterning the ILDs 110a, 110b, and 110c and filling the patterns with a conductive material. Or, the wiring 112 may be formed by one or more subtractive etch processes, and the ILDs 110a, 110b, and 110c may be formed over the wiring 112 after each subtractive etch process, for example.

The RDL 104 comprises a first surface 106 for connecting to a semiconductor device or integrated circuit (IC) 116. The RDL 104 also comprises a second surface 108 opposite the first surface 106 for making electrical connections of the package, e.g., in an end application the package is used in. A portion of the wiring 112 resides on the first surface 106 of the RDL 104. In some embodiments, portions of the wiring 112 on the first surface 106 of the RDL 104 comprise traces 114 that are coupleable to contacts of an IC 116. The IC 116 is attached to the RDL 104 using a bond-on-trace (BOT) attachment technique in some embodiments, for example.

Figure 2:
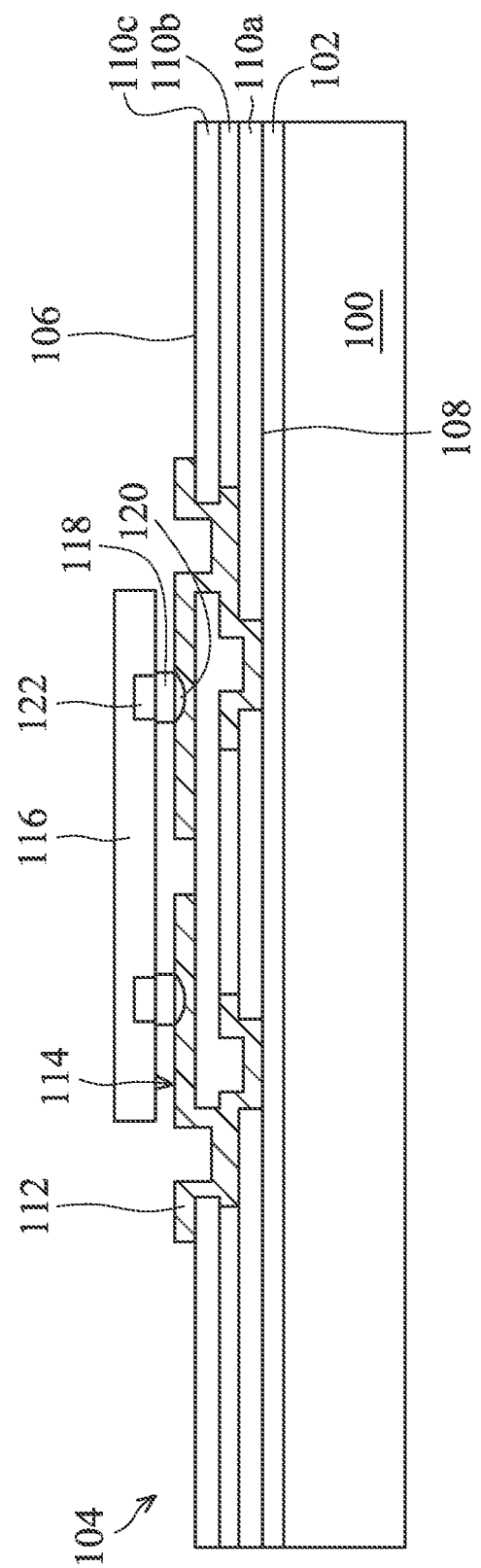

An IC 116 is attached to the RDL 104, as shown in FIG. 2. The IC 116 may comprise a workpiece or substrate with one or more circuits formed thereon (not shown). The IC 116 may comprise logic circuitry, a memory device, or other types of circuits, as examples. The IC 116 includes a plurality of contact pads 122 formed at a surface thereof. Metal pillars 118 may be formed that are coupled to the contact pads 122, and a solder bump 120 may be formed on each metal pillar 118. The metal pillars 118 may comprise copper or other metals and are optional; the metal pillars 118 may not be included in some embodiments, for example. Rather, solder bumps 120 may be formed directly on the contact pads 122 of the IC 116 in some embodiments. The IC 116 is bonded to the wiring 112 of the RDL 104, e.g., by bonding the solder bumps 120 to the traces 114 of the wiring 112.

Figure 3:
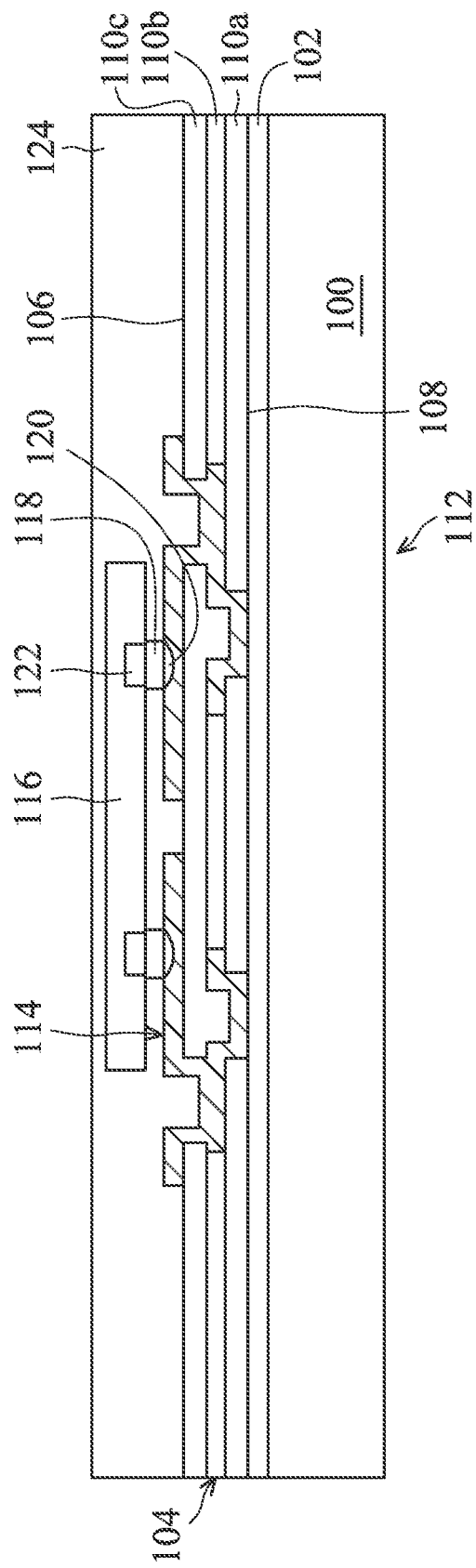

A molding compound 124 is formed over the IC 116 and the RDL 104, as shown in FIG. 3. The molding compound 124 may comprise compression molding and may comprise epoxy, rubber, or polyimide (PI) in some embodiments, for example, although the molding compound 124 may alternatively comprise other materials. The molding compound 124 may at least partially fill the space beneath the IC 116, e.g., between the RDL 104 and the IC 116, as shown.

Figure 4:
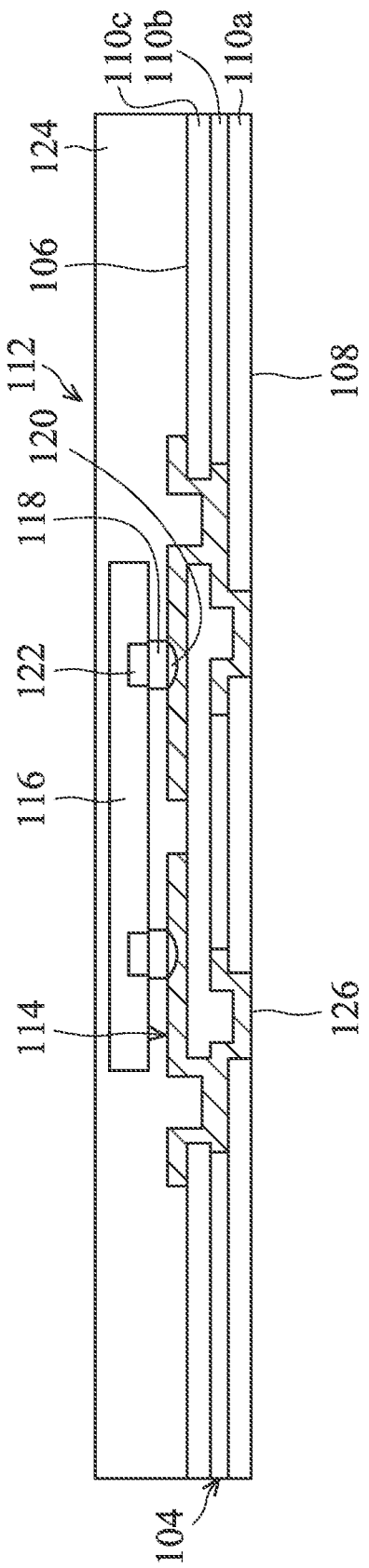

The carrier wafer 100 and adhesive 102 are then removed, as shown in FIG. 4, exposing portions 126 of the second surface 108 of the wiring 112 of the RDL 104. The exposed portions 126 may comprise landing pads for metal bumps, for example. The exposed portions 126 may comprise bond pads for solder balls or solder bumps in some embodiments, for example.

Figure 5:
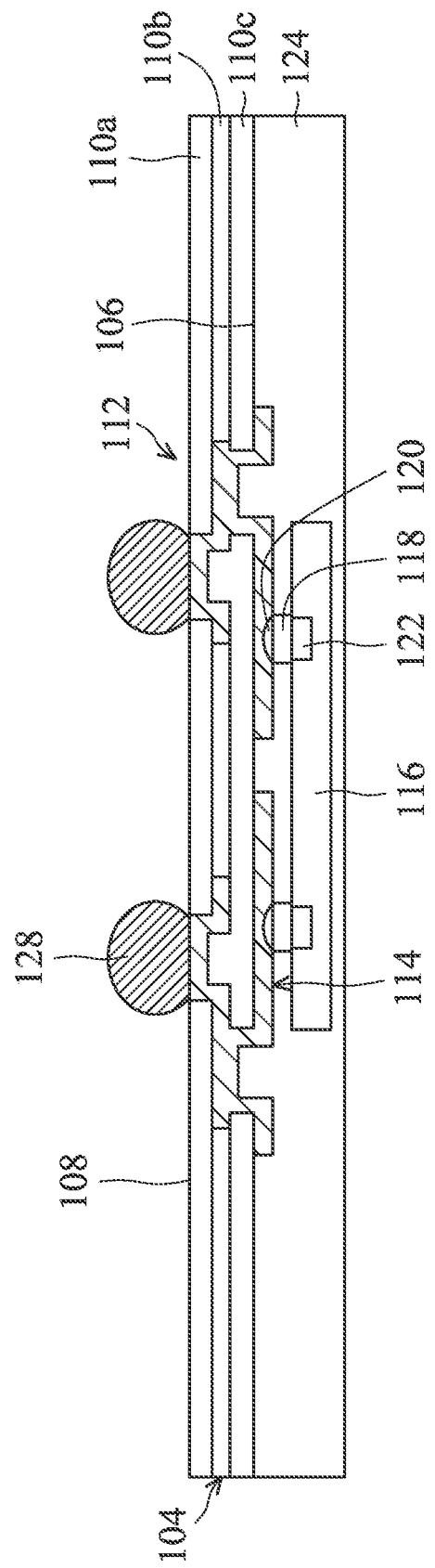
Figure 6:
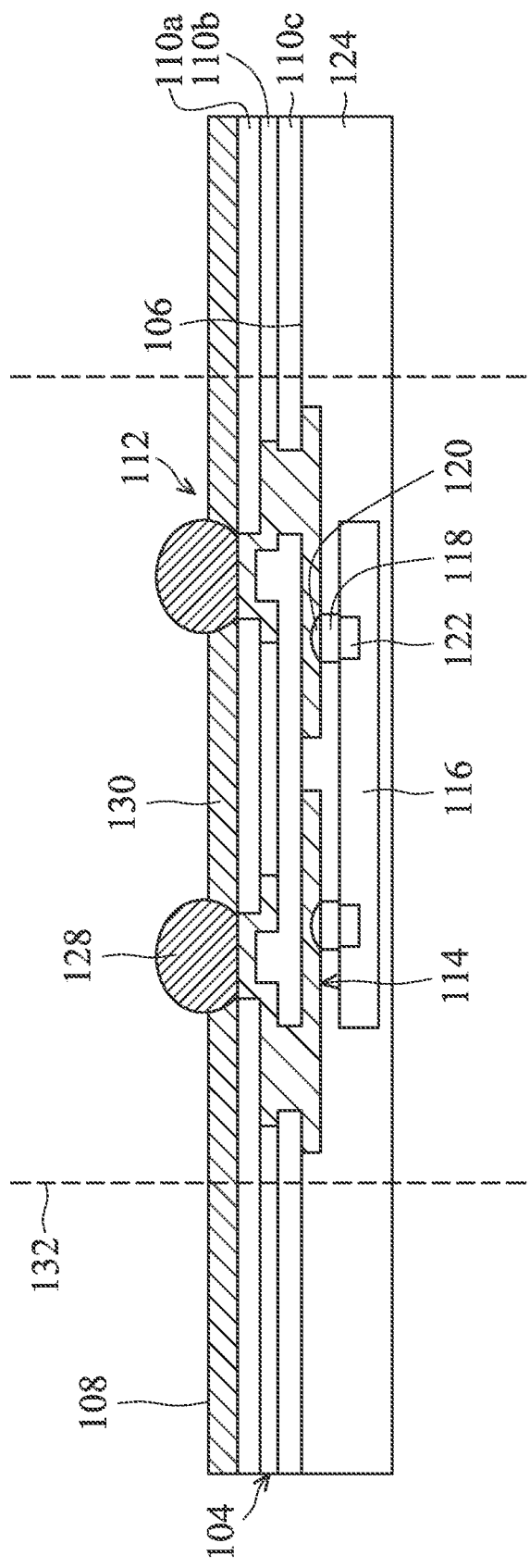

FIG. 5 shows an inverted view of FIG. 4. Metal bumps 128 are formed on the exposed portions 126 of the wiring 112. The metal bumps 128 comprise solder balls in the embodiment shown. A molding compound 130 comprising similar materials as listed for molding compound 124 may optionally be formed over the RDL 104 between the metal bumps 128, as shown in FIG. 6, although it is not required that the same material be used for both molding compounds. The molding compound 130 may comprise a thickness of about 10 μm in some embodiments, as an example, although the molding compound 130 may comprise other dimensions. The molding compound 130 is thin enough so that top portions of the metal bumps 128 protrude from the molding compound 130. The molding compound 130 may comprise a thickness that is about half of a metal bump 128 height in some embodiments, as another example. The molding compound 130 may be advantageous for use with large ICs 116, to improve the reliability, for example.

Figure 7:
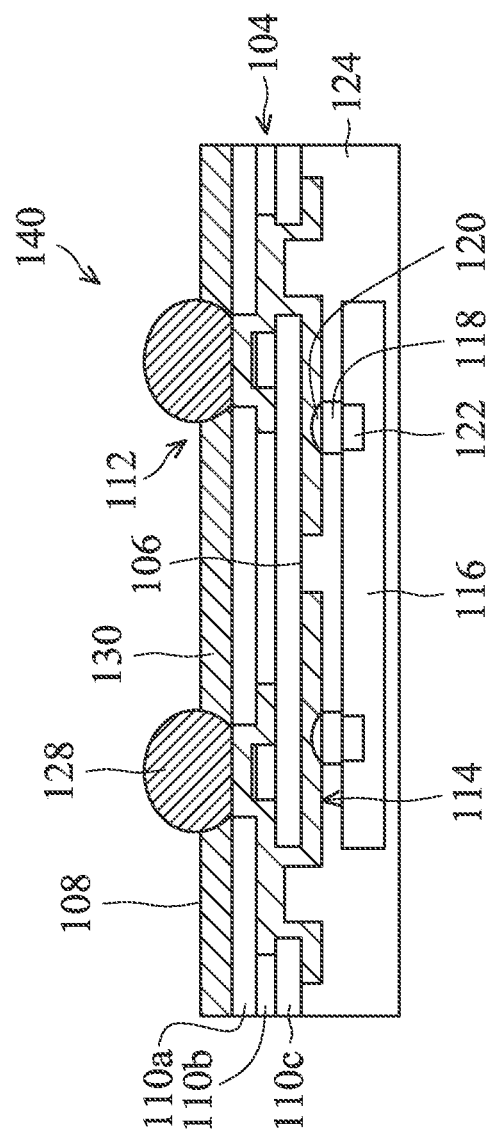

The packaged plurality of ICs 116 (e.g., a plurality of ICs 116, not shown, are formed simultaneously across the carrier wafer 100 surface) are then singulated using a die saw or other means at singulation lines 132, and the packaged ICs 116 are separated, each forming a packaged semiconductor device 140, as shown in FIG. 7. In the embodiment shown in FIGS. 1 through 7, each single IC 116 is packaged using the RDL 104, optional molding compound 130 on one side, and molding compound 124 on the other side. Advantageously, a substrate is not required for the novel packaged semiconductor device 140. Portions of the wiring 112 of the RDL 104 may couple metal bumps 128 on the RDL 104 to contact pads 122 of the IC 116, for example. The packaged semiconductor device 140 may then be coupled to a printed circuit board (PCB), to another packaged integrated circuit, to an electrical or mechanical module, or other devices using the metal bumps 128 of the package 140.

Figure 8:
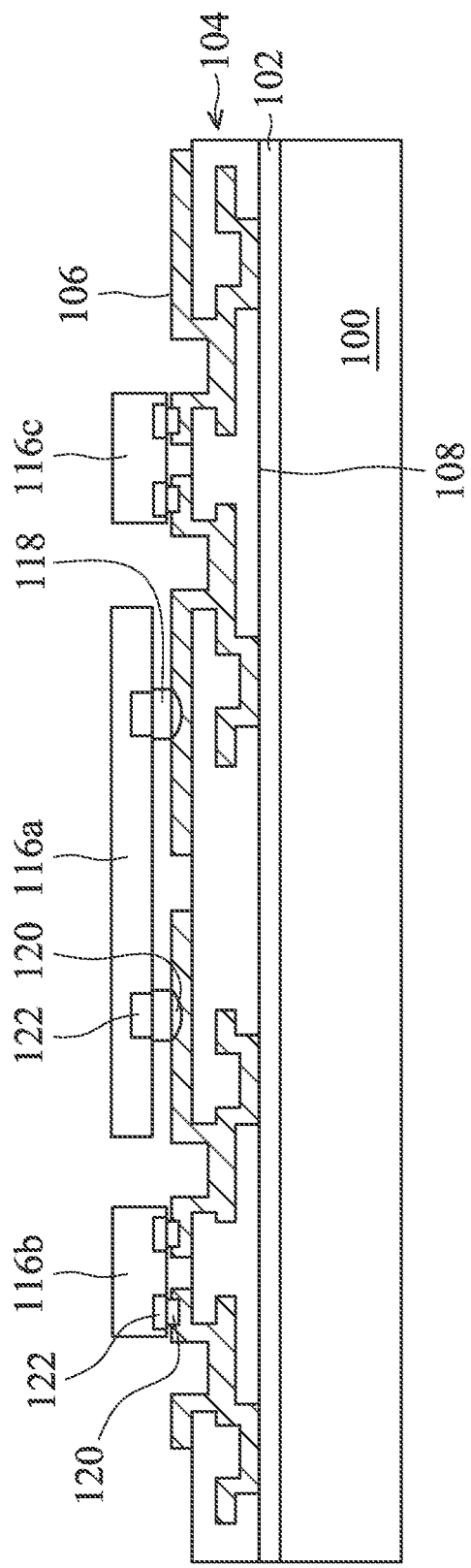
FIGS. 8 and 9 show cross-sectional views of a method of packaging two or more ICs laterally in accordance with another embodiment.
Figure 9:
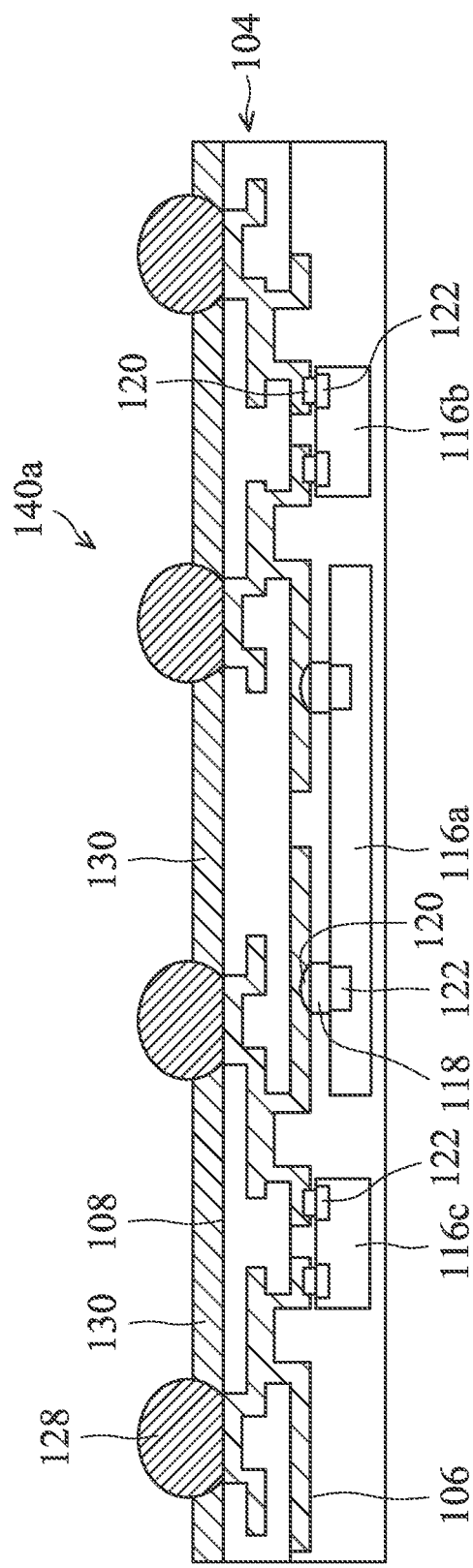

In other embodiments, two or more ICs 116a, 116b, and 116c may be packaged laterally in a single package, as shown in a cross-sectional view in FIGS. 8 and 9. After the RDL 104 is formed over the carrier wafer 100, a plurality of ICs 116a, 116b, and 116c are bonded to the first surface 106 of the RDL 104. IC 116a may comprise a logic chip and ICs 116b and 116c may comprise passive components in some embodiments, for example. Alternatively, ICs 116a, 116b, and 116c may be adapted to perform other functions. ICs 116a, 116b, and 116c may be adapted to perform the same functions, different functions, or a combination thereof, in some embodiments. Three ICs 116a, 116b, and 116c are shown in FIGS. 8 and 9; alternatively, a plurality of ICs 116a, 116b, and 116c may be formed and may be packaged laterally in a single package, for example.

The packaging technique described with reference to FIGS. 3 through 7 is then performed, resulting in the packaged IC 140a shown in FIG. 9. The packaged semiconductor device 140a comprises a multi-chip package wherein the ICs 116a, 116b, and 116c are positioned laterally adjacent one another in the package 140a. The ICs 116a, 116b, and 116c may be coupled together by wiring 112 in the RDL 104, as shown. The packaged semiconductor device 140a advantageously may comprise a system in a package (SiP), for example.

FIGS. 10 through 20 show cross-sectional views of an embodiment wherein z axis connections 134 comprising wire bonds are formed to allow the packaging of two or more ICs vertically, and wherein x-y connections comprising wiring 136 (see FIG. 14) are formed in a metallization layer. Like numerals are used for the various elements in FIGS. 10 through 20 that were used to describe FIGS. 1 through 9, and to avoid repetition, each reference number shown in FIGS. 10 through 20 may not be described again in detail herein.

Figure 10:
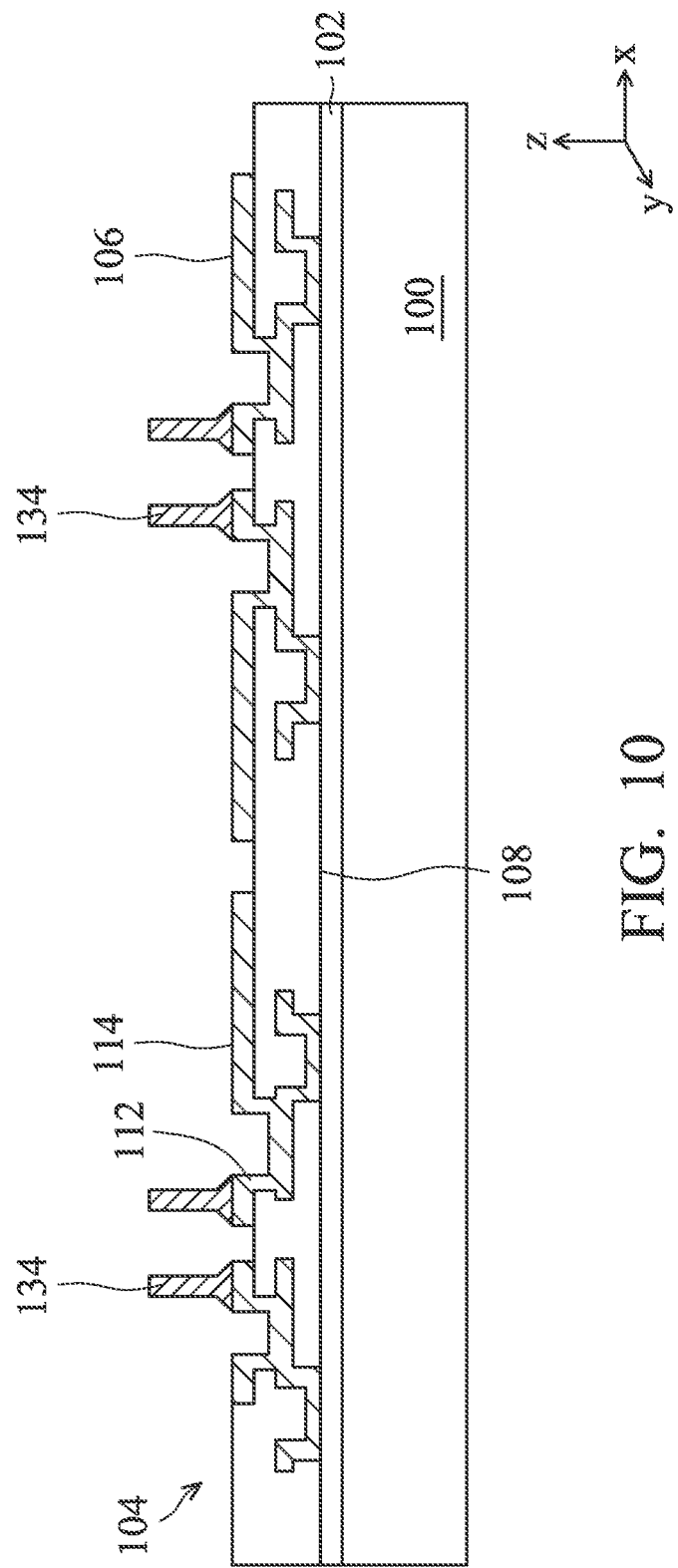
FIGS. 10 through 20 show cross-sectional views of an embodiment wherein z axis connections comprising wire bonds are formed to allow the packaging of two or more ICs vertically and wherein x-y connections are made in a metallization layer.
Figure 11:
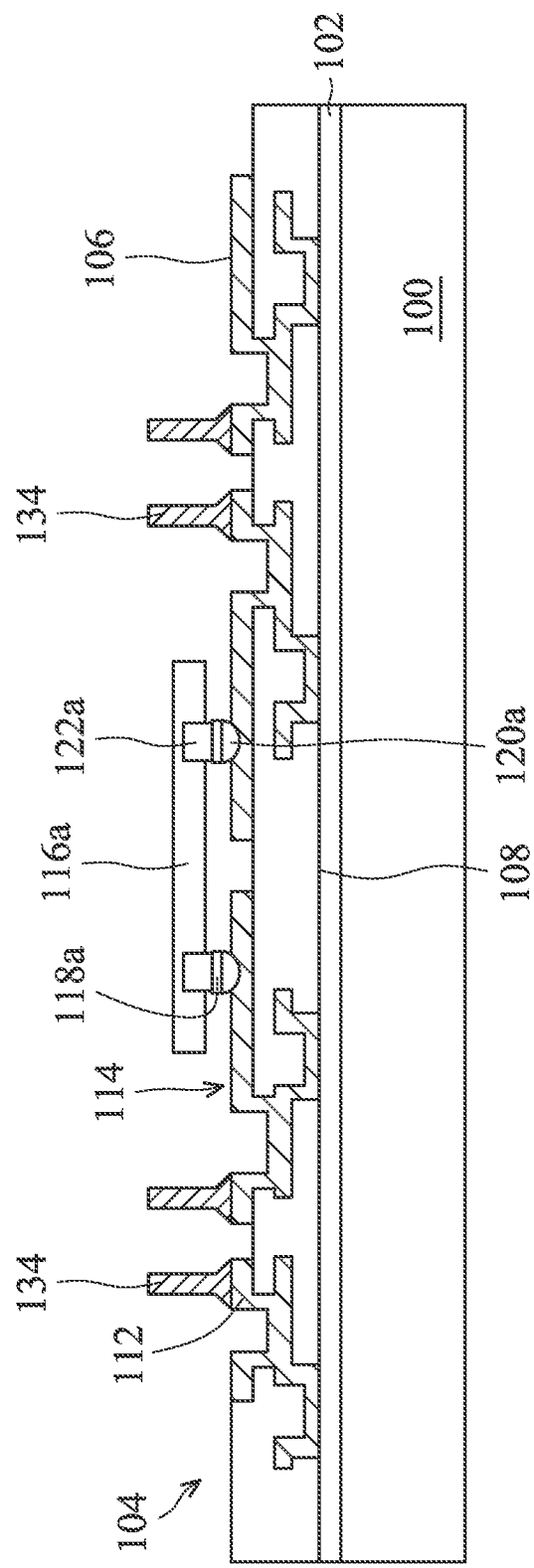
Figure 12:
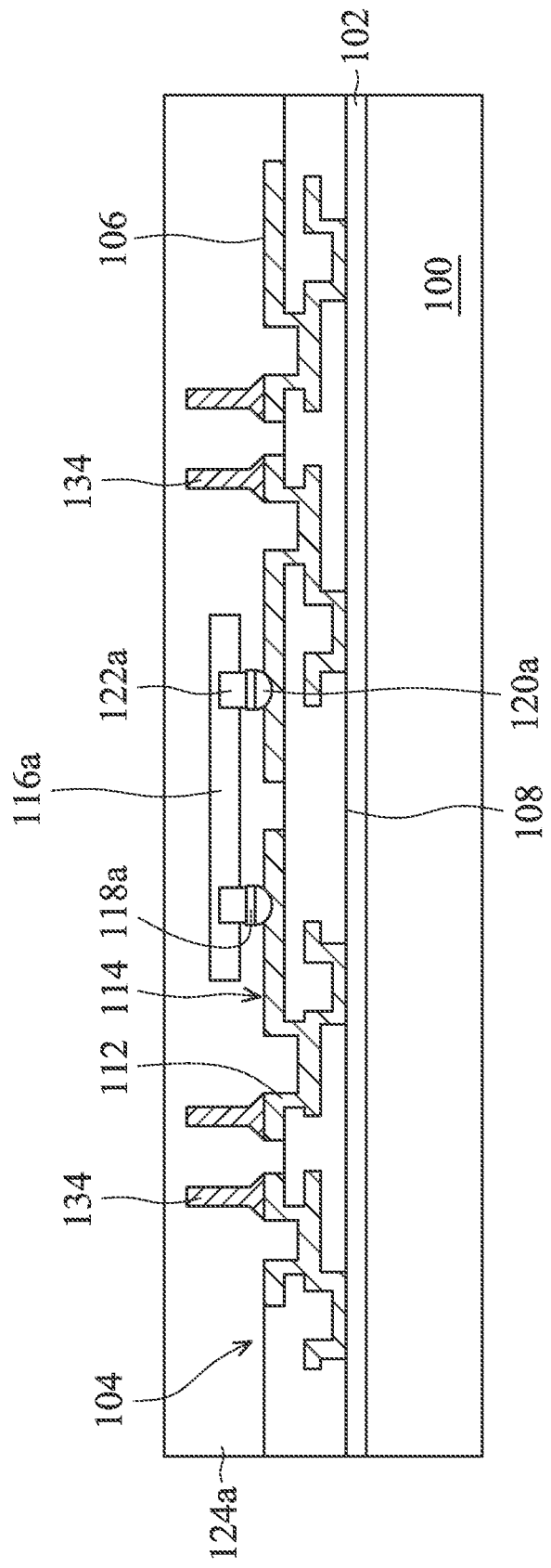
Figure 13:
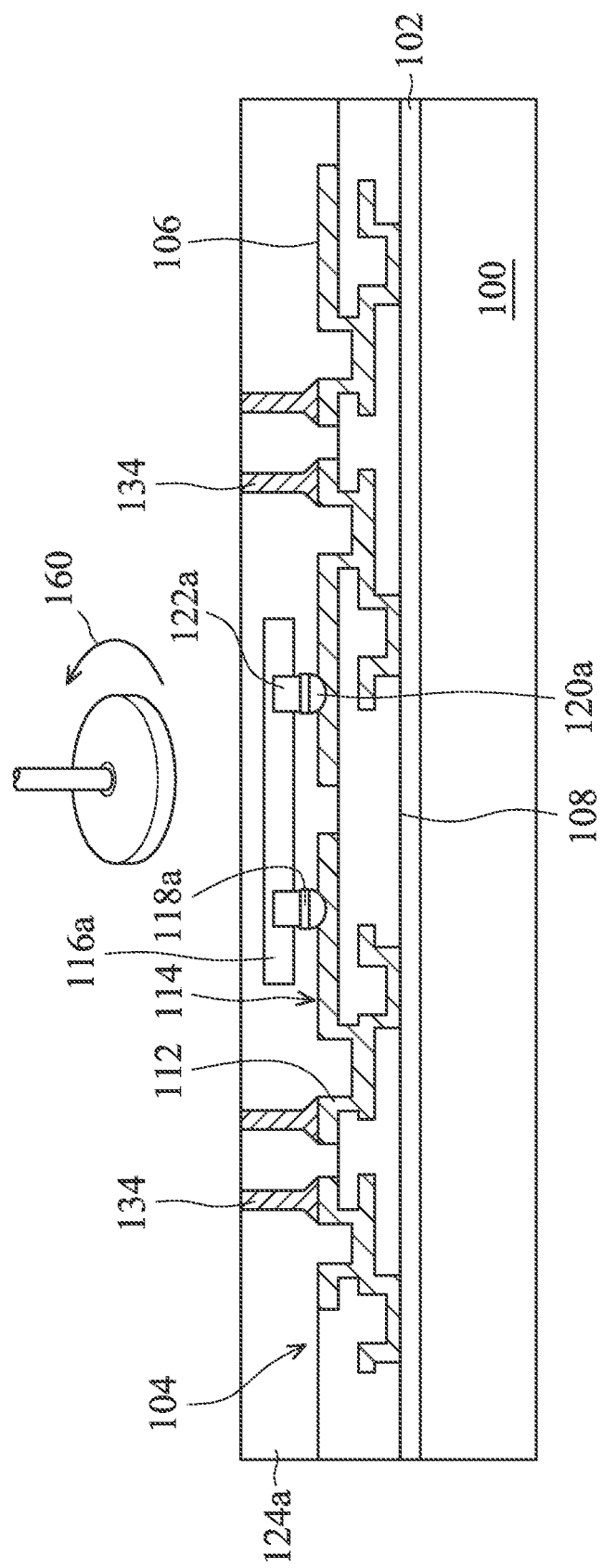

After the formation of the RDL 104 as shown in FIG. 1, z axis connections 134 comprising wire bonds are formed over the RDL 104, coupled to exposed portions of the wiring 112, as shown in FIG. 10. Z axis connections 134 will be used to couple the RDL 104 to an IC or wiring in another layer vertically within the package, to be described further herein. The z axis in FIGS. 10 through 20 is substantially perpendicular to an x-y plane formed laterally by the RDL 104, for example. Solder bumps 118a of at least one IC 116a are coupled to traces 114 of the RDL 104, as shown in FIG. 11. Only one IC 116a is shown in FIG. 11; alternatively, a plurality of IC 116a may be formed over the RDL 104. A molding compound 124a is formed over the IC 116a, Z axis connections 134, and RDL 104, as shown in FIG. 12 (e.g., as described for FIGS. 2 and 3). Molding compound 124a comprises a first molding compound in the embodiment shown. A top portion of the molding compound 124a is removed using a grinding process, such as a chemical mechanical polish (CMP) process 160, to expose a top surface of the z axis connections 134 comprising the wire bonds, as shown in FIG. 13. Alternatively, a portion of molding compound could be removed using an etch back process. In other embodiments, deposition of molding compound could be controlled such that the top surface of z axis connections 134 remains exposed after the molding compound deposition process, thus eliminating the need to remove a portion of the molding compound.

Figure 14:
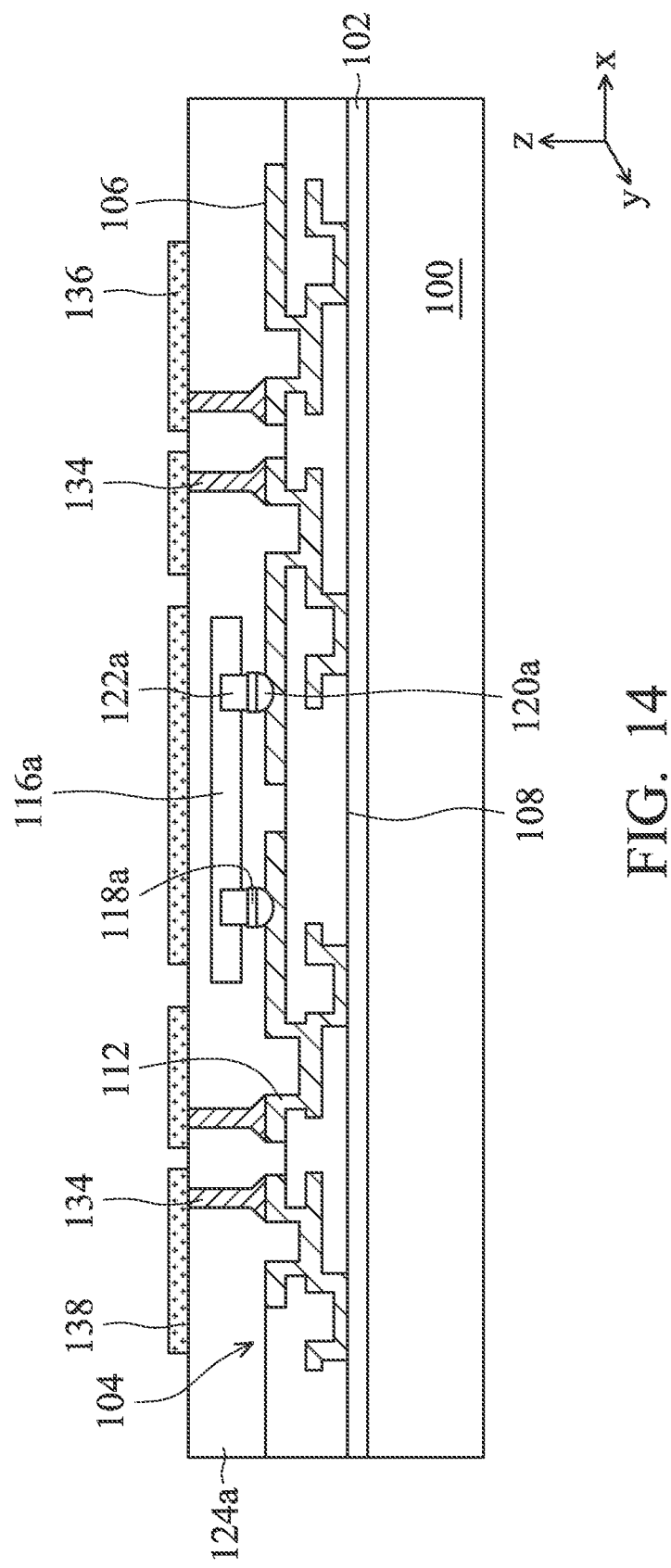
Figure 15:
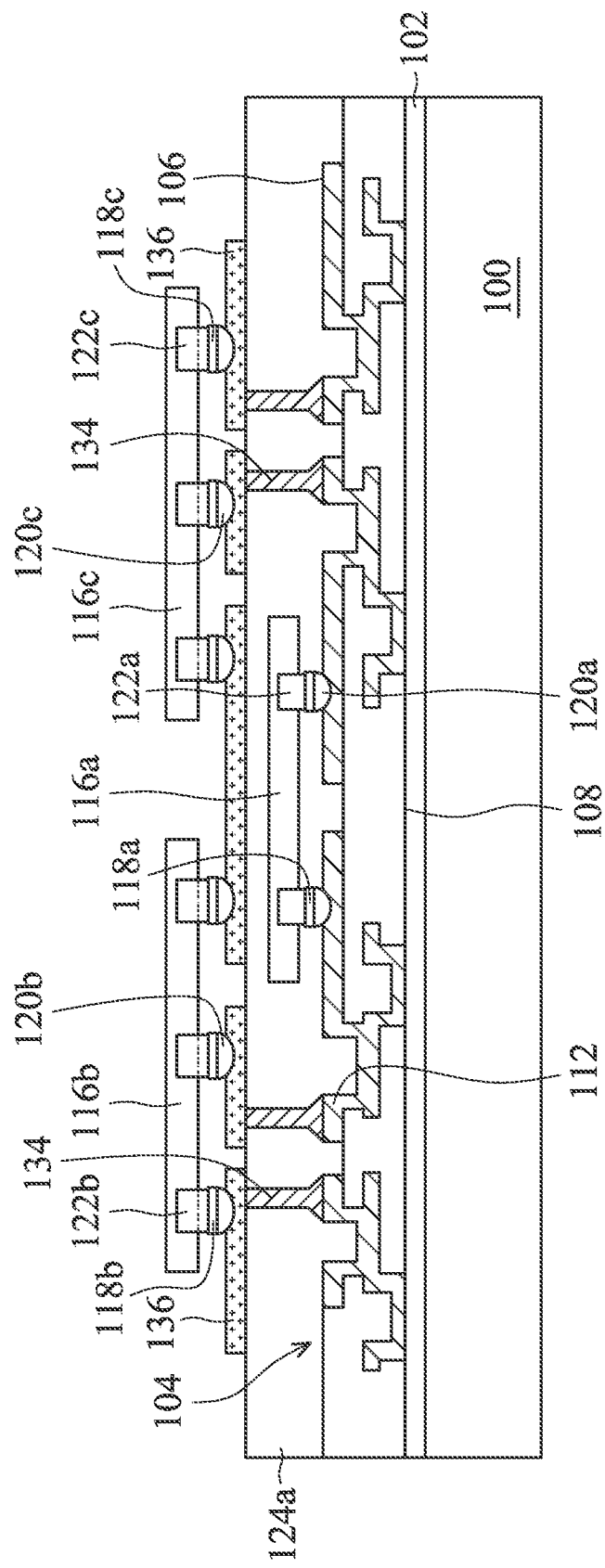

Wiring 136 is then formed over the molding compound 124a and over the z axis connections 134 comprising the wire bonds, as shown in FIG. 14. The wiring 136 is coupled to the z axis connections 134 and provides x-y connections for the package, e.g., in and out of the paper in the view shown. The wiring 136 includes traces 138 on portions thereof. At least one IC 116b and/or 116c is attached to the wiring 136, as shown in FIG. 15. Two ICs 116b and 116c are shown in FIG. 15; alternatively, a plurality of ICs 116b and 116c may be formed over the surface of the RDL 104, for example. Portions of the ICs 116b and 116c may reside over the IC 116a in the underlying layer, as shown. Solder bumps 118b of ICs 116b are coupled to traces 138 of wiring 136, and solder bumps 118c of ICs 116c are also coupled to traces 138 of wiring 136.

Figure 16:
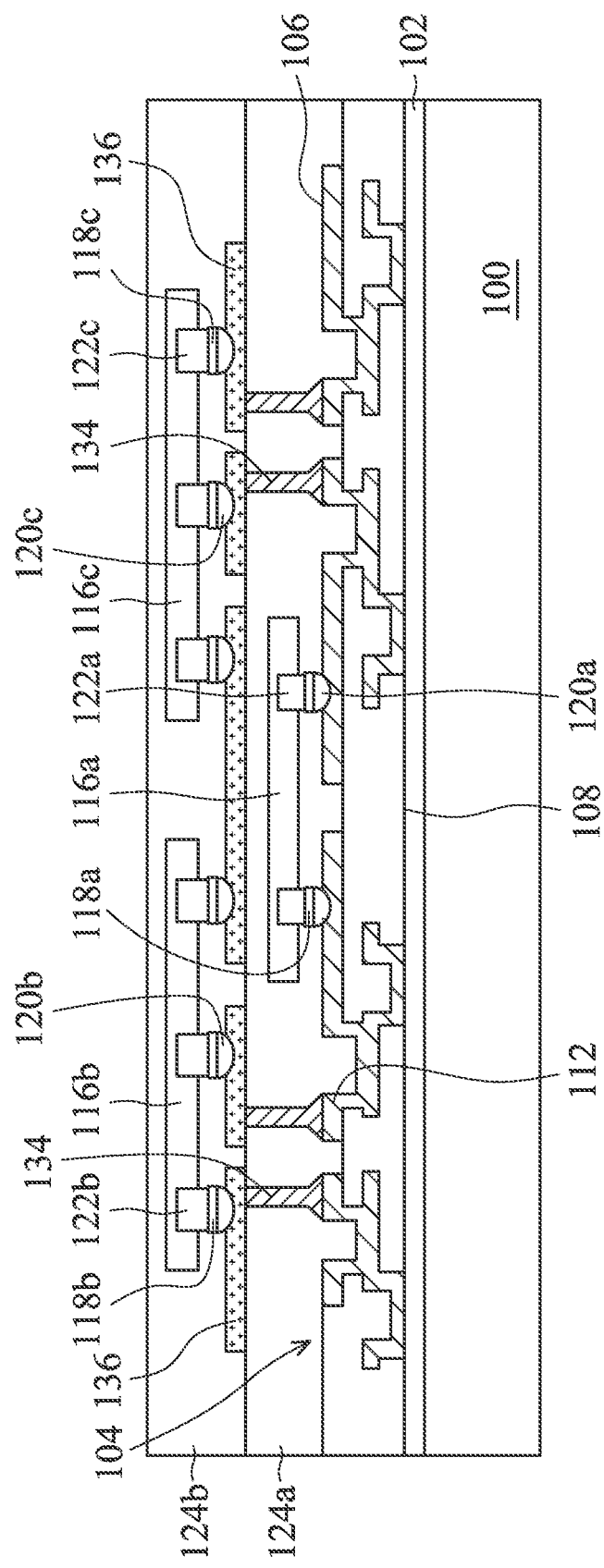
Figure 17:
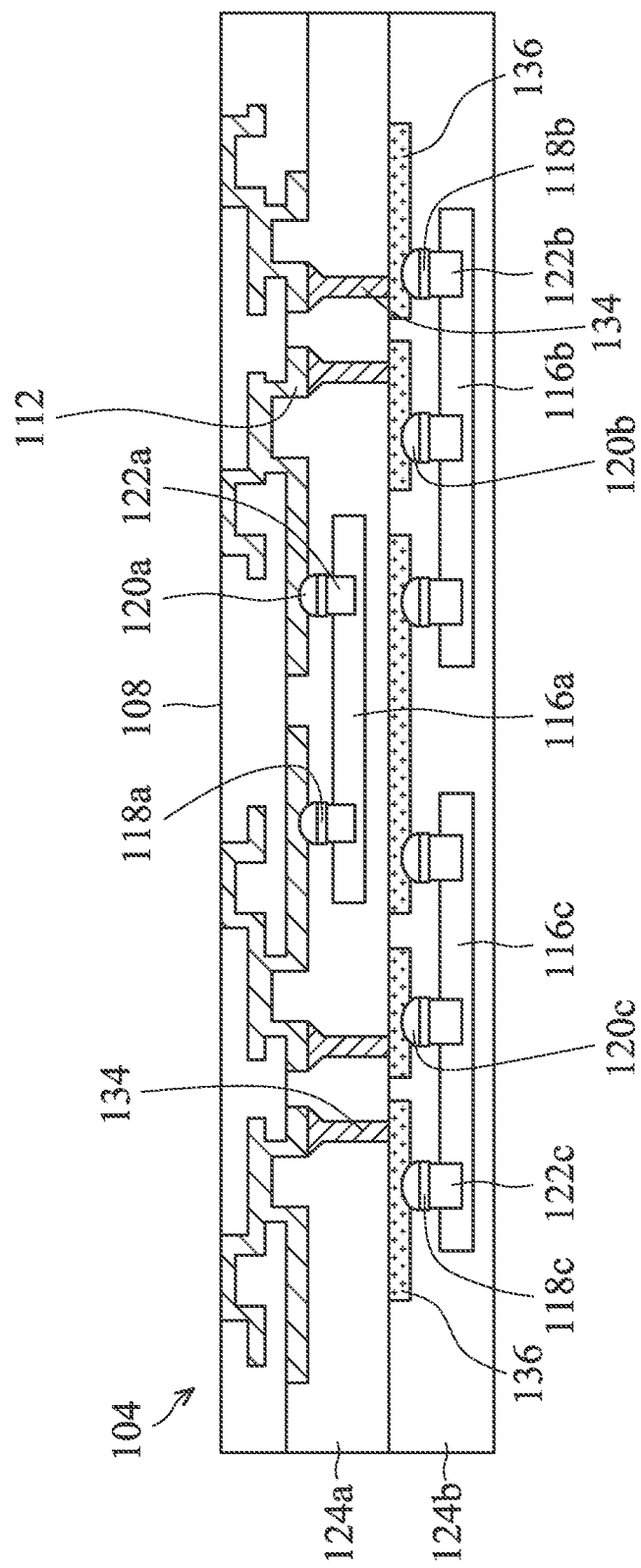
Figure 18:
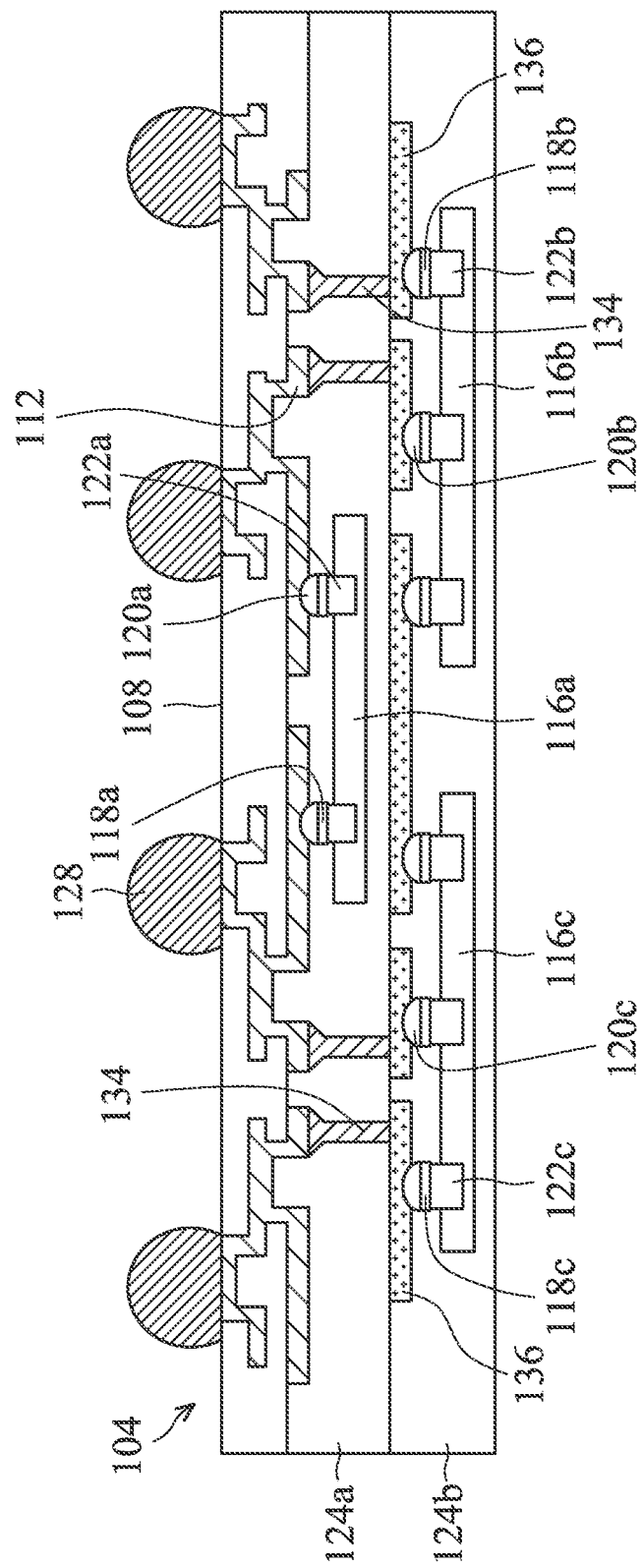
Figure 19:
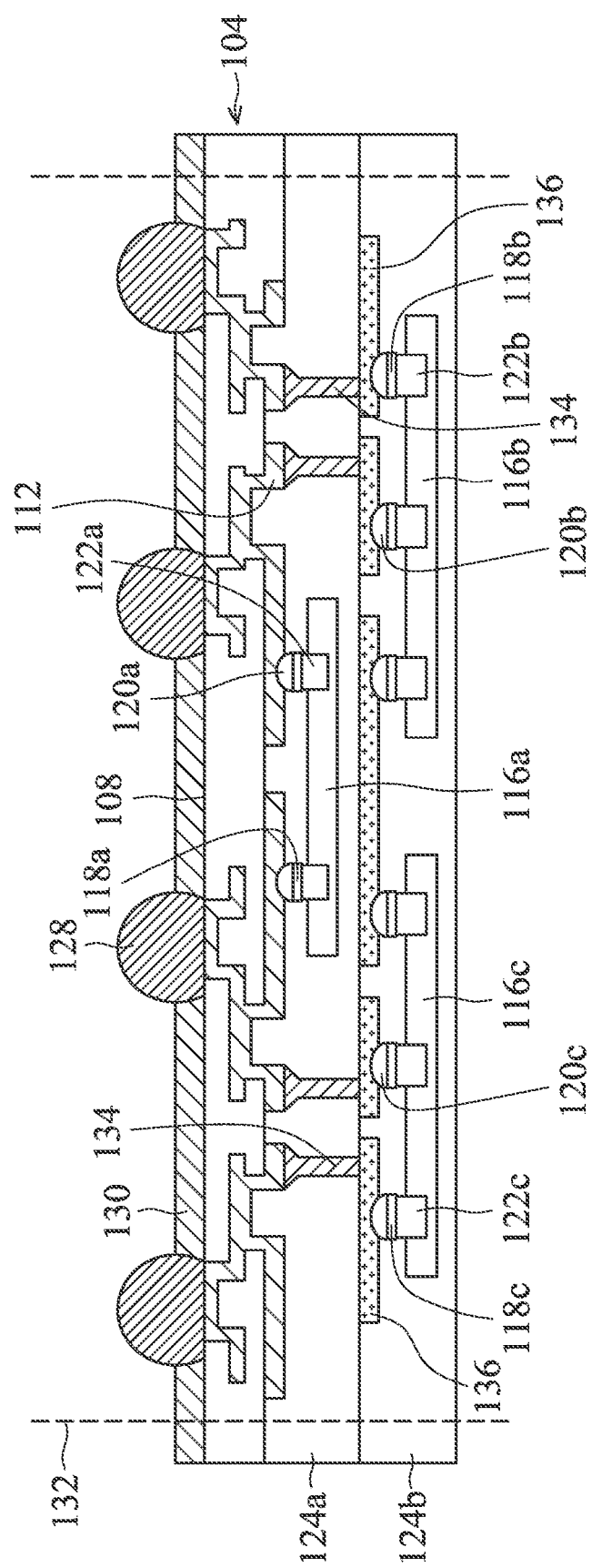
Figure 20:
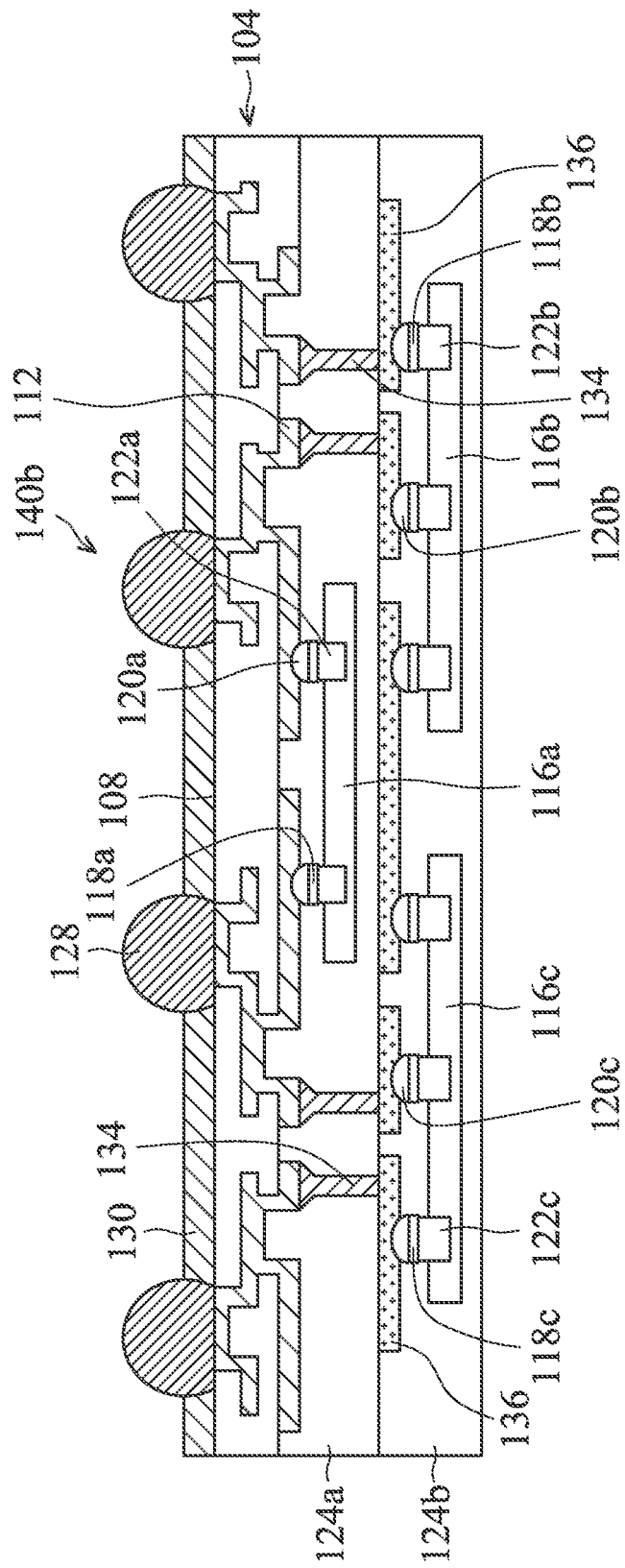

A second molding compound 124b comprising similar materials as described for the first molding compound 124a is formed over the structure, as shown in FIG. 16, e.g., over ICs 116b and 116c, wiring 136, and the first molding compound 124a. The carrier wafer 100 and adhesive 102 is then removed, as shown in FIG. 17. Metal bumps 128 are formed on the RDL 104, as shown in FIG. 18, and a molding compound 130 may optionally be formed over the RDL 104 between the metal bumps 128, as shown in FIG. 19. The RDL 104 is then singulated at singulation lines 132 to form the packaged semiconductor device 140b shown in FIG. 20.

The packaged semiconductor device 140b comprises a multi-chip package wherein the ICs 116a and ICs 116b and 116c are positioned vertically in the package. The ICs 116a, 116b, and 116c may be coupled together by wiring 112 in the RDL 104 and by the vertical connections provided by the z axis connections 134 comprising the wire bonds, as shown. The packaged semiconductor device 140b advantageously may comprise a SiP, for example.

Figure 21:
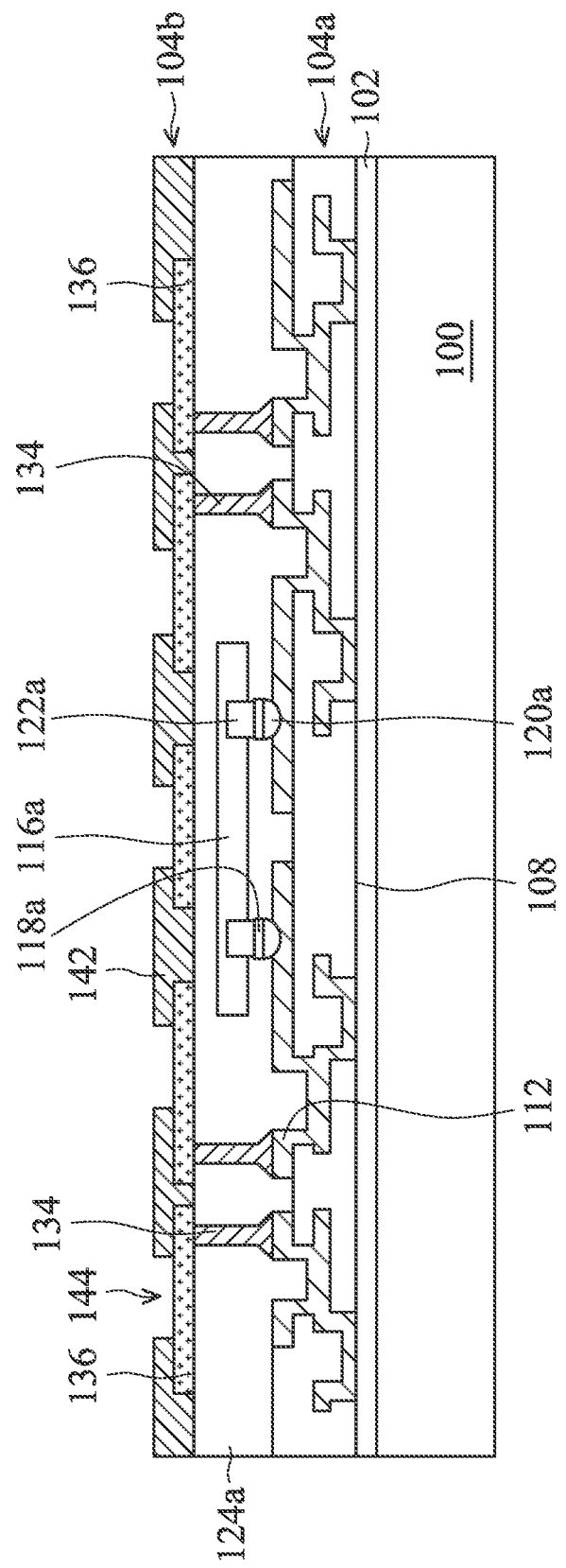
FIGS. 21 and 22 show cross-sectional views of an embodiment that includes z axis connections comprising wire bonds and wherein a second RDL layer is formed over the z axis connections.
Figure 22:
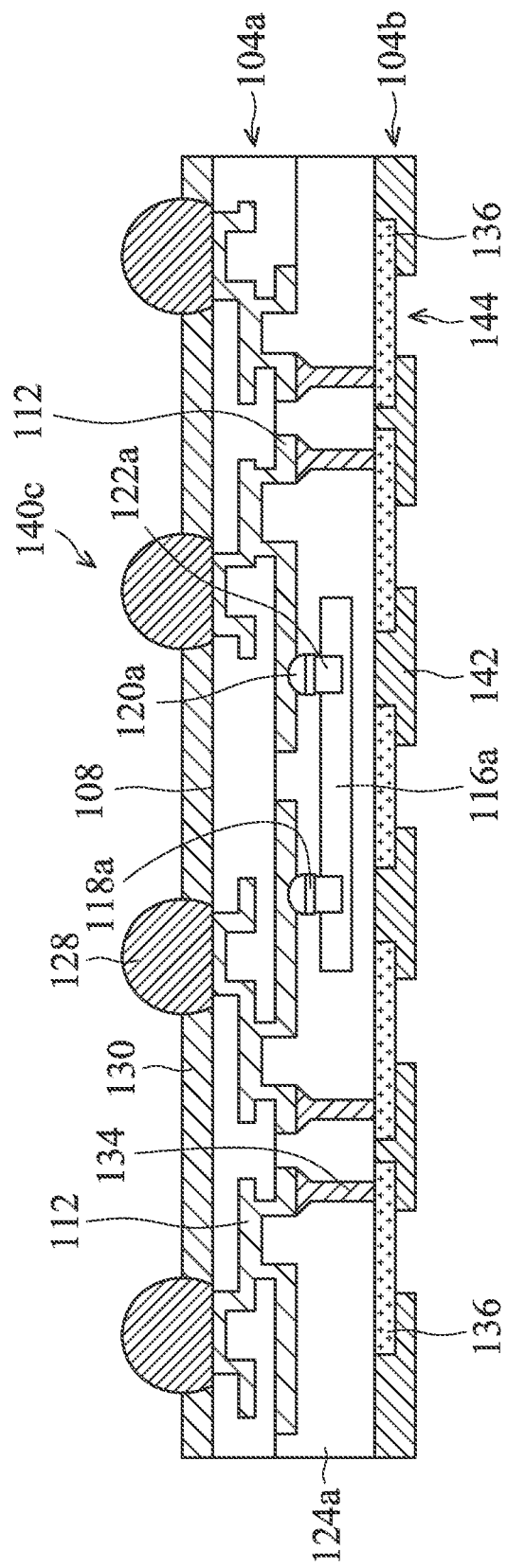

FIGS. 21 and 22 show cross-sectional views of an embodiment that includes z axis connections 134 comprising wire bonds and wherein a second RDL 104b is formed over the z axis connections. In this embodiment, the RDL 104 shown in FIG. 10 is labeled RDL 104a in FIGS. 21 and 22. The packaging processing steps are performed as described for FIGS. 10 through 14. Then, an RDL 104b comprising an insulating material 142 is formed over the wiring 136. The wiring 136 is part of the RDL 104b and provides x-y connections for the package in this embodiment. The insulating material 142 is patterned using lithography to expose portions of the wiring 136, as shown in FIG. 21. Processing is continued as described for FIGS. 17 through 20, forming the packaged semiconductor device 140c shown in FIG. 22. The exposed regions of the RDL 104b may be used to attach the packaged semiconductor device 140c to another IC, to a PCB, or to another type of device (not shown).

Figure 23:
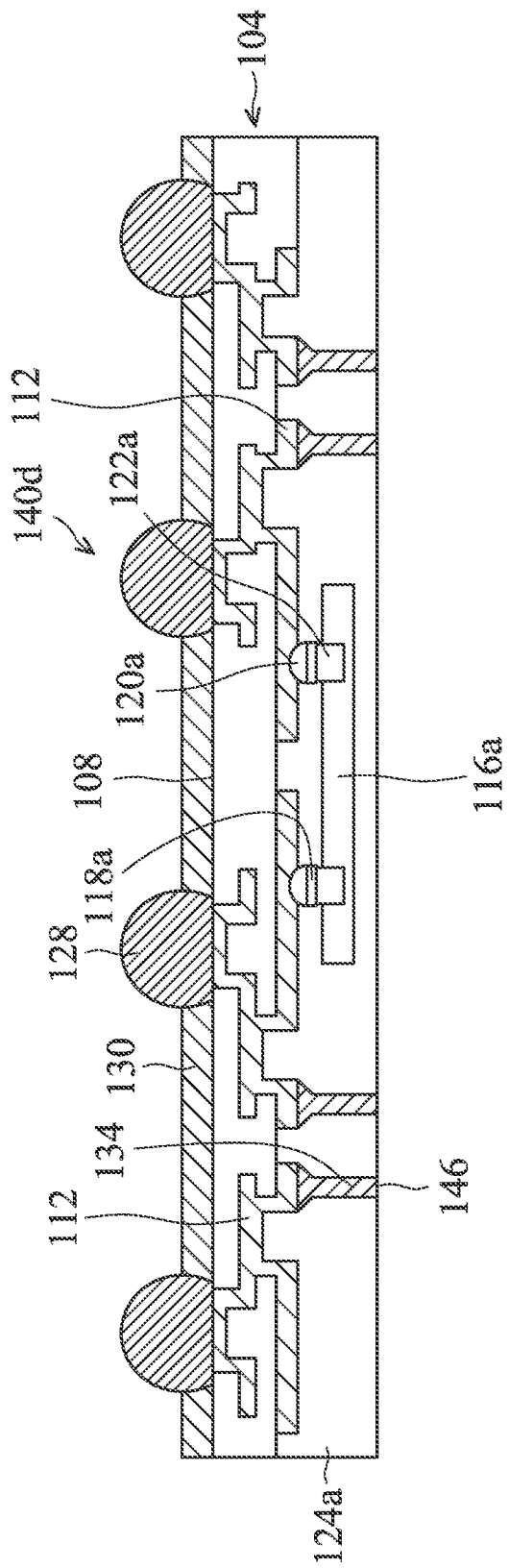
FIG. 23 shows a cross-sectional view of an embodiment having wire bond z axis connections, wherein no x-y connections or second RDL layer are formed.

In another embodiment, there may not be any x-y connections or second RDL formed in a packaged semiconductor device 140d, as shown in FIG. 23. The processing steps shown in FIGS. 10 through 13 are performed, but wiring 136 shown in FIG. 14 is not formed. Rather, the processing steps shown in FIGS. 17 through 20 are performed, leaving the packaged semiconductor device 140d shown in FIG. 23. The exposed ends 146 of the wire bonds comprising the z axis connections 134 may be used to connect to another package or device, for example, depending on the end application.

Figure 24:
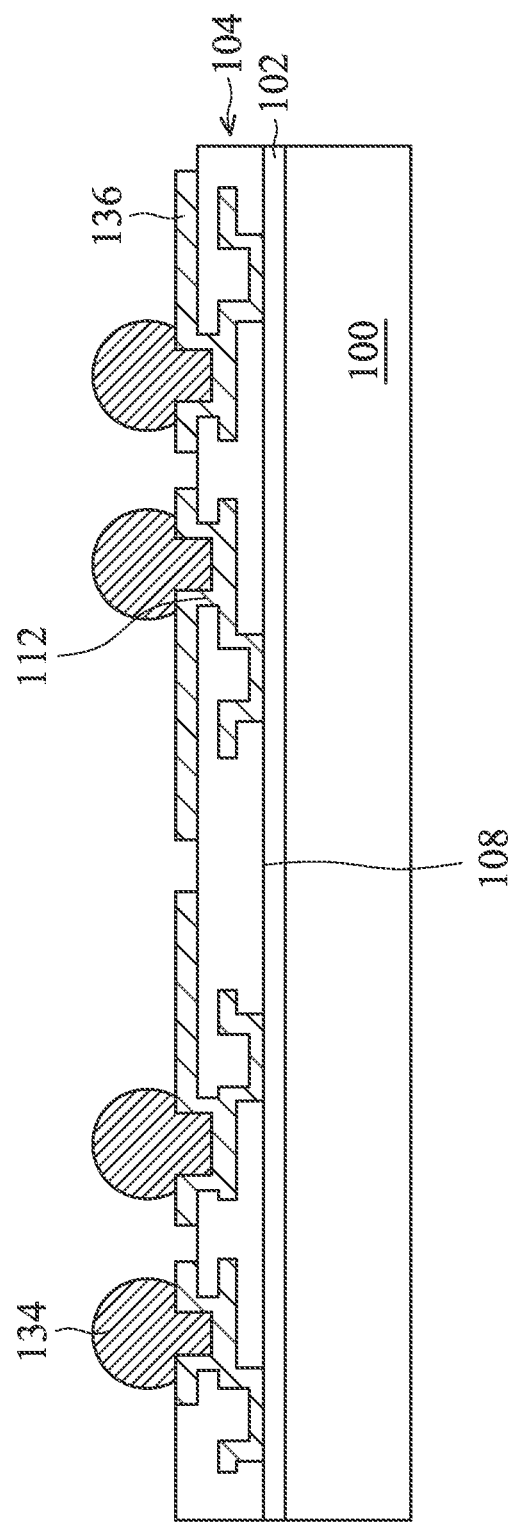
FIGS. 24 and 25 show cross-sectional views of an embodiment wherein z axis connections comprise solder balls and wherein x-y connections are made in a metallization layer.
Figure 25:
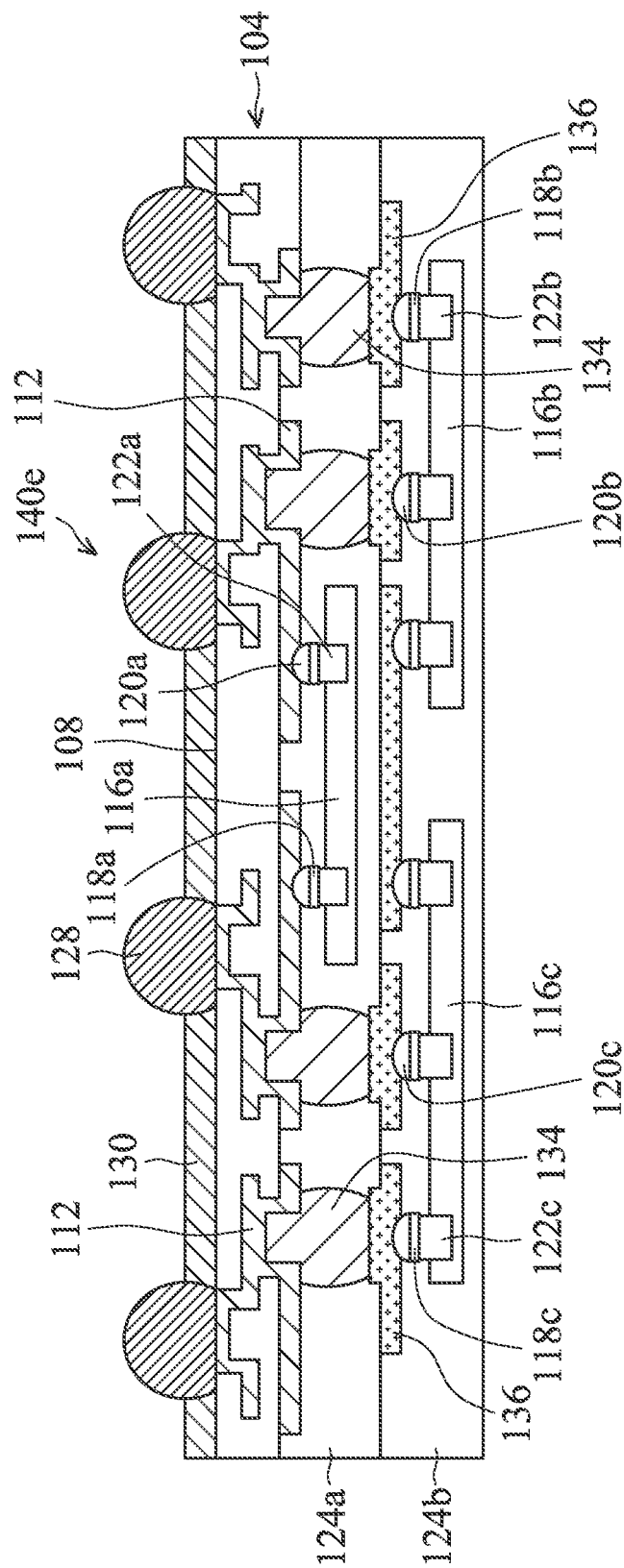

FIGS. 24 and 25 show cross-sectional views of an embodiment wherein z axis connections 134 comprise solder balls and wherein x-y connections are made in a metallization layer, i.e., wiring 136. In this embodiment, after the formation of the RDL 104 as shown in FIG. 1, z axis connections 134 comprising solder balls are formed over the RDL 104, coupled to exposed portions of the wiring 112, as shown in FIG. 24. The z axis connections 134 comprising the solder balls couple the RDL 104 to subsequently-formed ICs 116b and 116c, as shown in FIG. 25. The manufacturing process steps described with respect to FIGS. 11 through 20 are performed, forming the packaged semiconductor device 140e shown in FIG. 25. The packaged semiconductor device 140e comprises a multi-chip package wherein the ICs 116a and ICs 116b and 116c are positioned vertically in the package. The ICs 116a, 116b, and 116c may be coupled together by wiring 112 in the RDL 104 and/or by the vertical connections provided by the z axis connections 134 comprising the solder balls, as shown. The packaged semiconductor device 140e advantageously may comprise a SiP, for example.

Figure 26:
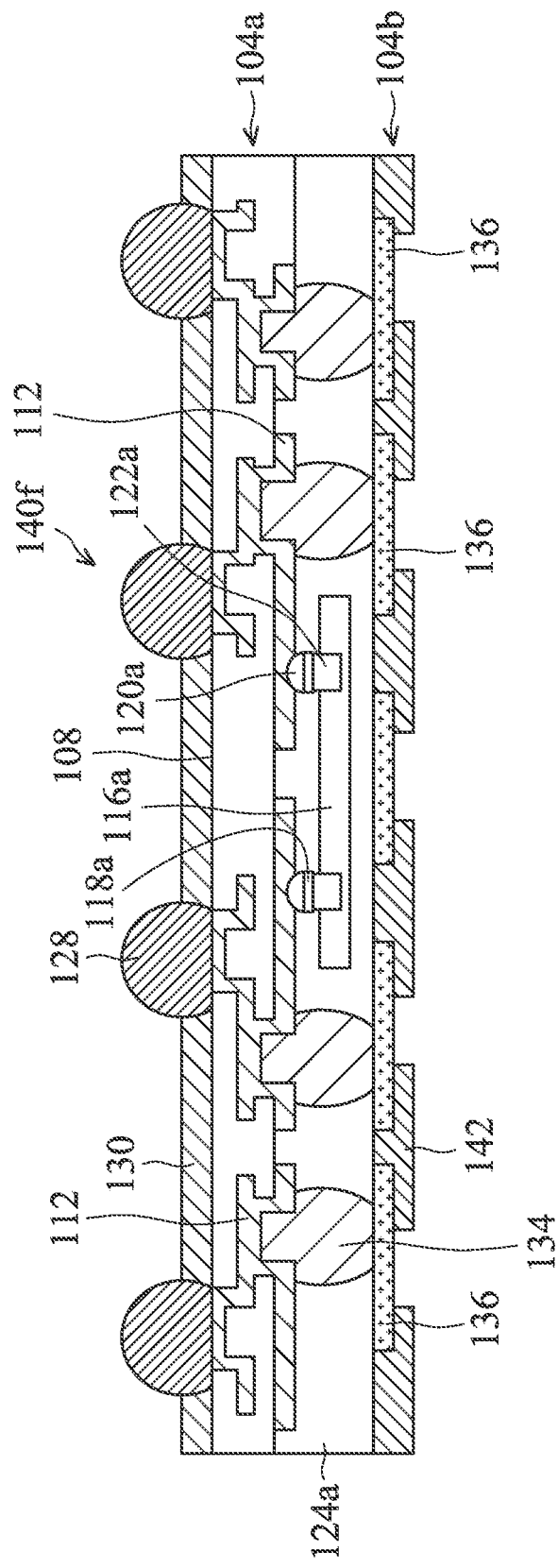
FIG. 26 shows a cross-sectional view of an embodiment wherein z axis connections comprise solder balls and a second RDL layer is formed over the z axis connections.
Figure 27:
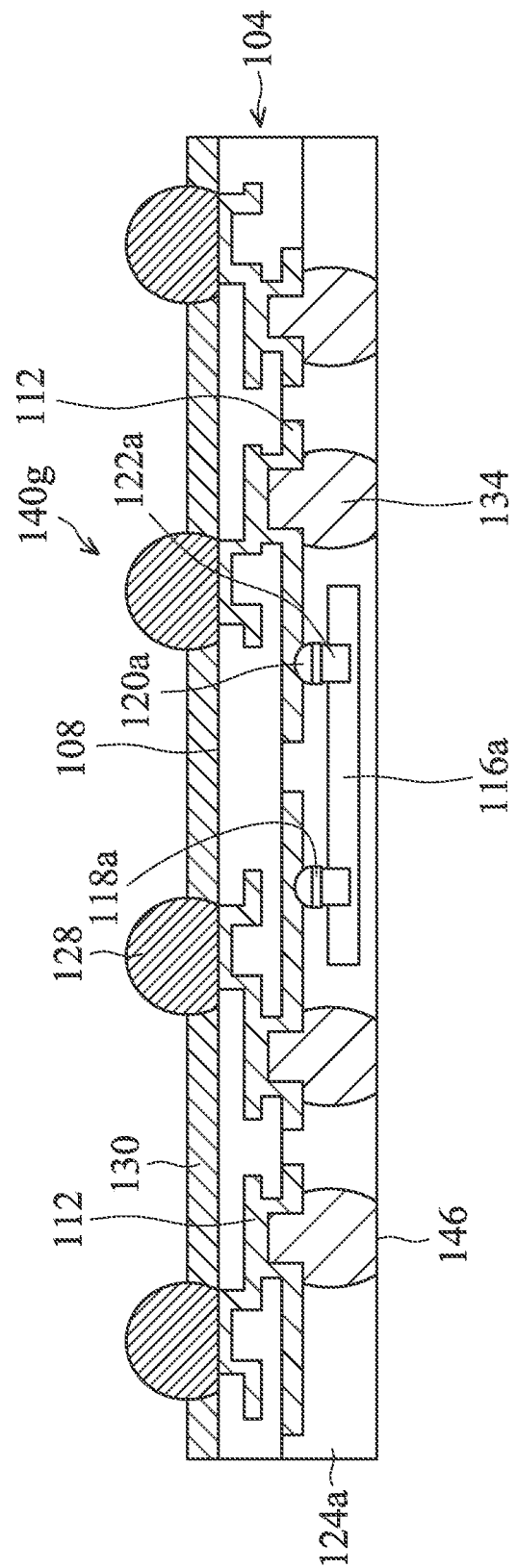
FIG. 27 shows a cross-sectional view of an embodiment wherein z axis connections comprise solder balls and wherein no x-y connections or second RDL layer are formed.

The embodiment shown in FIGS. 24 and 25 may be modified similar to the modifications to the embodiments shown in FIGS. 10 through 20. For example, a second RDL 104b may be formed, as shown in FIG. 26, as described with reference to FIGS. 21 and 22. The solder balls comprise the z axis connections 134 that couple the RDL 104a to the second RDL 104b of the packaged semiconductor device 140f shown in FIG. 26. In another embodiment, neither wiring 136 nor a second RDL 104b is included in a packaged semiconductor device 140g, as shown in FIG. 27. Advantageously, the packaged semiconductor device 140g in this embodiment has metal bumps 128 on one side and z axis connections comprising the solder balls on the other side.

Figure 28:
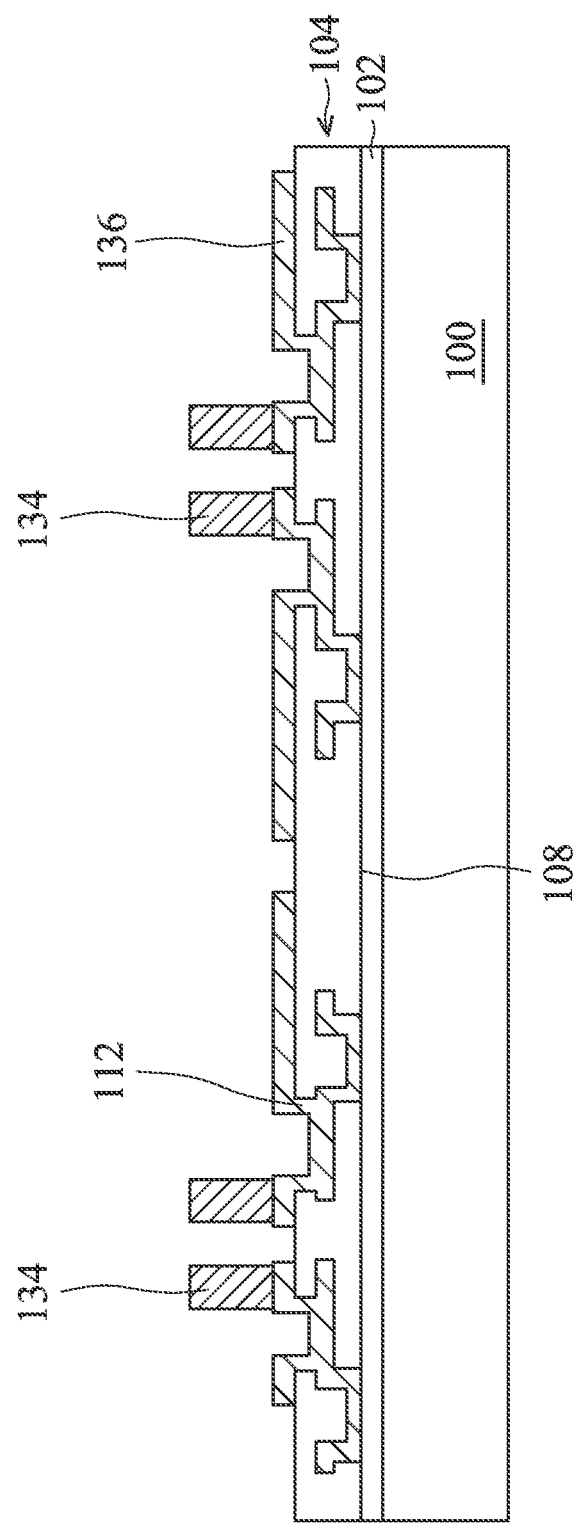
FIGS. 28 and 29 show cross-sectional views of an embodiment wherein z axis connections comprise metal pillars and wherein x-y connections are made in a metallization layer.
Figure 29:
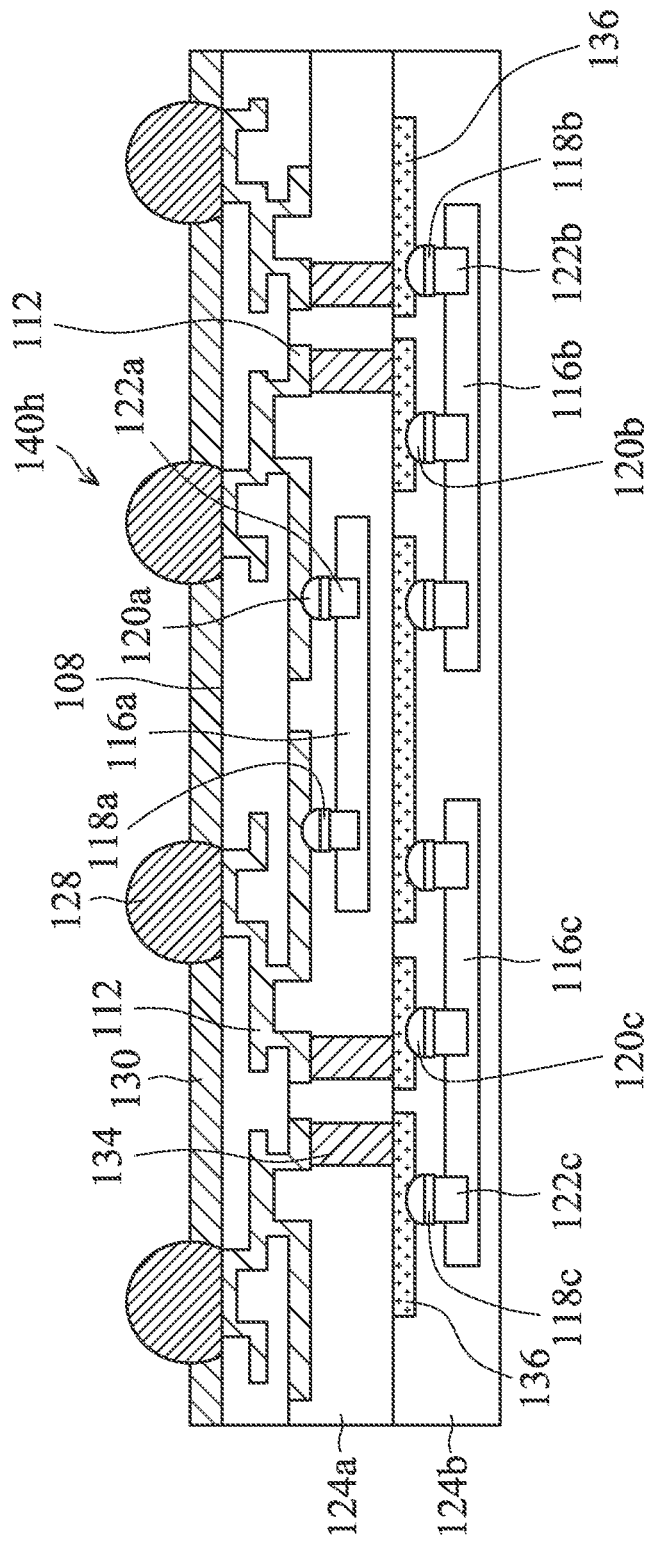

FIGS. 28 and 29 show cross-sectional views of an embodiment wherein z axis connections 134 comprise metal pillars and wherein x-y connections are made in a metallization layer, i.e., wiring 136. In this embodiment, after the formation of the RDL 104 as shown in FIG. 1, z axis connections 134 comprising metal pillars are formed over the RDL 104, coupled to exposed portions of the wiring 112, as shown in FIG. 28. The z axis connections 134 comprising the metal pillars couple the RDL 104 to subsequently-formed ICs 116b and 116c, as shown in FIG. 29.

The metal pillars may be formed by first, forming the RDL 104, and then forming a layer of photoresist (not shown) over the RDL 104. The photoresist is patterned for the desired pattern for the metal pillars. The metal pillars may then be formed using an electroplating technique. The photoresist is then removed.

The manufacturing process steps described with respect to FIGS. 11 through 20 are performed, forming the packaged semiconductor device 140h shown in FIG. 29. The packaged semiconductor device 140h comprises a multi-chip package wherein the ICs 116a and ICs 116b and 116c are positioned vertically in the package. The ICs 116a, 116b, and 116c may be coupled together by wiring 112 in the RDL 104 and/or by the vertical connections provided by the z axis connections 134 comprising the metal pillars, as shown. The packaged semiconductor device 140h advantageously may comprise a SiP, for example.

Figure 30:
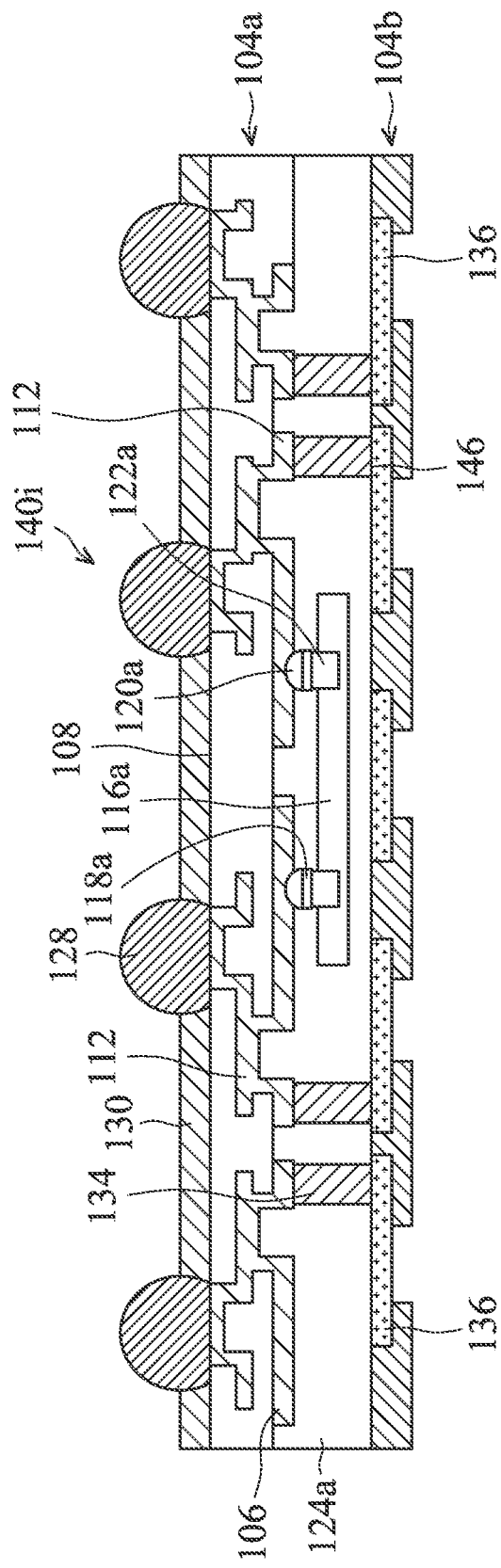
FIG. 30 shows a cross-sectional view of an embodiment wherein z axis connections comprise metal pillars and a second RDL layer is formed over the z axis connections.
Figure 31:
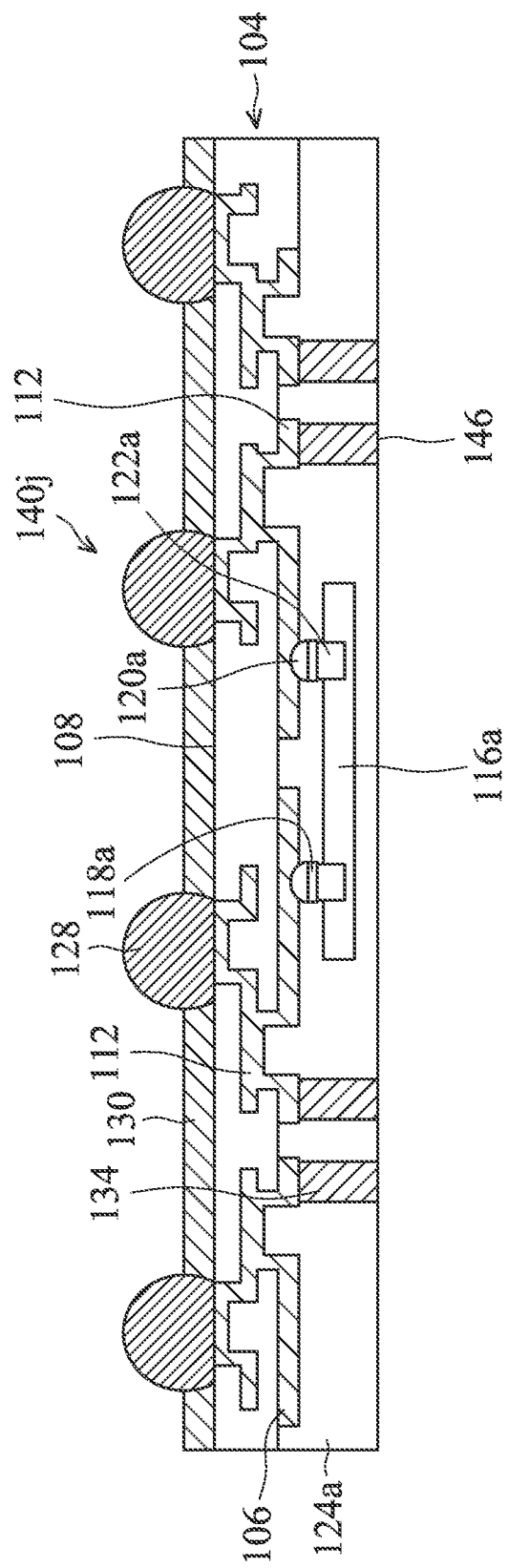
FIG. 31 shows a cross-sectional view of an embodiment wherein z axis connections comprise metal pillars and no x-y connections or second RDL layer are formed.

The embodiment shown in FIGS. 28 and 29 may be modified similar to the modifications to the embodiments shown in FIGS. 10 through 20 and the embodiment shown in FIGS. 24 and 25. For example, a second RDL 104b may be formed, as shown in FIG. 30, as described with reference to FIGS. 21 and 22. The metal pillars comprise the z axis connections 134 that couple the RDL 104a to the second RDL 104b of the packaged semiconductor device 140i. In another embodiment, neither wiring 136 nor a second RDL 104b is included in the packaged semiconductor device 140j, as shown in FIG. 31. The packaged semiconductor device 140j in this embodiment has metal bumps 128 on one side and z axis connections 134 comprising the metal pillars on the other side.

Figure 32:
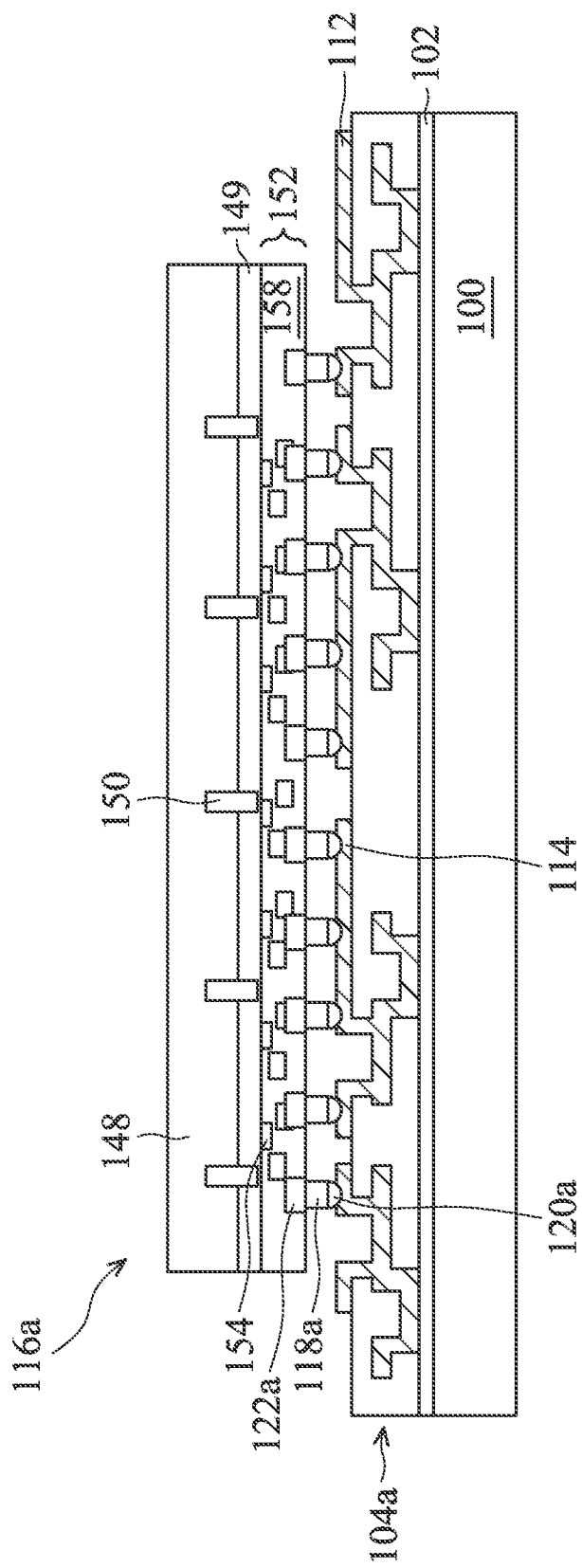
FIGS. 32 through 38 show cross-sectional views of an embodiment wherein a through-substrate via (TSV) IC is packaged with at least one other IC vertically.
Figure 34:
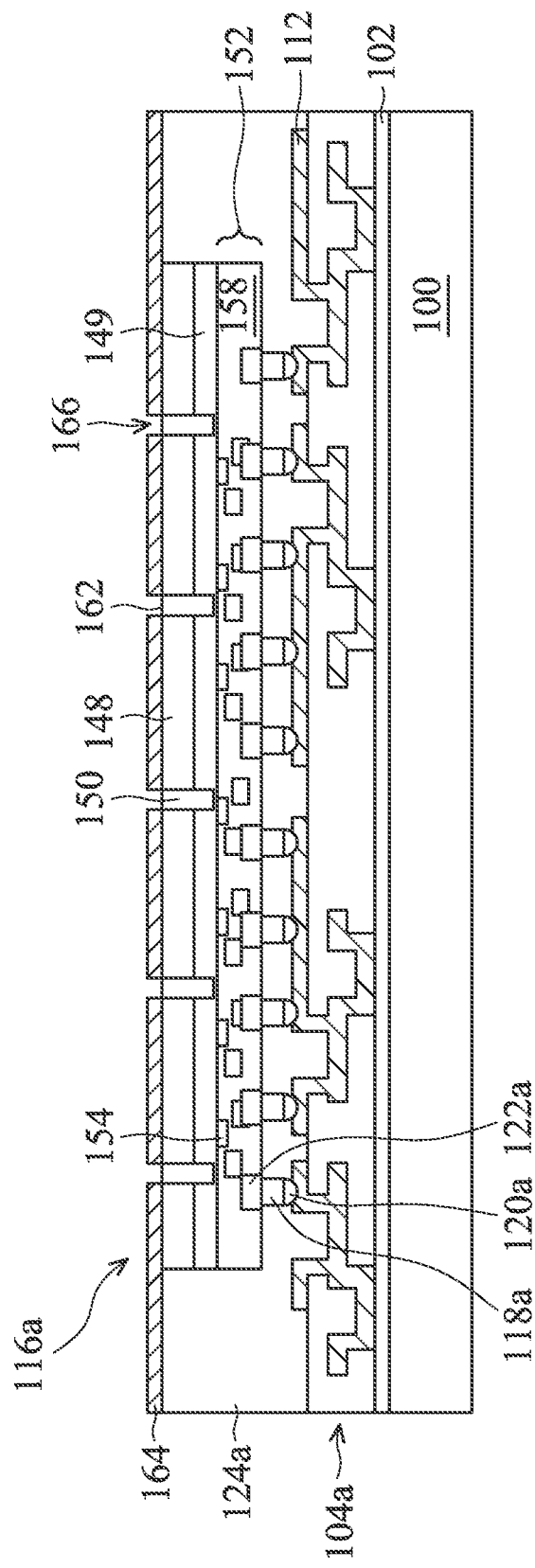
Figure 35:
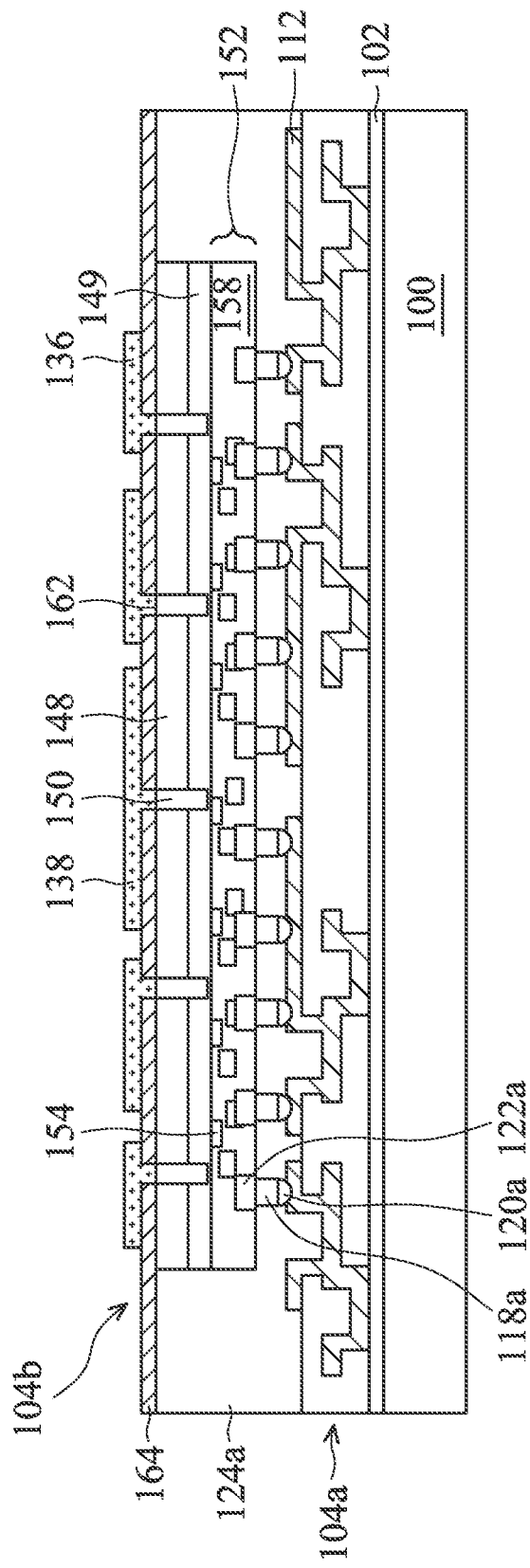
Figure 36:
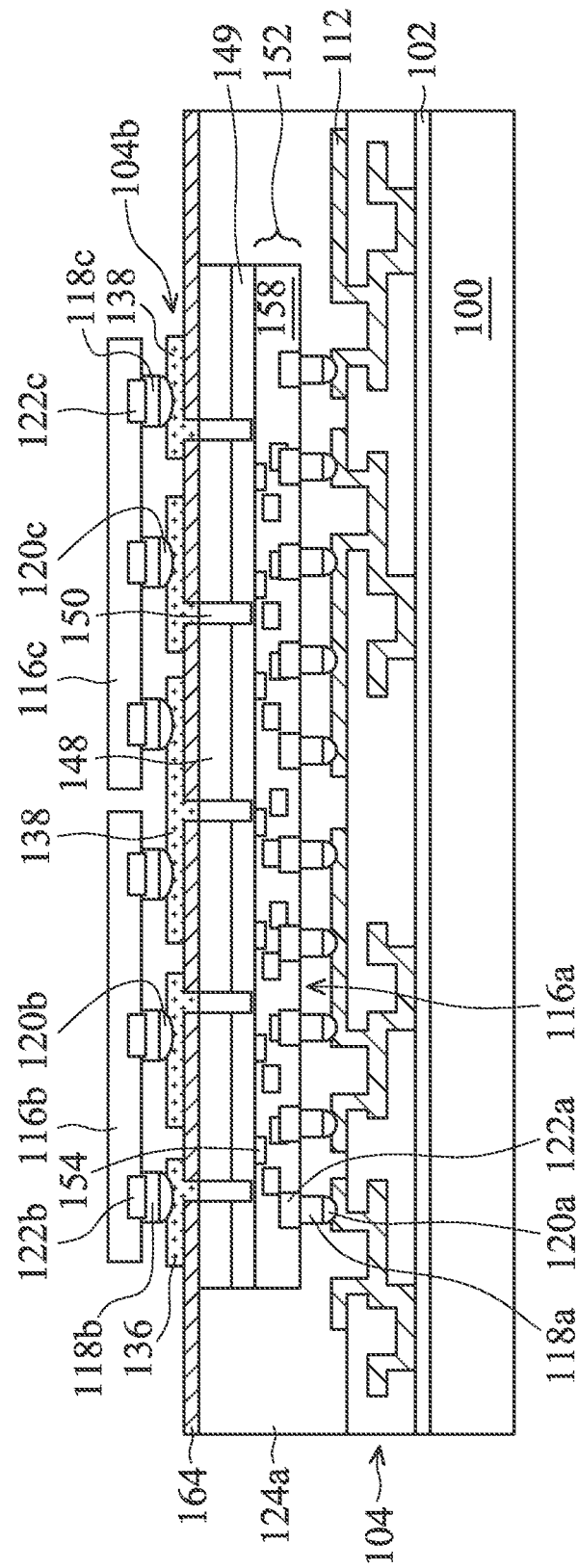

FIGS. 32 through 38 show cross-sectional views of an embodiment wherein an IC 116a comprising a through-substrate via (TSV) IC is packaged vertically with at least one other IC 116b and 116c (see FIG. 36). The IC 116a includes a substrate 148 and an insulating material 149 formed on a surface thereof, as shown in FIG. 32. A plurality of TSVs 150 is formed in the insulating material 149 and in a portion of the substrate 148. A plurality of metallization layers 152 is formed over the TSVs 150 and insulating material 149. The metallization layers 152 comprise a plurality of conductive lines and vias 154 formed in a plurality of insulating material layers 158.

Figure 33:
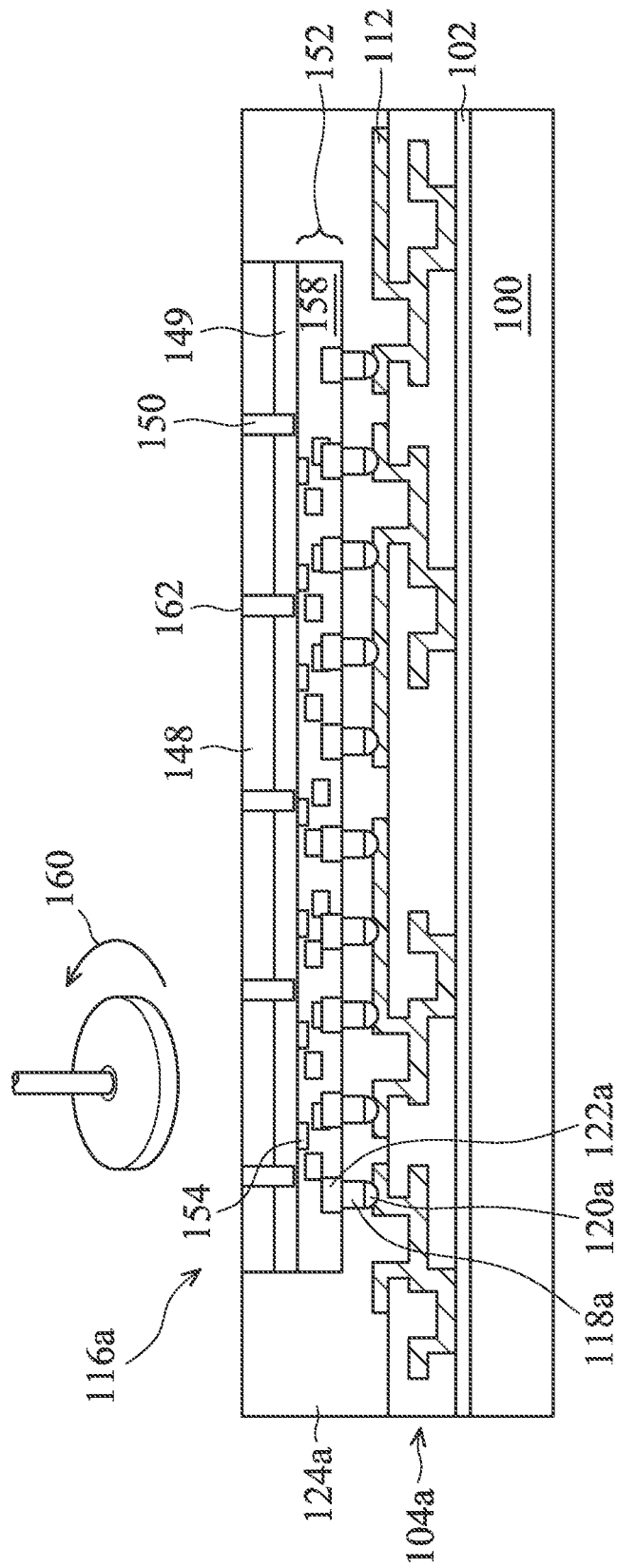

After the packaging steps described for FIG. 1, the IC 116a is coupled to the RDL 104a as described for the previous embodiments herein, e.g., contact pads 122a of the IC 116a are coupled to traces 114 of the wiring 112 by metal pillars 118a and solder bumps 120a, as shown in FIG. 32. A first molding compound 124a is formed over the IC 116a and the RDL 104, as shown in FIG. 33, and the package is exposed to one or more CMP processes 160, or etch processes, which remove a top portion of the molding compound 124a and also removes a portion of the substrate 148 of the IC 116a, exposing top surfaces 162 of the TSVs 150, also shown in FIG. 33. An isolation layer comprising an insulating material 164 is formed over the IC 116a and the molding compound 124a, and the insulating material 164 is patterned using lithography, forming openings 166 in the insulating material 164 and exposing the top surfaces 162 of the TSVs 150, as shown in FIG. 34. A conductive material is formed over the insulating material 164 and is patterned using lithography, forming wiring 136 that is coupled to the top surfaces 162 of the TSVs 150, as shown in FIG. 35. The wiring 136 and insulating material 164 function as a second RDL 104b in this embodiment.

At least one IC 116b or 116c is attached to the wiring 136 of the second RDL 104b, as shown in FIG. 36. Two ICs 116b and 116c are shown in FIG. 36; alternatively, a plurality of ICs 116b and 116c may be formed over the surface of the RDL 104b as in the other embodiments described herein, for example. At least portions of the ICs 116b and 116c may reside over the IC 116a in the underlying layer, and the entirety of the ICs 116b and 116c may reside over the IC 116a in some embodiments, as shown. Solder bumps 118b of ICs 116b are coupled to traces 138 of wiring 136, and solder bumps 118c of ICs 116c are also coupled to traces 138 of wiring 136.

Figure 37:
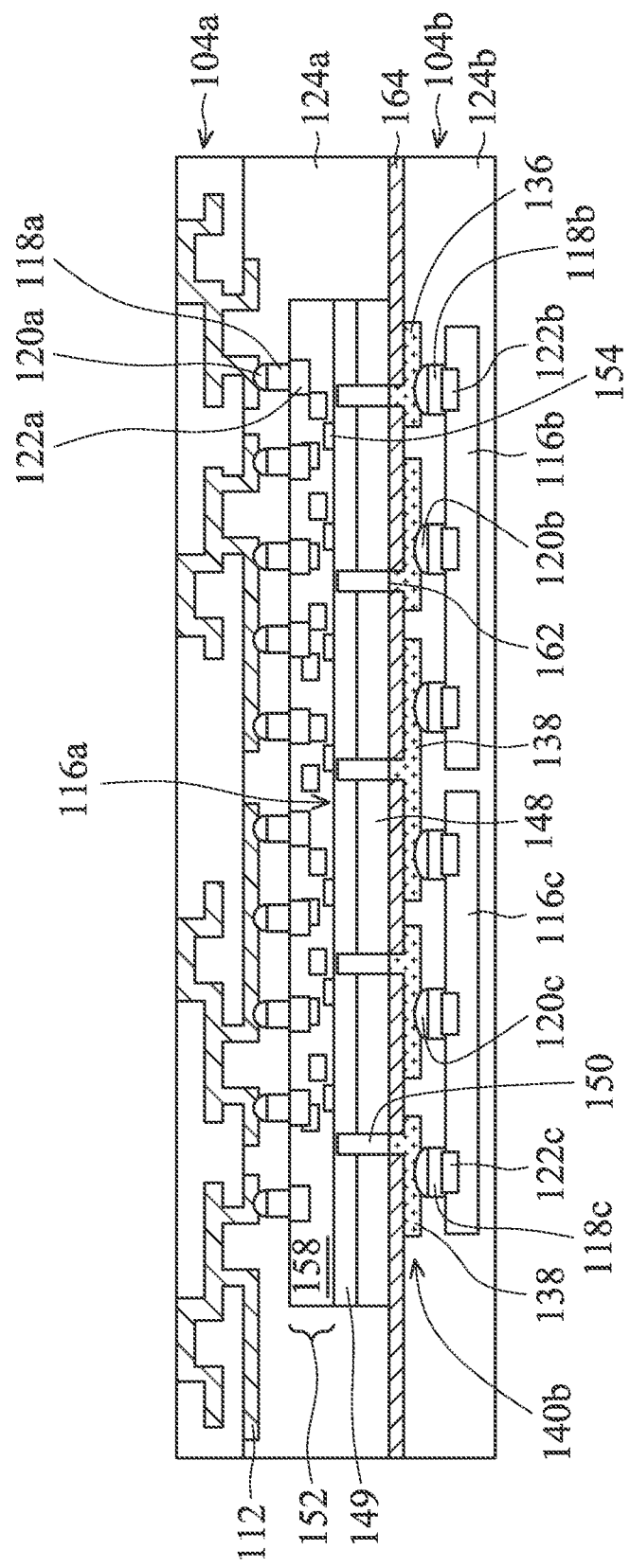
Figure 38:
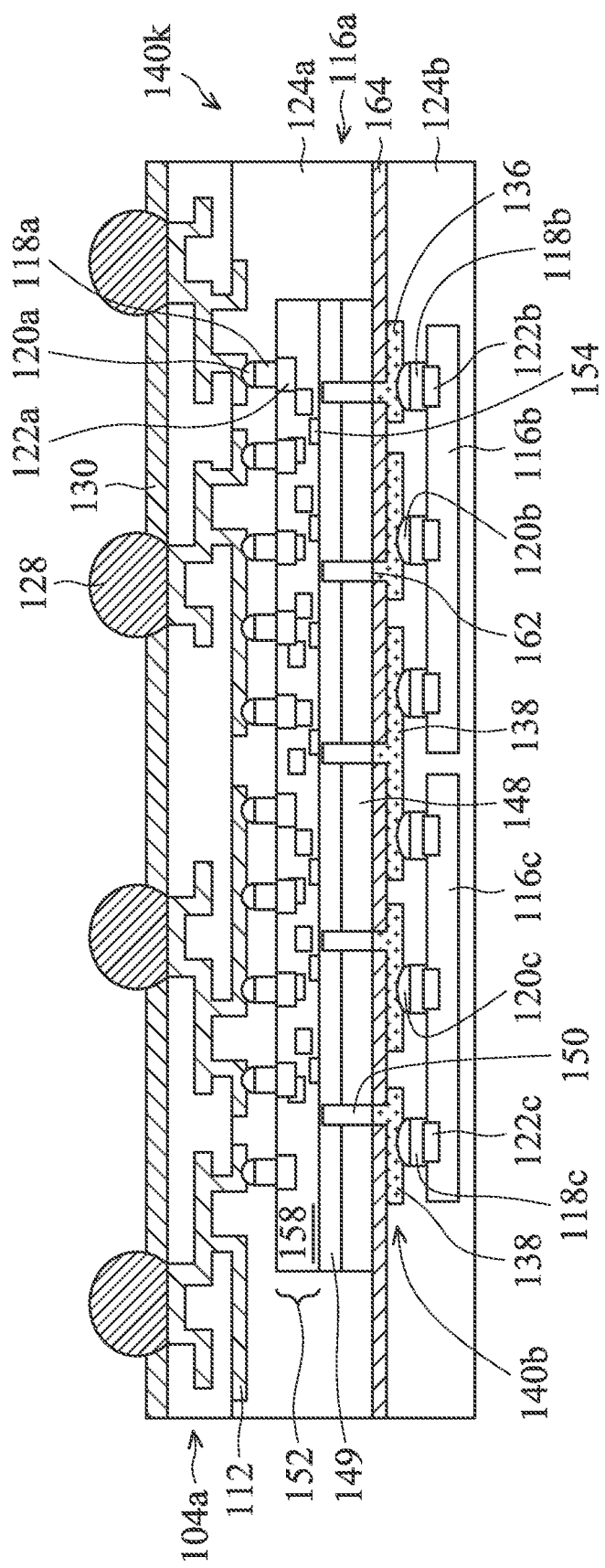

A second molding compound 124b comprising similar materials as described for the first molding compound 124a is formed over the structure, as shown in FIG. 37, e.g., over ICs 116b and 116c, wiring 136, and the insulating material 164. The carrier wafer 100 and adhesive 102 are then removed, also shown in FIG. 37. Metal bumps 128 are formed on the RDL 104a, and a molding compound 130 may optionally be formed over the RDL 104 between the metal bumps 128, as shown in FIG. 38. The structure is then singulated to form the packaged semiconductor device 140k shown in FIG. 38.

The novel packaged semiconductor device 140k comprises a 3DIC that includes an IC 116a comprising TSVs 150. The packaged semiconductor device 140k comprises a multi-chip package wherein the ICs 116a and ICs 116b and 116c are positioned vertically in the package. The ICs 116a, 116b, and 116c may be coupled together by wiring 112 in the first RDL 104a, by the vertical connections provided by the TSVs 150 of the IC 116a, and/or by the wiring 136 of the second RDL 104b. The packaged semiconductor device 140k advantageously may comprise a SiP, for example.

Figure 39:
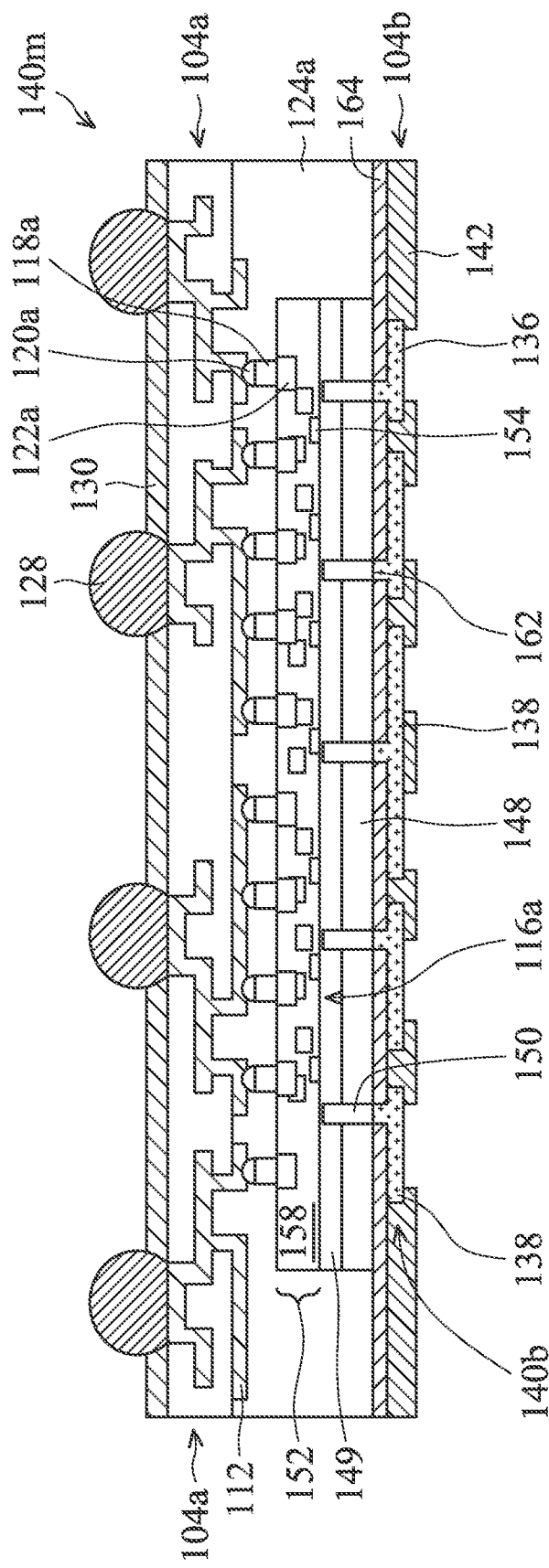
FIG. 39 shows an embodiment wherein a second RDL is formed over a TSV IC.

FIG. 39 shows an alternative embodiment of the embodiment shown in FIGS. 32 through 38, wherein a second RDL 104b is formed over an IC 116a that comprises a TSV IC. The packaged semiconductor device 140m comprises a single IC 116a, and electrical connections may be made to the package on exposed portions of the second RDL 104b, as previously described herein with reference to the embodiments shown in FIGS. 22, 26, and 30.

In the embodiments shown in FIGS. 1 through 39, a carrier wafer 100 is first provided, and the RDL 104 or first RDL 104a is formed over the carrier wafer 100. The carrier wafer 100 is removed when it is no longer required for the packaging process flow. Thus, the carrier wafer 100 is a sacrificial component in the packaging process.

In the embodiments shown in FIGS. 40 through 66, a carrier wafer is used that comprises a substrate 268 that comprises a sacrificial device during the formation of the RDL 104 and landing pads of the package. Like numerals are used for the various elements in FIG. 40 through 66 that were used to describe FIGS. 1 through 39. To avoid repetition, each reference number shown in FIGS. 40 through 66 is not described again in detail herein. Rather, similar materials x00, x02, x04, etc., are used to describe the various material layers and components shown as were used to describe FIGS. 1 through 39, where x=2 in FIGS. 40 through 66.

Figure 40:
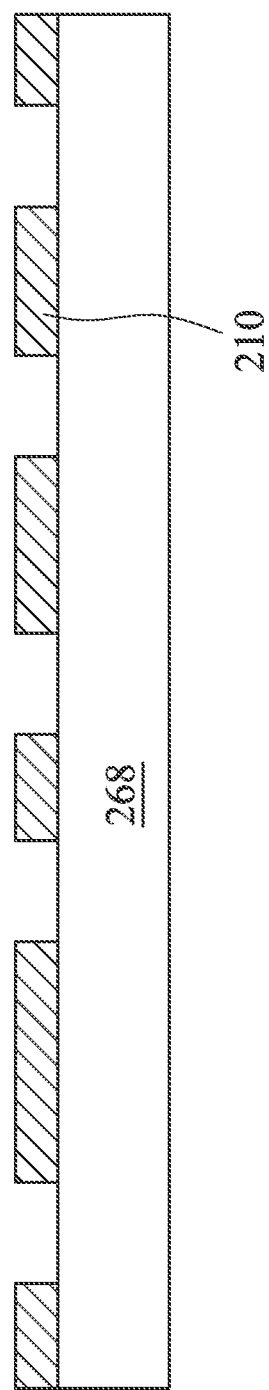
FIGS. 40 through 47 show cross-sectional views of a method of packaging one IC or packaging two or more ICs laterally in accordance with another embodiment, wherein connections of the package comprise metal bumps comprising solder balls.

FIGS. 40 through 47 show cross-sectional views of a method of packaging one IC 216a or packaging two or more ICs 216a and 216b laterally in accordance with another embodiment of the present disclosure, wherein connections of the package comprise metal bumps comprising solder balls. First, a substrate 268 is provided, as shown in FIG. 40. The substrate may comprise a semiconductive material such as silicon, for example. The substrate 268 comprises a bare silicon wafer in some embodiments, for example. The substrate 268 is also referred to herein, e.g., in the claims, as a carrier wafer. The substrate 268 comprises a first carrier wafer in the embodiment shown.

Figure 41:
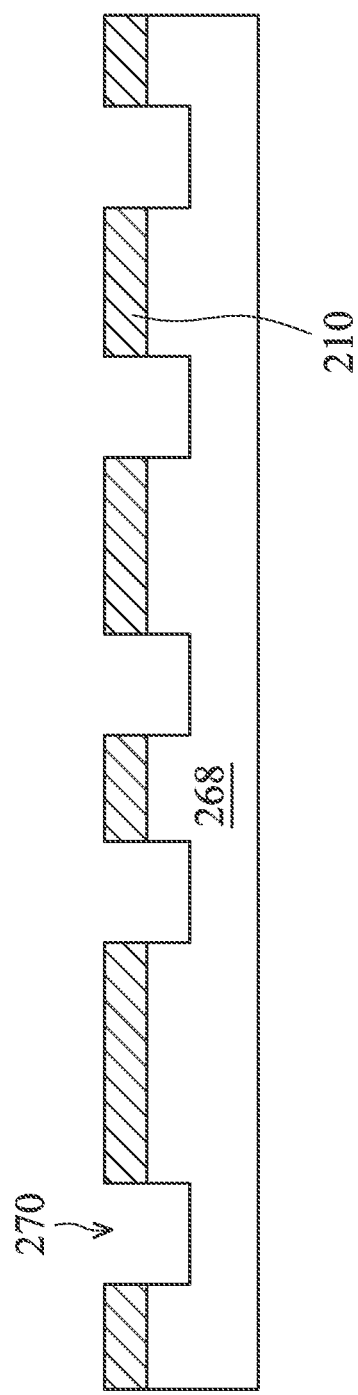

An insulating material 210 is formed over the substrate 268 and is patterned using lithography, also shown in FIG. 40. The top surface of the substrate 268 is removed, as shown in FIG. 41, e.g., using an etch process such as a dry or wet etch process. The insulating material 210 may be used as a mask in the etch process, for example. The insulating material 210 will function as an insulating material for the RDL 204.

Figure 42:
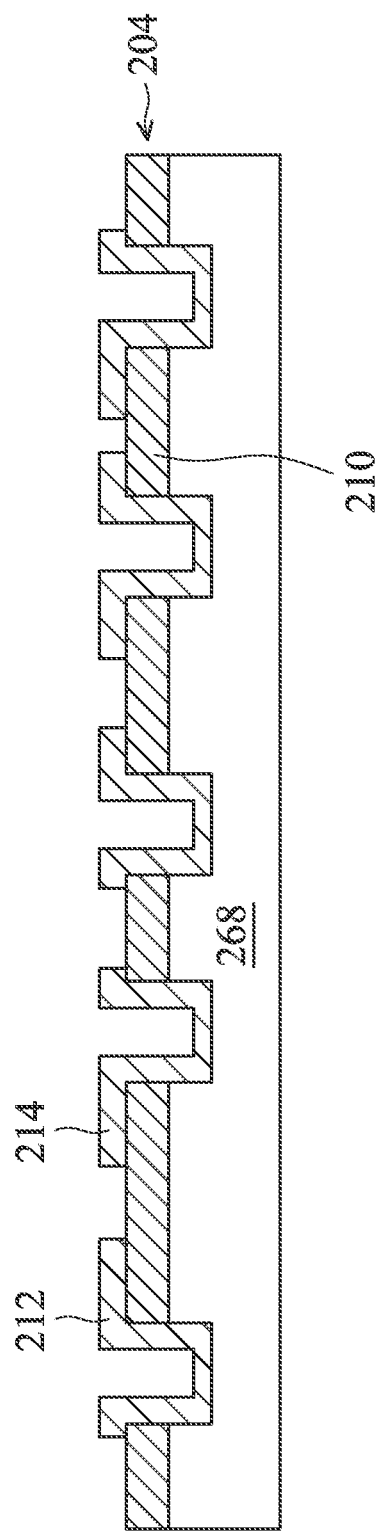

Next, wiring 212 is formed over the insulating material 210, as shown in FIG. 42. The wiring 212 is formed by depositing a conductive material over the insulating material 210 and exposed portions of the substrate 268, and patterning the conductive material to form the wiring 212, for example. The wiring 212 may be formed by sputtering on a first layer of Ti/Cu and then electroplating Ni/Cu on the Ti/Cu layer, for example. The wiring 212 may alternatively be formed using other methods. The wiring 212 includes portions that comprise traces 214 for connecting solder bumps 220 to connect to an IC 216a or 216b to the RDL 204a. The wiring 212 and the insulating material 210 form an RDL 204 in this embodiment.

Figure 43:
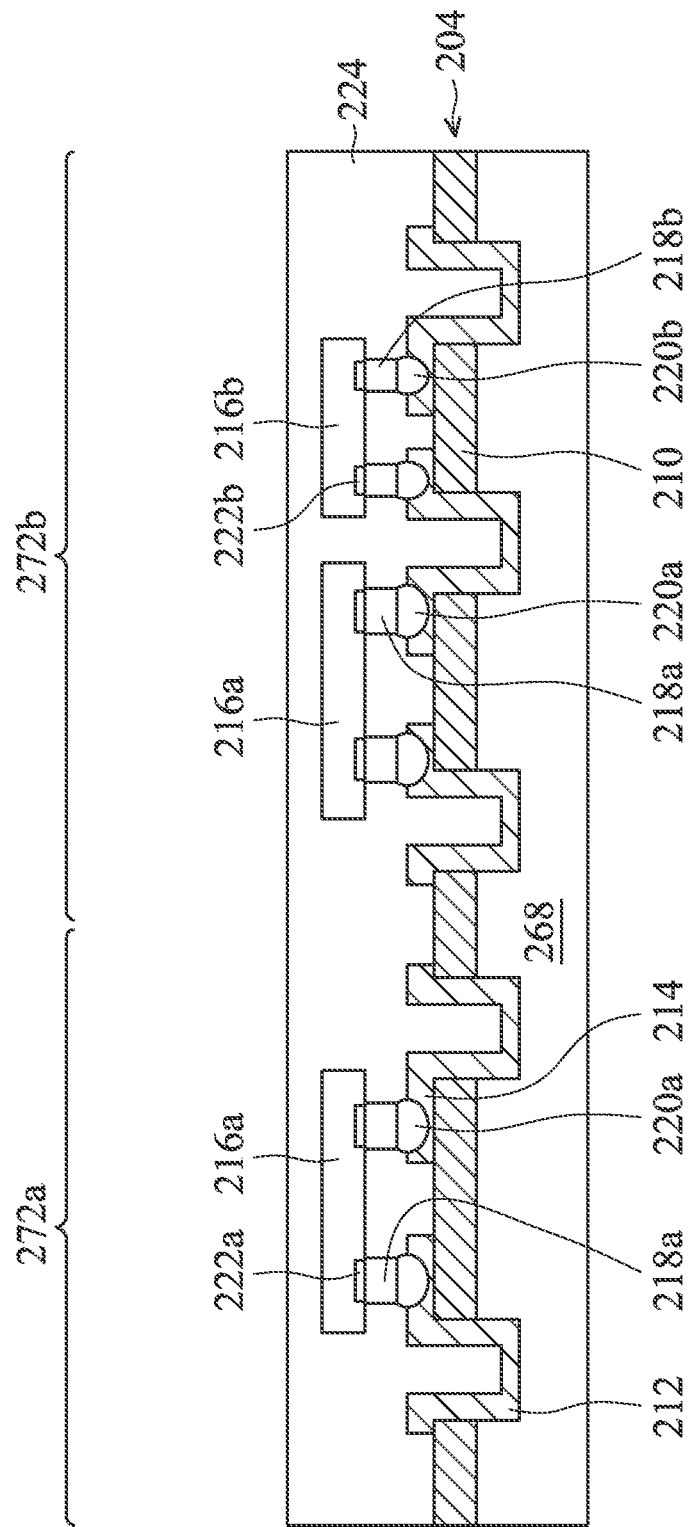

ICs 216a and 216b are coupled to the traces 214 of the wiring 212, e.g., using a BOT technique, as described for the other embodiments herein and as shown in FIG. 43. A molding compound 224 is formed over the ICs 216a and 216b and over the RDL 204. The substrate 268 comprises a first region 272a where ICs 216a will be packaged individually and a second region 272b where ICs 216a and 216b will be packaged together (and optionally with other ICs, not shown).

Figure 44:
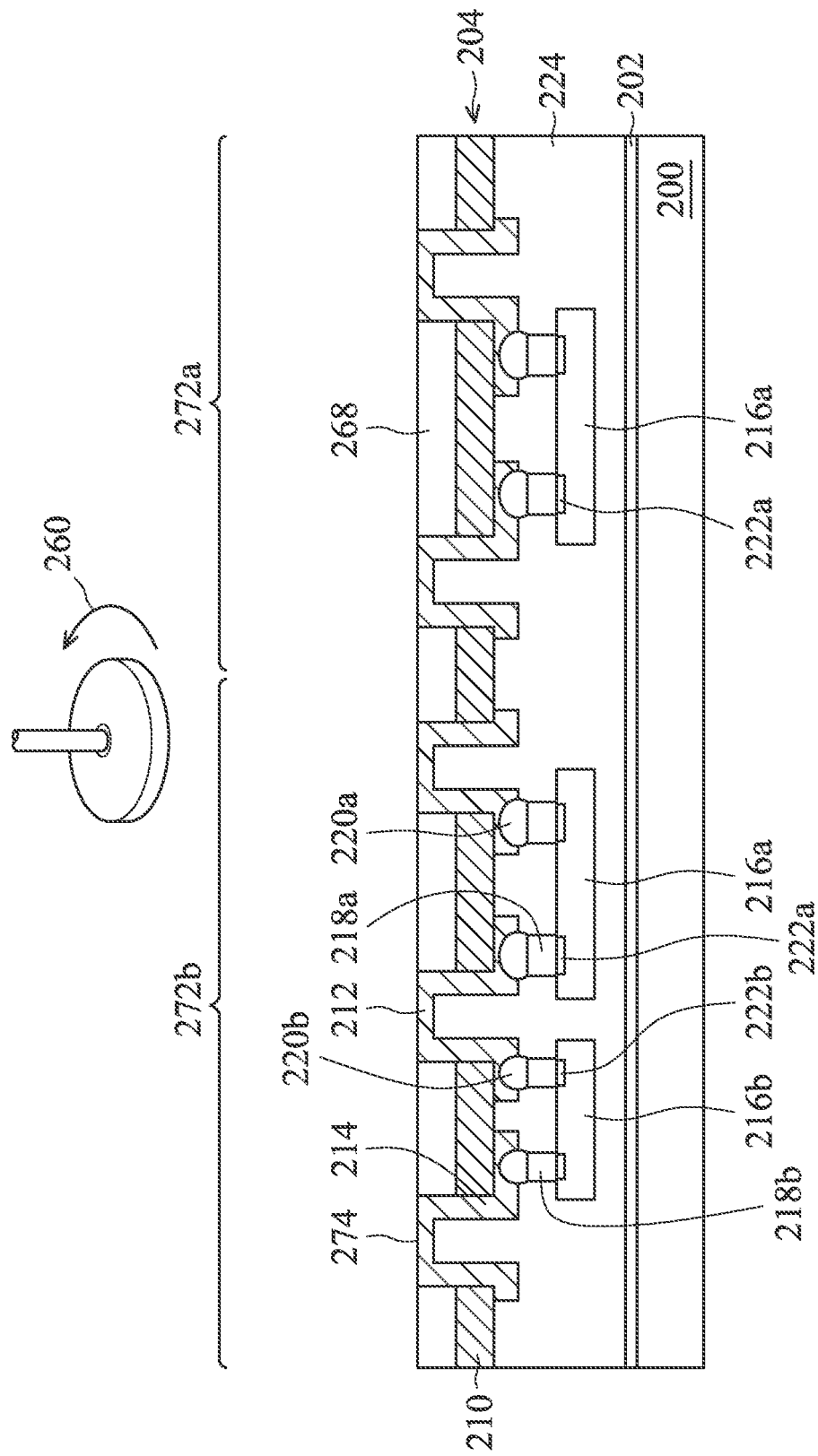
Figure 45:
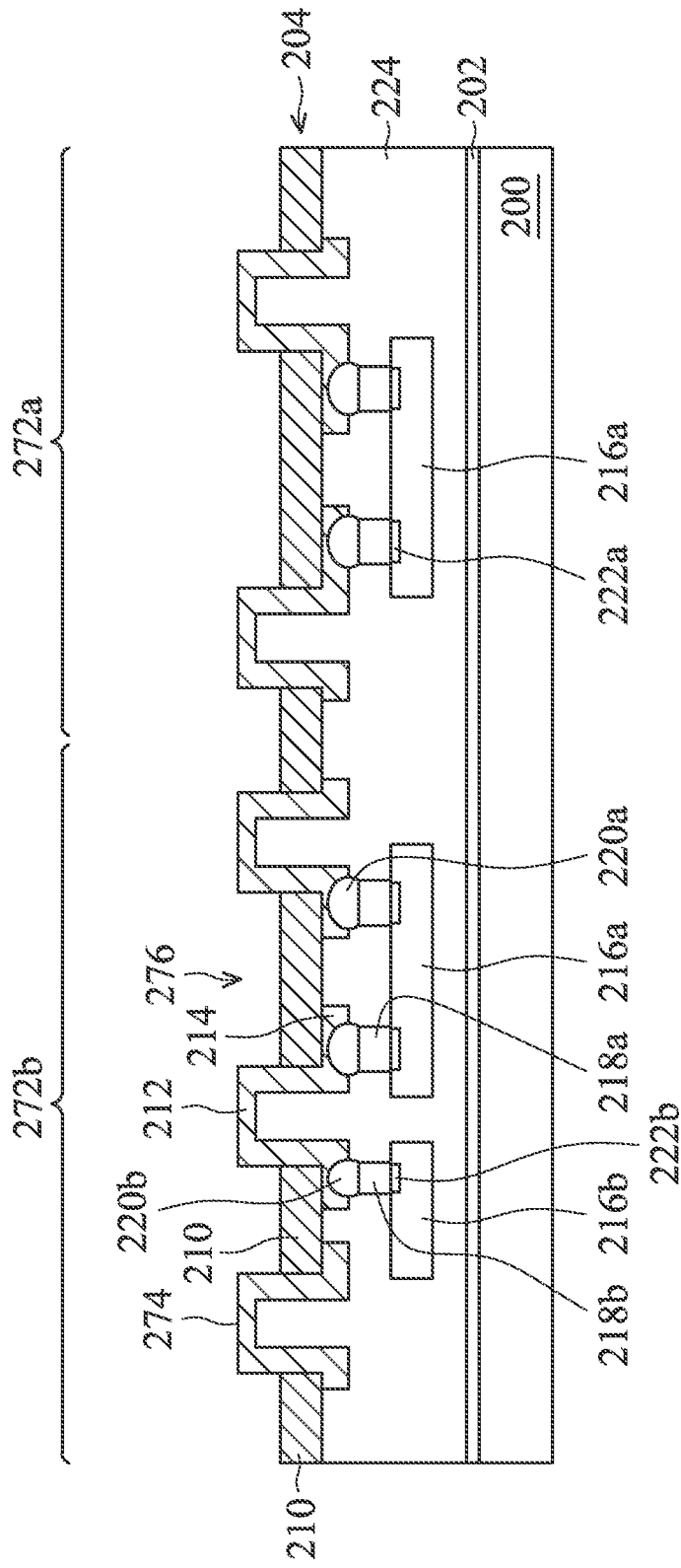

A second carrier wafer 200 is bonded or attached to the molding compound 224 using an adhesive 202, as shown in FIG. 44. The structure is exposed to a grinding or CMP process 260, removing a portion of the substrate 268 or first carrier wafer and leaving top surfaces 274 of the wiring 212 exposed, also shown in FIG. 44. Remaining portions of the substrate 268 are removed using an etch process 276, leaving the insulating material 210 of the RDL 204 exposed, as shown in FIG. 45. The etch process 276 may comprise a dry or wet silicon etch process, as examples. Portions of the wiring 212 protrude above the top surface of the insulating material 210. Thus, the substrate 268 comprising the first carrier wafer has been removed from the structure at this point in the packaging process.

Figure 46:
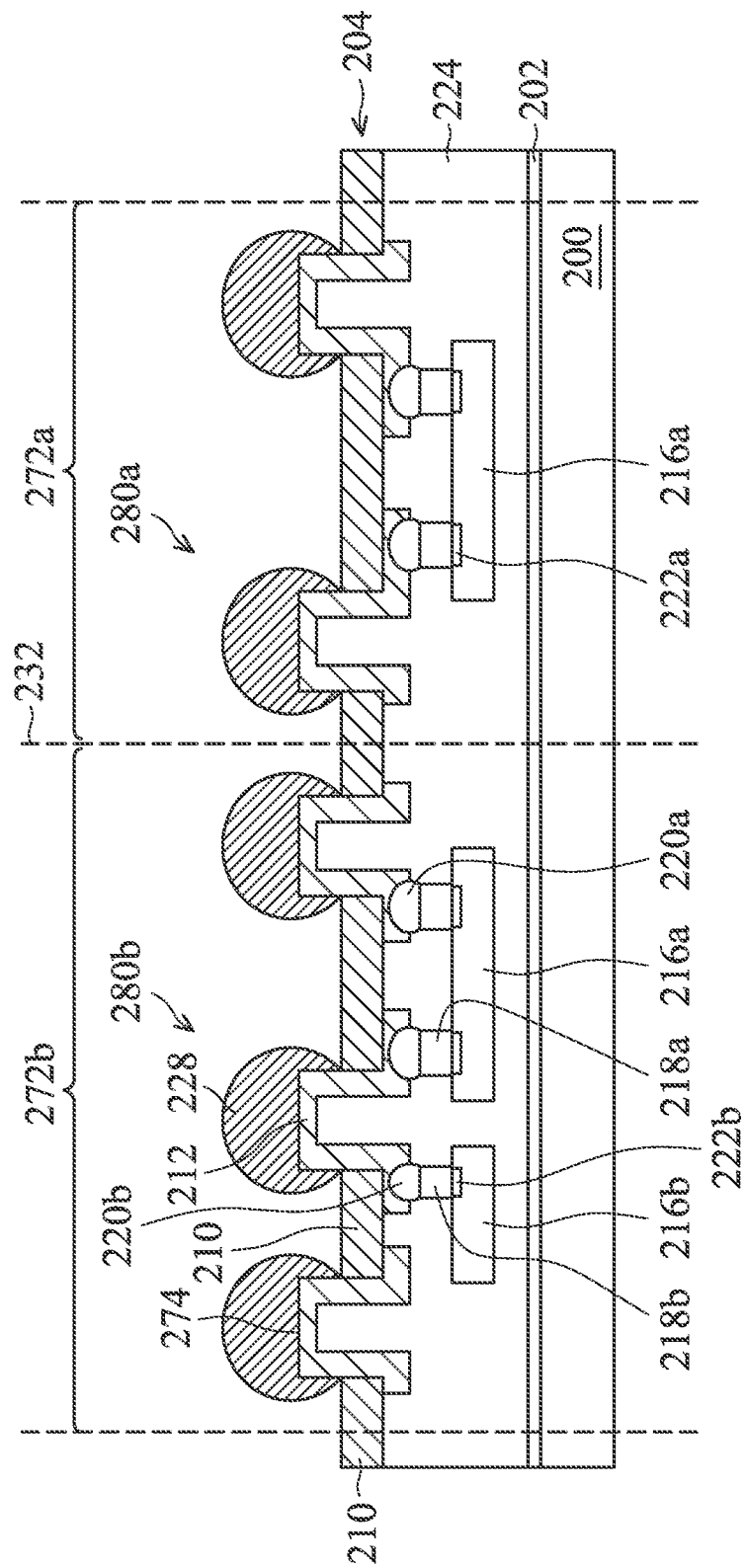
Figure 47:
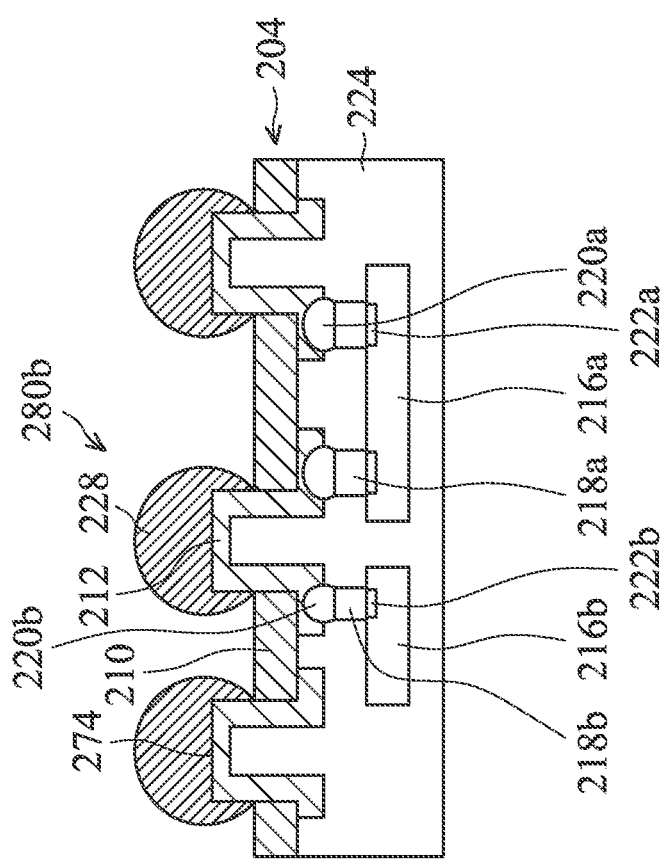

Metal bumps 228 are formed on the exposed portions of the wiring 212, as shown in FIG. 46. The metal bumps 228 comprise solder balls and may be formed using a solder ball drop process, for example. The carrier wafer 200 and adhesive 202 are released or removed, and the packages are singulated at singulation lines 232, forming a packaged semiconductor device 280a comprising a single IC 216a in the first region 272a, and forming a packaged semiconductor device 280b comprising multiple ICs 216a and 216b in the second region 272b, as shown in FIG. 47 after the singulation process. An optional molding compound (not shown) may also be formed over the insulating material 210 between the metal bumps 228, as described for the previous embodiments. The optional molding compound such as molding compound 130 shown in the previous embodiments may also be included in the remaining embodiments herein, not shown in the figures.

Thus, packaged semiconductor devices 280a and 280b comprising an RDL 204 and molding compound 224 are formed using two carrier wafers 268 and 200 in accordance with the embodiment shown in FIGS. 40 through 47. The metal bumps 228 of the packaged semiconductor devices 280a and 280b comprise solder balls in this embodiment.

Figure 48:
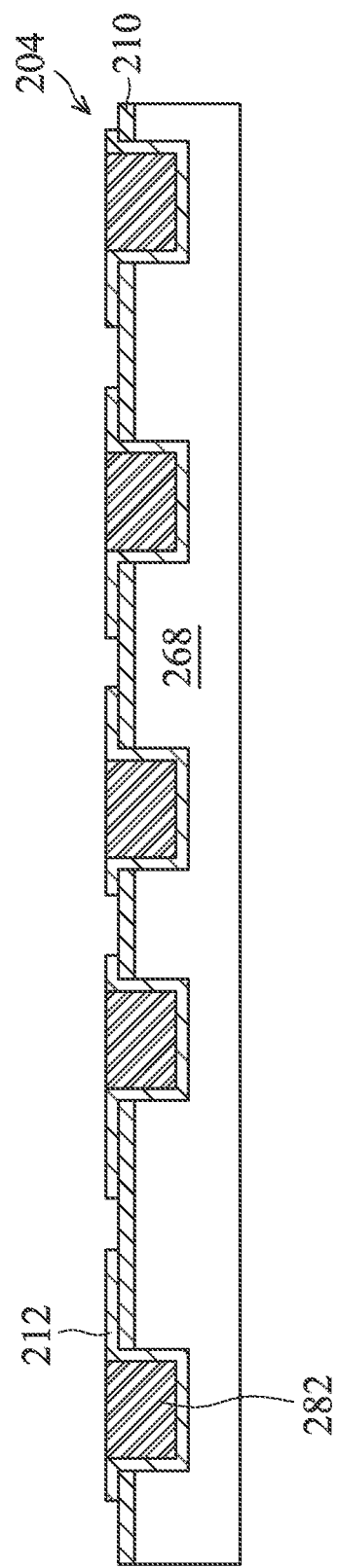
FIGS. 48 through 52 show an alternative embodiment to the embodiment shown in FIGS. 40 through 47, wherein a solder paste is used to form the metal bumps of the package.
Figure 49:
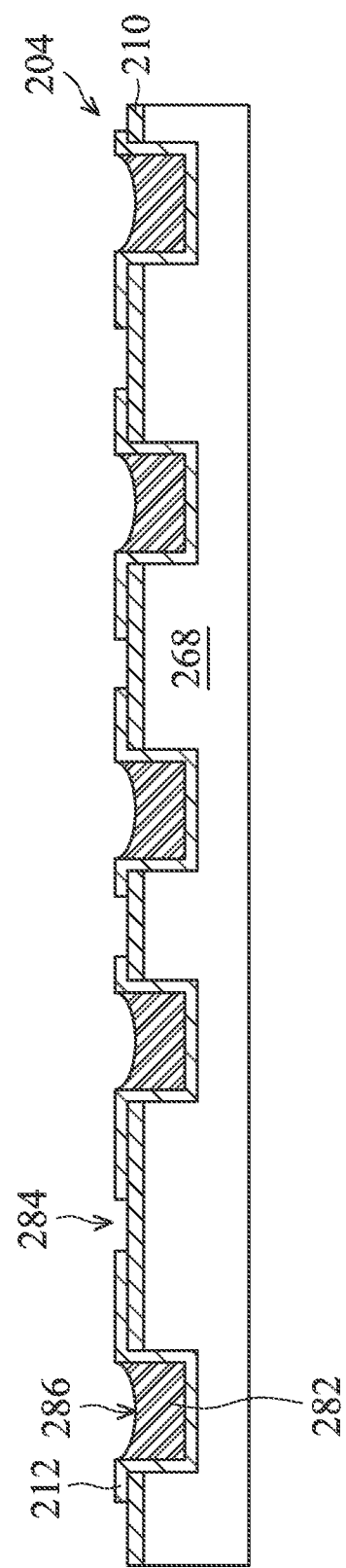

FIGS. 48 through 52 show an alternative embodiment to the embodiment shown in FIGS. 40 through 47, wherein a solder paste is used to form the metal bumps 228 of the package. After forming the wiring 212 of the RDL 204 as shown in FIG. 42, a solder paste 282 is formed over the wiring 212 and exposed portions of the insulating material 210, as shown in FIG. 48. The solder paste 282 adheres to the wiring 212 and not the insulating material 210. The solder paste 282 is subjected to a reflow process 284, as shown in FIG. 49, forming concave regions 286 over the solder paste 282 within the wiring 212 patterns after the reflow process 284.

Figure 50:
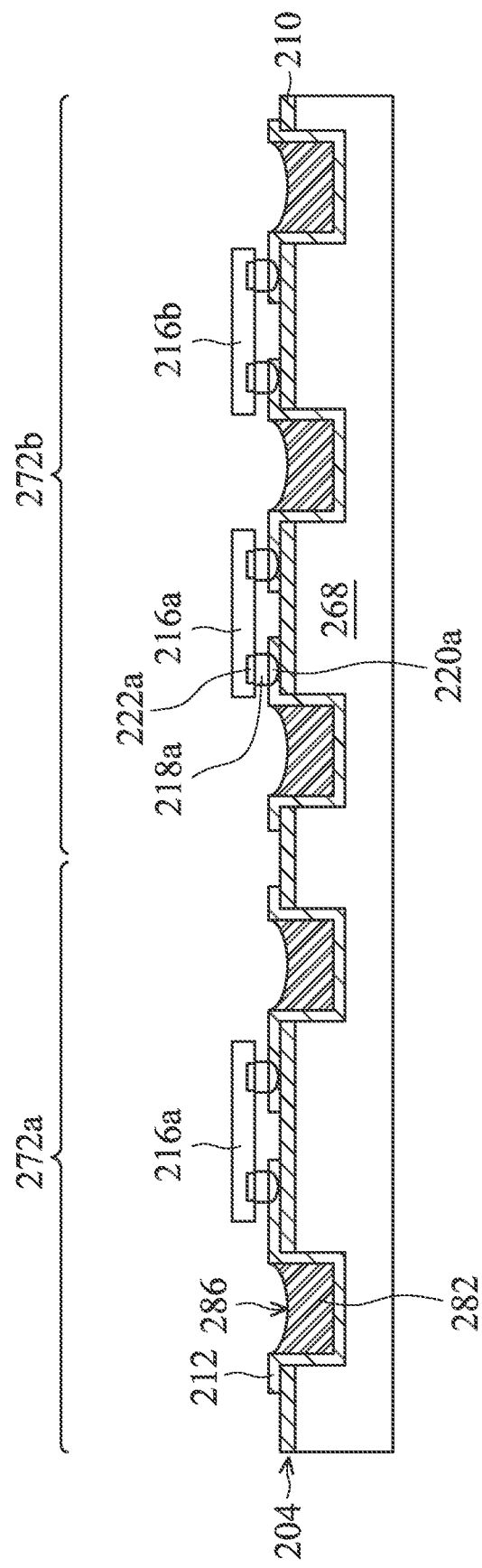
Figure 51:
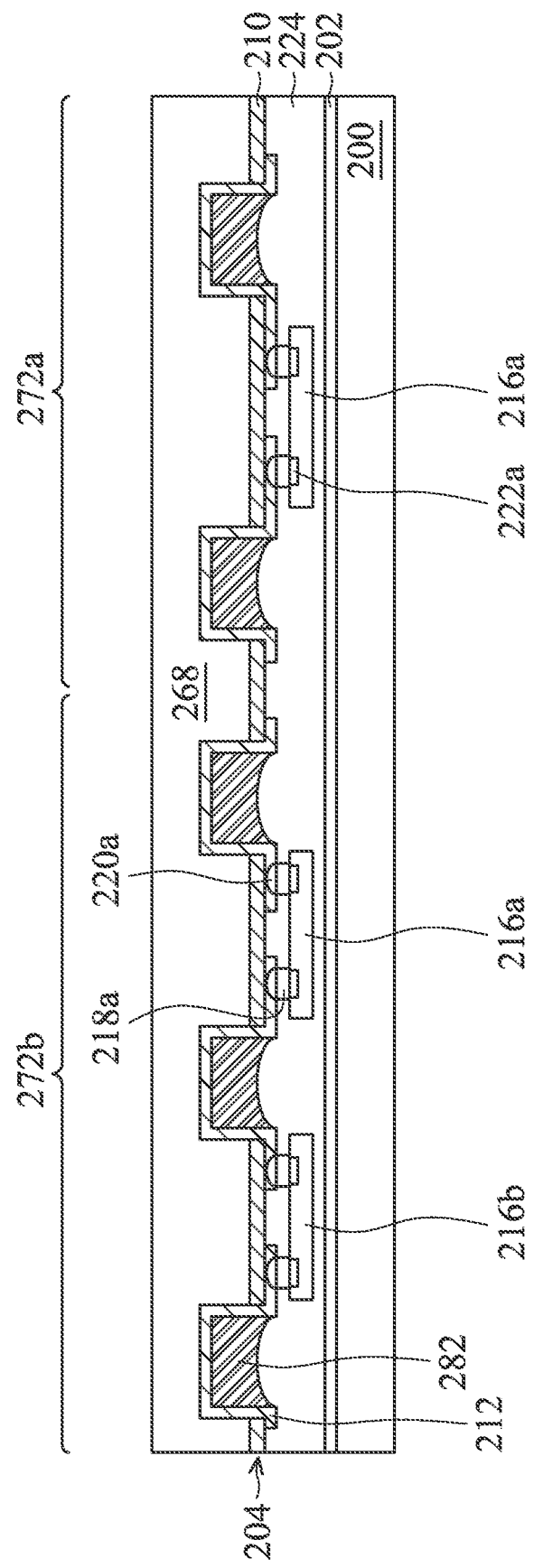
Figure 52:
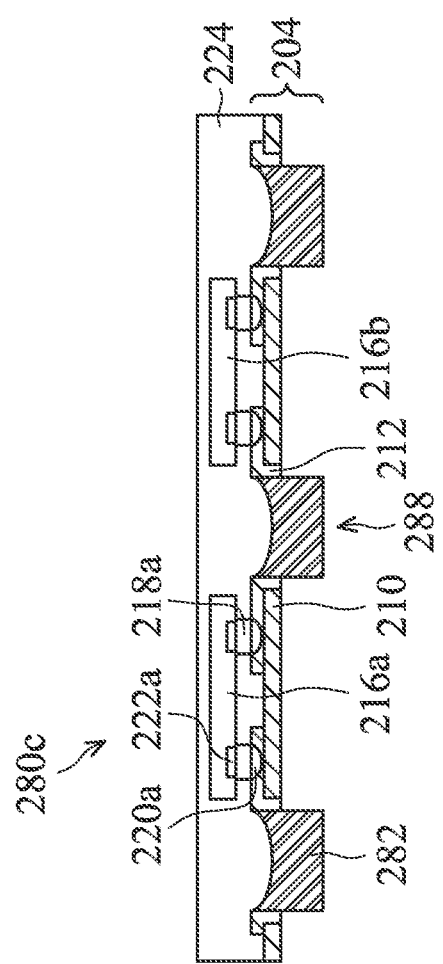

ICs 216a and 216b are coupled to the traces 214 of the wiring 212, as shown in FIG. 50, and a molding compound 224 is formed over the ICs 216a and 216b and over the RDL 204, as shown in FIG. 51. Second carrier wafer 200 is bonded or attached to the molding compound 224 using an adhesive 202, also shown in FIG. 51. The packaging processes shown and described with reference to FIGS. 44 and 45 are followed, and the structure is exposed to an etch process to remove the wiring from the surfaces of the solder paste 282 above the insulating material 210, leaving the solder paste 282 exposed, as shown in FIG. 52. The second carrier wafer 200 is removed, and the structure is singulated, leaving a packaged semiconductor device comprising a single IC 216a in first region 272a (not shown) and leaving the packaged semiconductor device 280c comprising multiple ICs 216a and 216b singulated from second region 272b, shown in FIG. 52.

In this embodiment, rather than forming solder balls to form metal bumps 228 in the previous embodiment, the metal bumps 228 comprise the solder paste 282 that was formed within the wiring 214 of the RDL 204. This embodiment is advantageous in that a processing step to form solder balls is not required. The metal bumps 228 comprising the solder paste 282 comprise landing pads that may be used to couple the packaged semiconductor device 280c to a PCB, another integrated circuit, another package, or other devices. An optional molding compound (not shown) may also be formed over the insulating material 210 between the metal bumps 228, as described for the previous embodiments.

Figure 53:
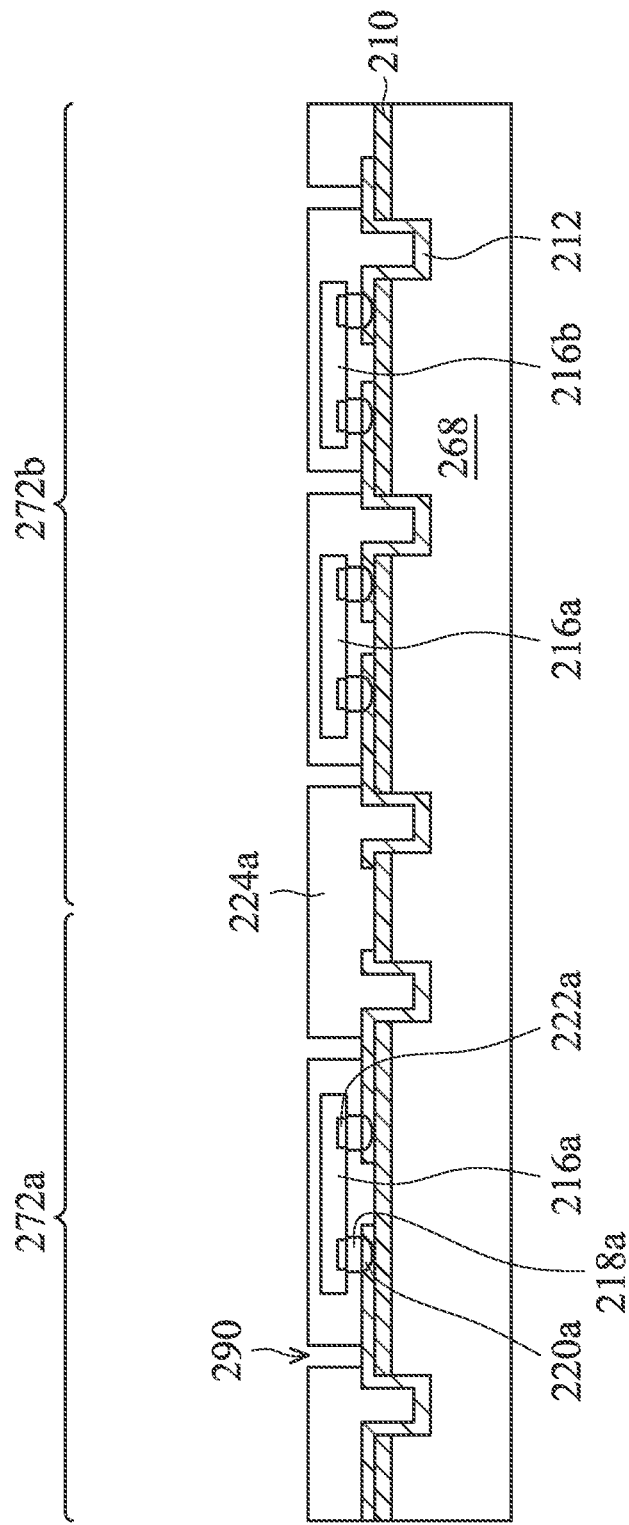
FIGS. 53 through 57 show cross-sectional views of an embodiment wherein multiple ICs are packaged together vertically, or both vertically and laterally.
Figure 54:
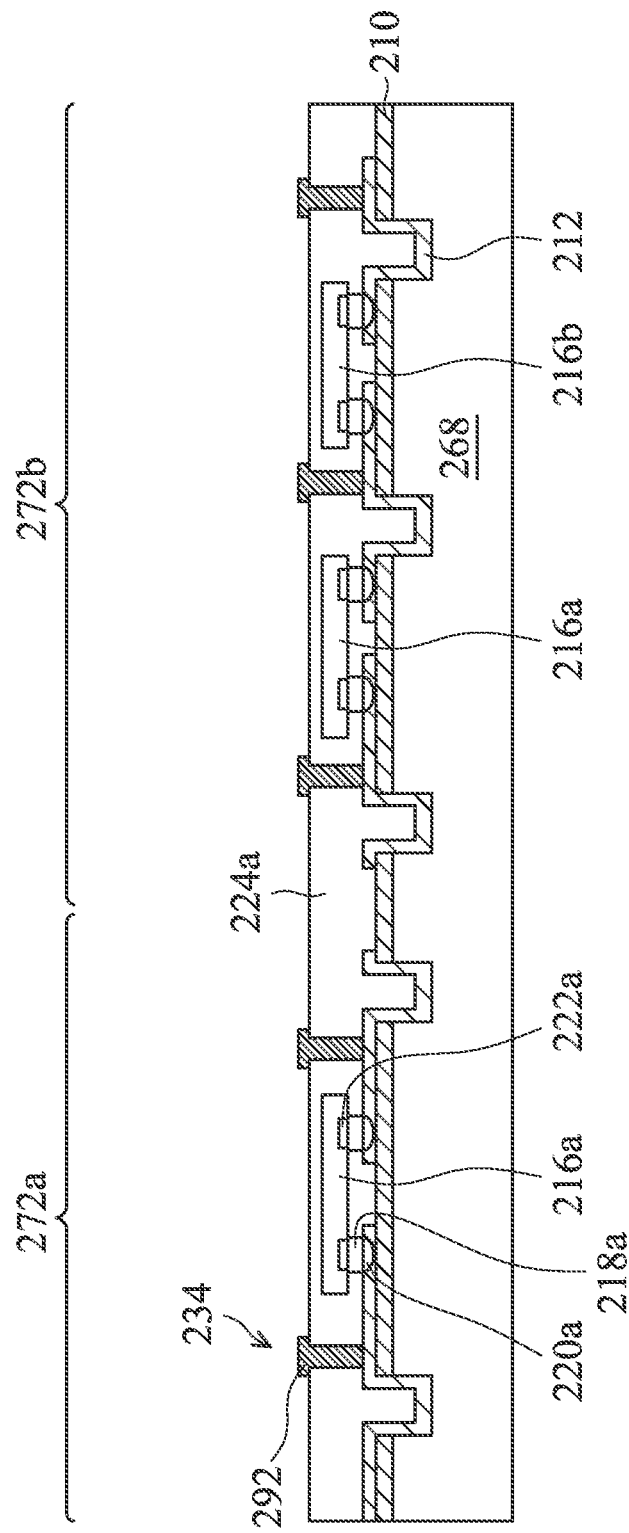
Figure 55:
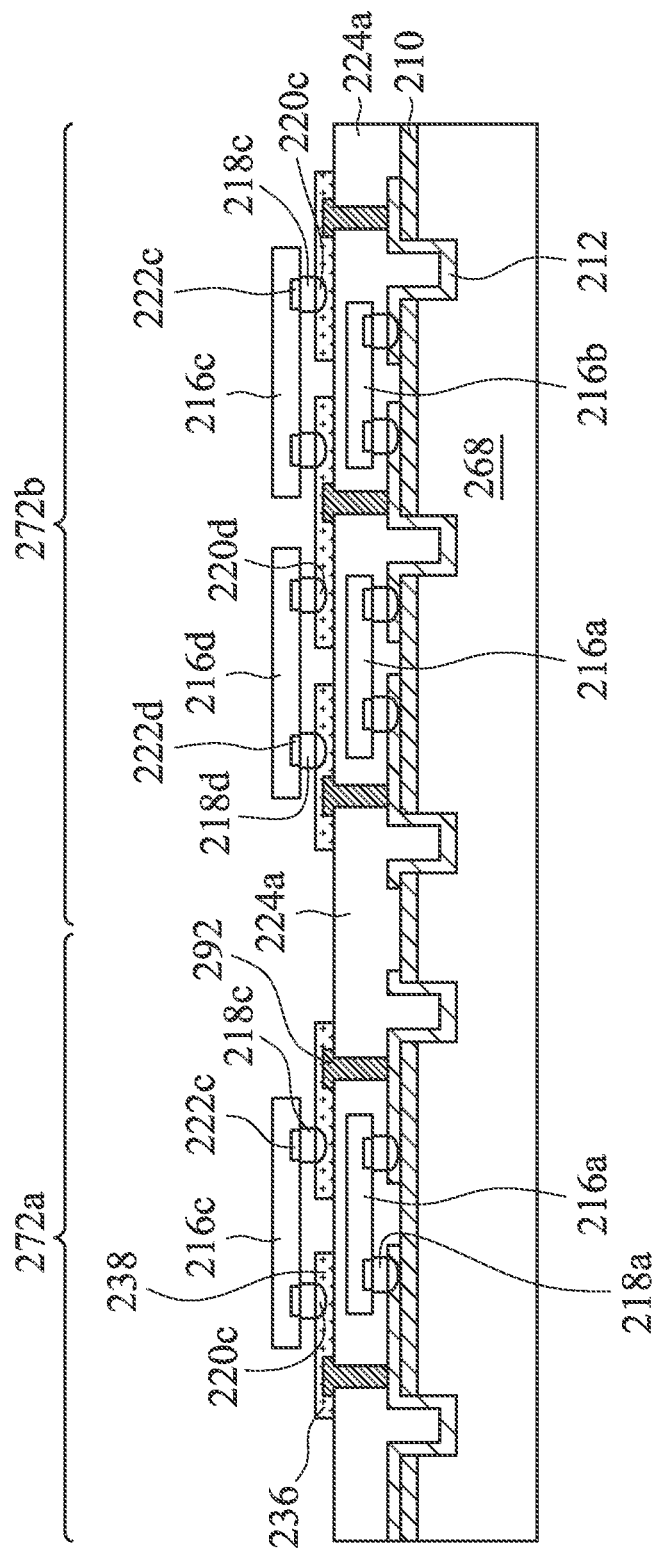
Figure 56:
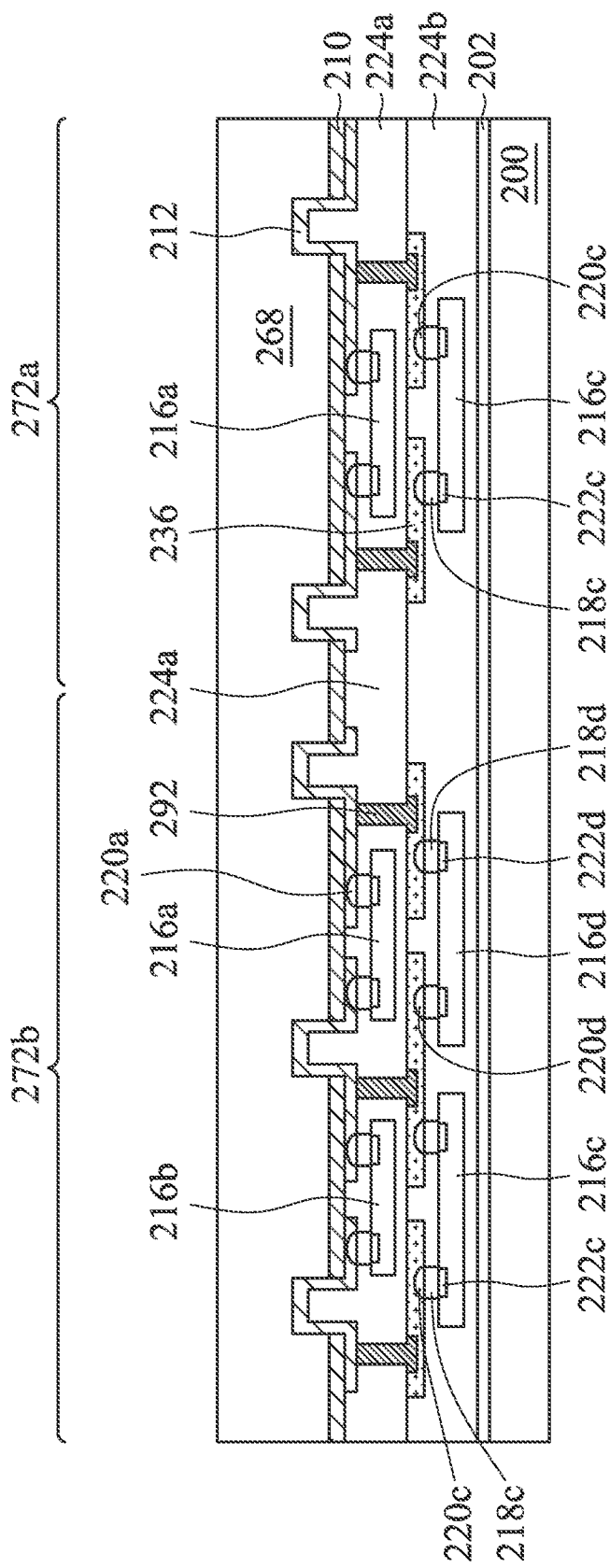
Figure 57:
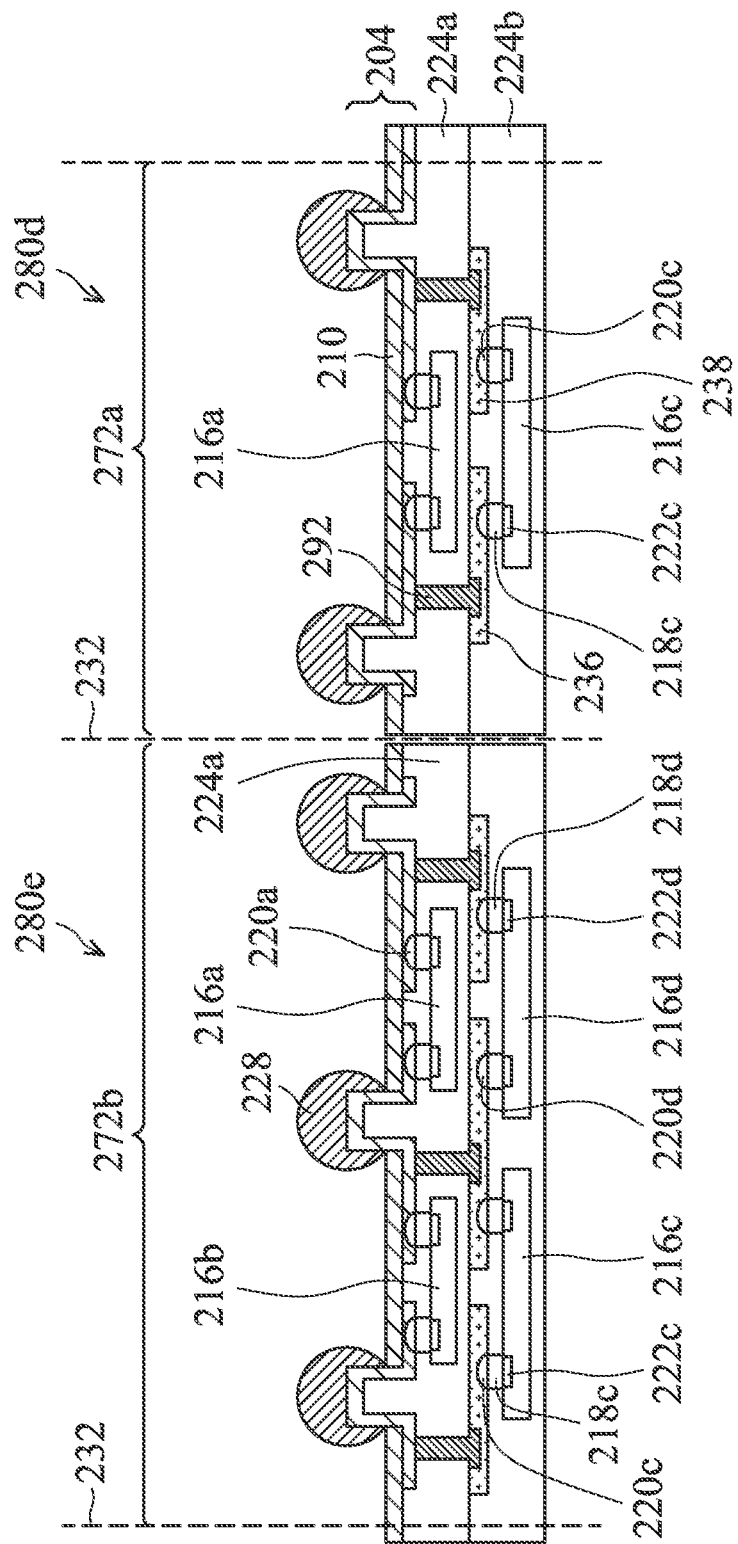

FIGS. 53 through 57 show cross-sectional views of an embodiment wherein multiple ICs are packaged together vertically, or both vertically and laterally. The packaging process initially follows the same procedure as described with reference to FIGS. 40 through 43. Then, the molding compound 224, which comprises a first molding compound 224a in this embodiment, is etched to form patterns 290 for vias within the first molding compound 224a, as shown in FIG. 53. The patterns 290 for the vias are filled with a conductive material to form vias 292 in the first molding compound 224a, as shown in FIG. 54. The vias 292 function as z axis connections 234 in this embodiment. Wiring 236 comprising x-y connections is formed over the molding compound 224a and vias 292, and ICs 216a and 216b are coupled to the wiring 236, as shown in FIG. 55. A second molding compound 224b is formed over the ICs 216a and 216b, the wiring 236, and the first molding compound 224a, and a second carrier wafer 200 is coupled to the second molding compound 224b using adhesive 202, as shown in FIG. 56. The packaging processes described for FIGS. 44 through 47 are performed, and the structure is singulated at singulation lines 232, forming packaged semiconductor device 280d in first region 272a and forming packaged semiconductor device 280e in second region 282b, as shown in FIG. 57.

Figure 58:
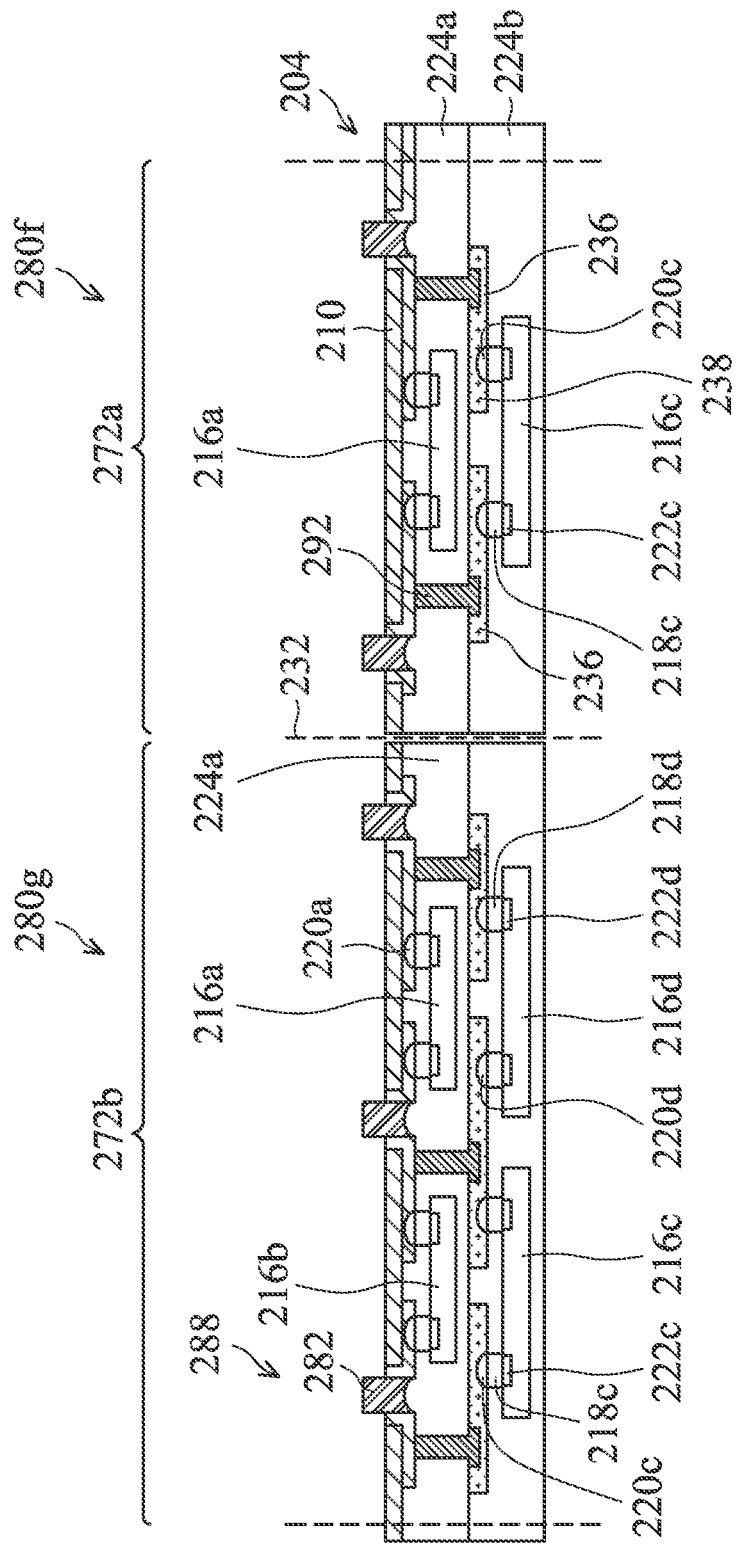
FIG. 58 shows an alternative embodiment to the embodiment shown in FIGS. 53 through 57, wherein metal bumps of the package are formed of solder paste.

FIG. 58 shows an alternative embodiment to the embodiment shown in FIGS. 53 to 57, wherein metal bumps of the package are formed of solder paste 282, as described for the embodiment of FIG. 52. The packaging process described with reference to FIGS. 48 through 52 combined with the packaging process described with reference to FIGS. 53 through 56 and 58 is followed to achieve the packaged semiconductor devices 280f and 280g shown in FIG. 58.

Figure 59:
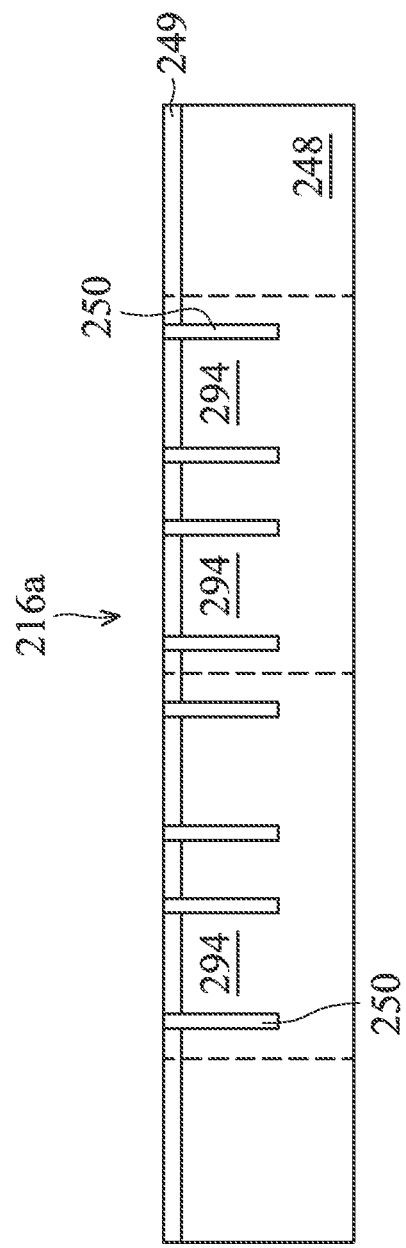
FIGS. 59 through 65 show cross-sectional views of an embodiment wherein a TSV IC is packaged vertically with at least one other IC.
Figure 60:
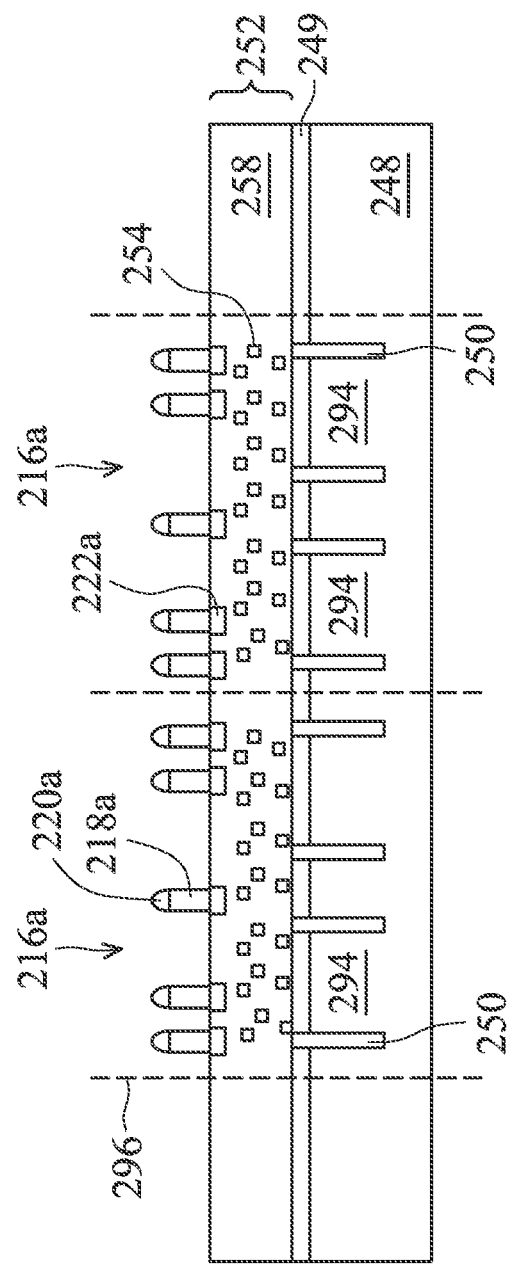

FIGS. 59 through 65 show cross-sectional views of an embodiment wherein an IC 216a TSV IC is packaged vertically with at least one other IC. A portion of the manufacturing process for the IC 216a comprising a TSV IC is shown in FIGS. 59 and 60. A substrate 248 is provided, and the substrate 248 is patterned with a pattern for TSVs 250. The patterns may be lined first with an insulator, and are filled with a conductive material to form the TSVs 250. The TSVs extend partially through the substrate 248. Metallization layers 252 are formed over the insulating material 249 and the TSVs 250 e.g., in a back-end-of-line (BEOL process), and metal pillars 218a and solder bumps 220a are formed over contacts 222a of the ICs 216a, as shown. The dies 216a are singulated at singulation lines 296.

Figure 61:
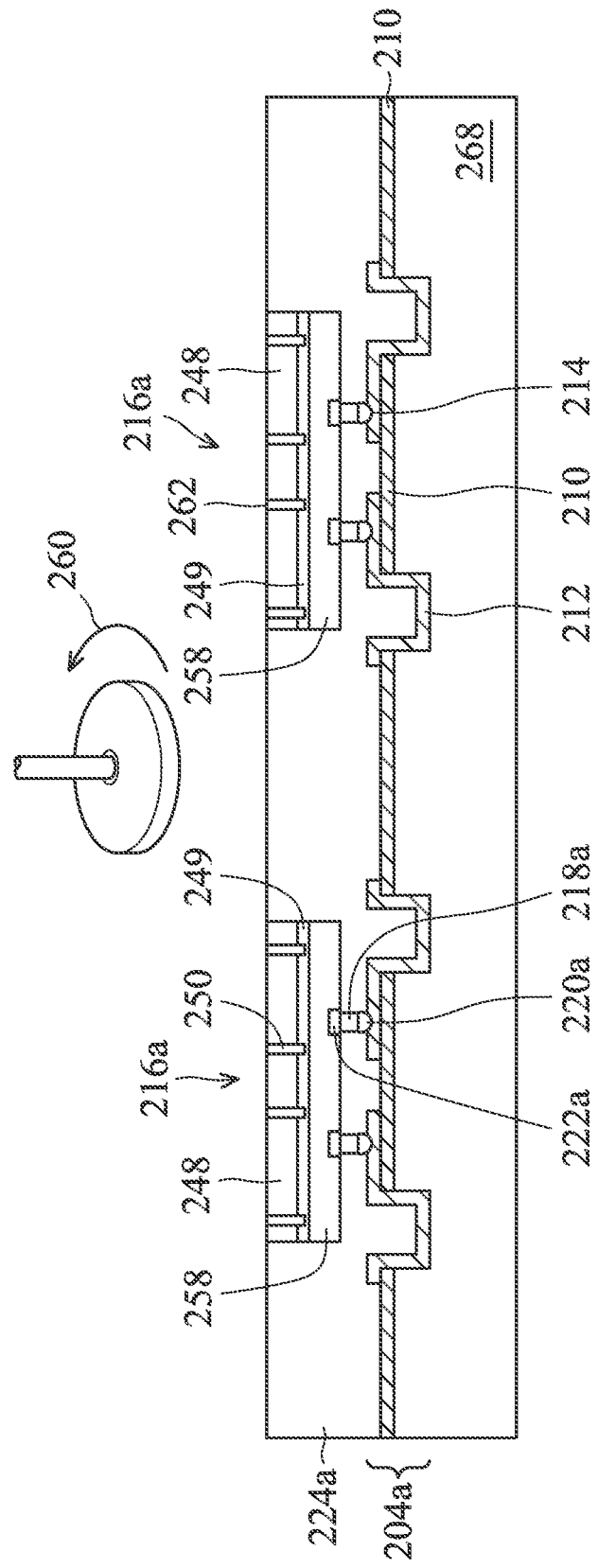
Figure 62:
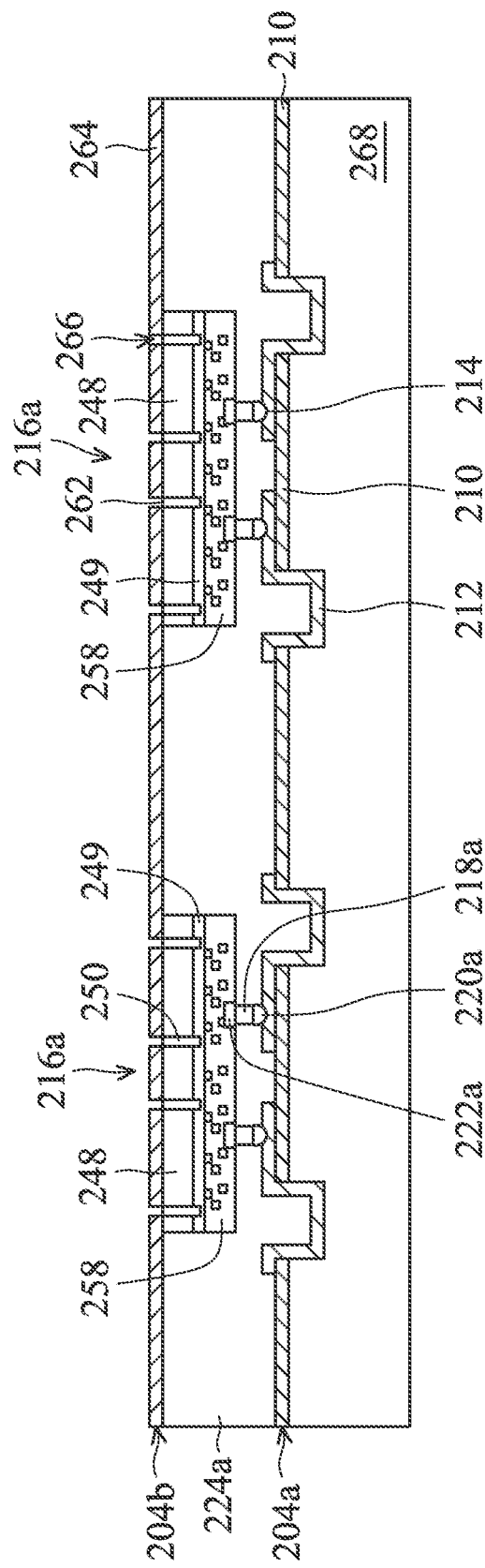
Figure 63:
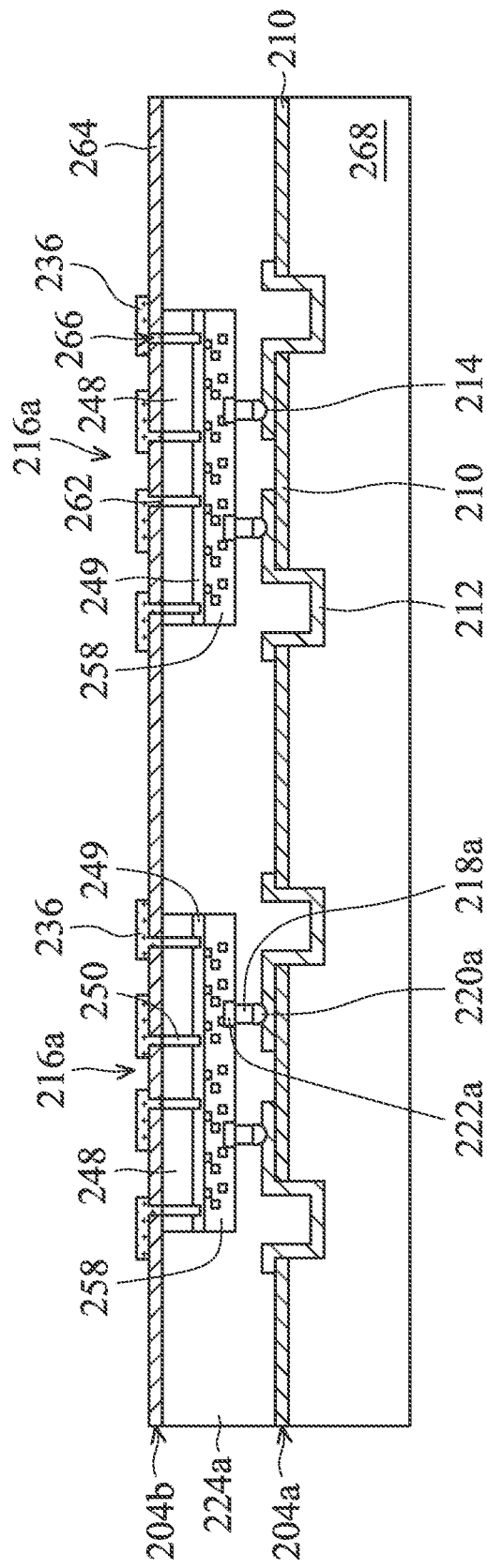
Figure 64:
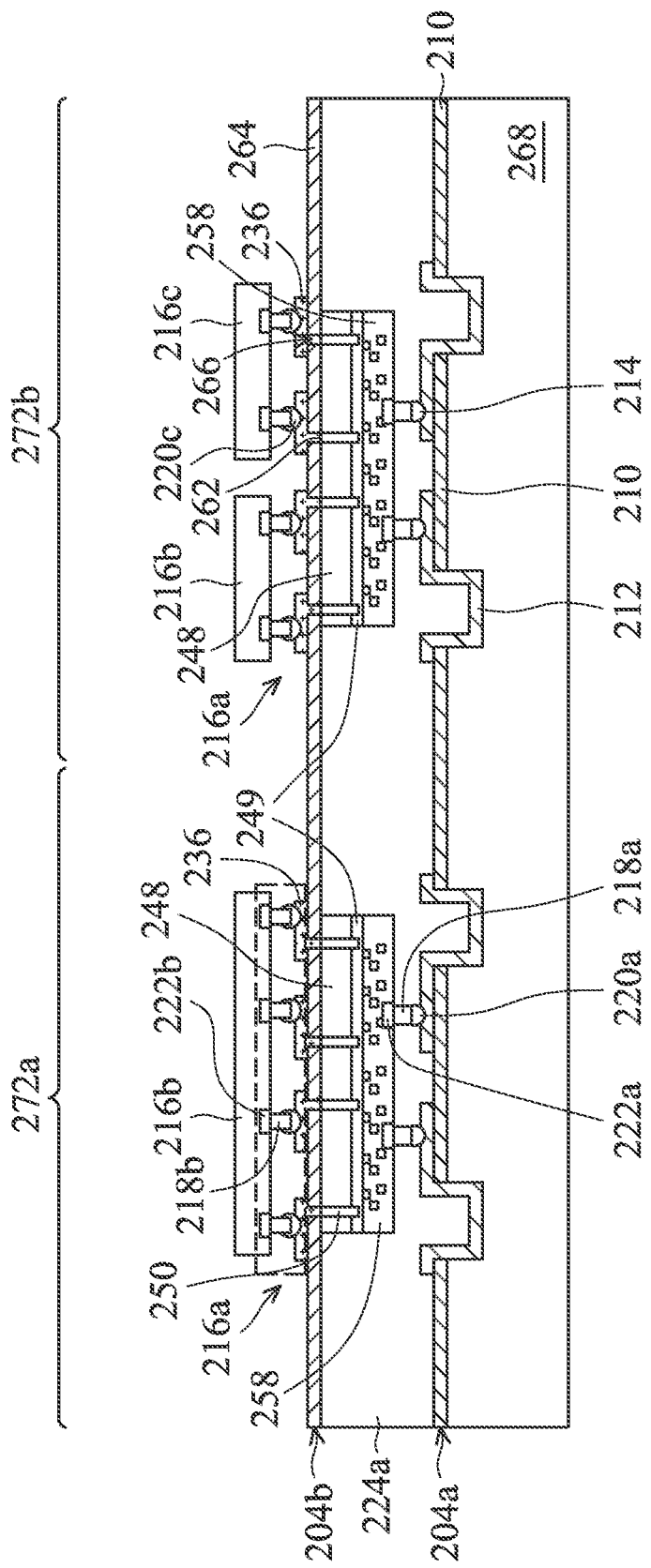
Figure 65:
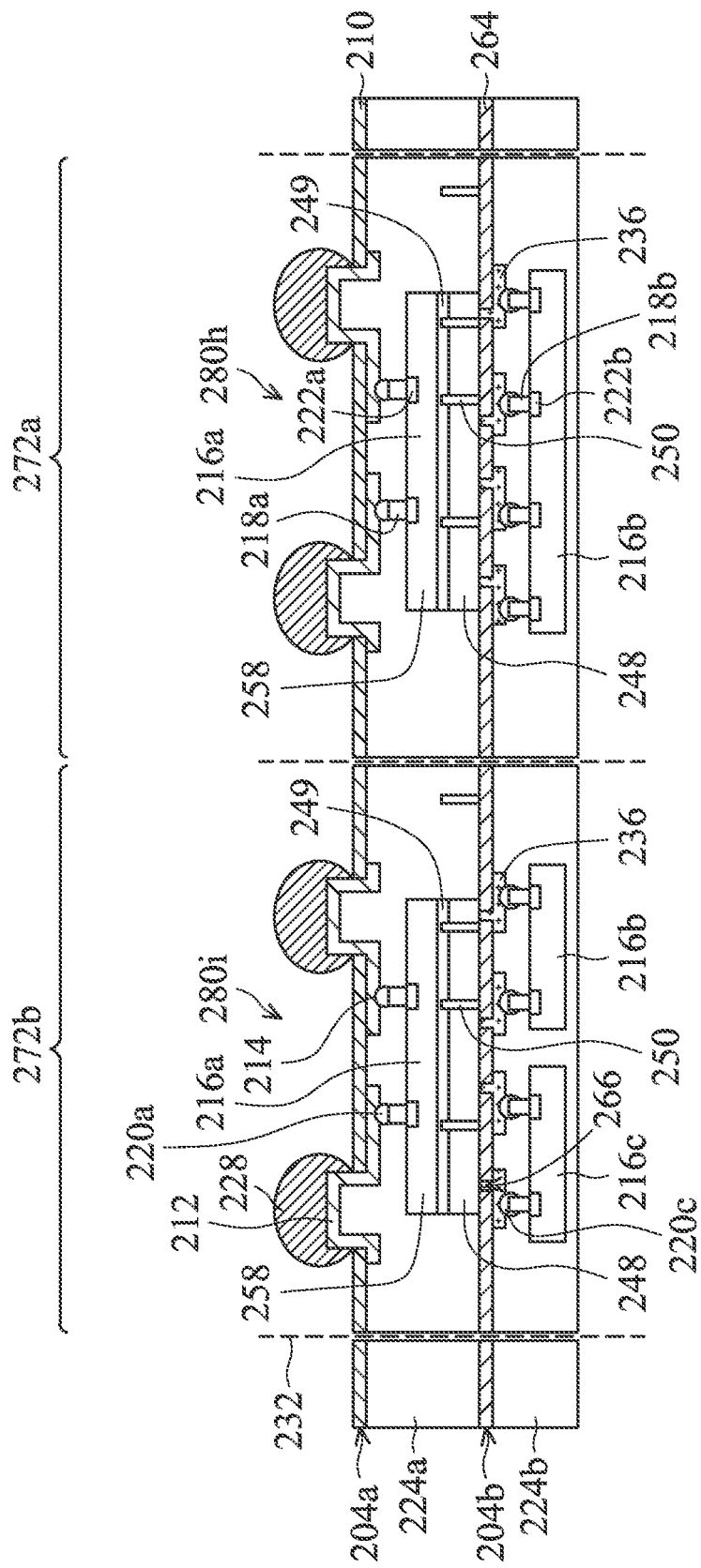

The packaging processes described with reference to FIGS. 40 through 42 are followed, and ICs 216a comprising the TSVs are attached to the wiring 212, as shown in FIG. 61. A first molding compound 224a is formed over the ICs 216, and a CMP process 260 is used to remove a portion of the substrate 248 of the die 216a, exposing a surface 262 of the TSVs of the die 216, as shown in FIG. 61. A similar process flow is followed as was described for FIGS. 34 through 36: insulating material 264 is formed and patterned (FIG. 62), wiring 236 is formed (FIG. 63), the wiring 236 and the insulating material 264 forming a second RDL 204b, and ICs 216b and 216c are attached to the wiring 236 (FIG. 64). The processing steps described for FIGS. 56 and 57 are then followed to achieve the packaged semiconductor devices 280h and 280i shown in FIG. 65.

Figure 66:
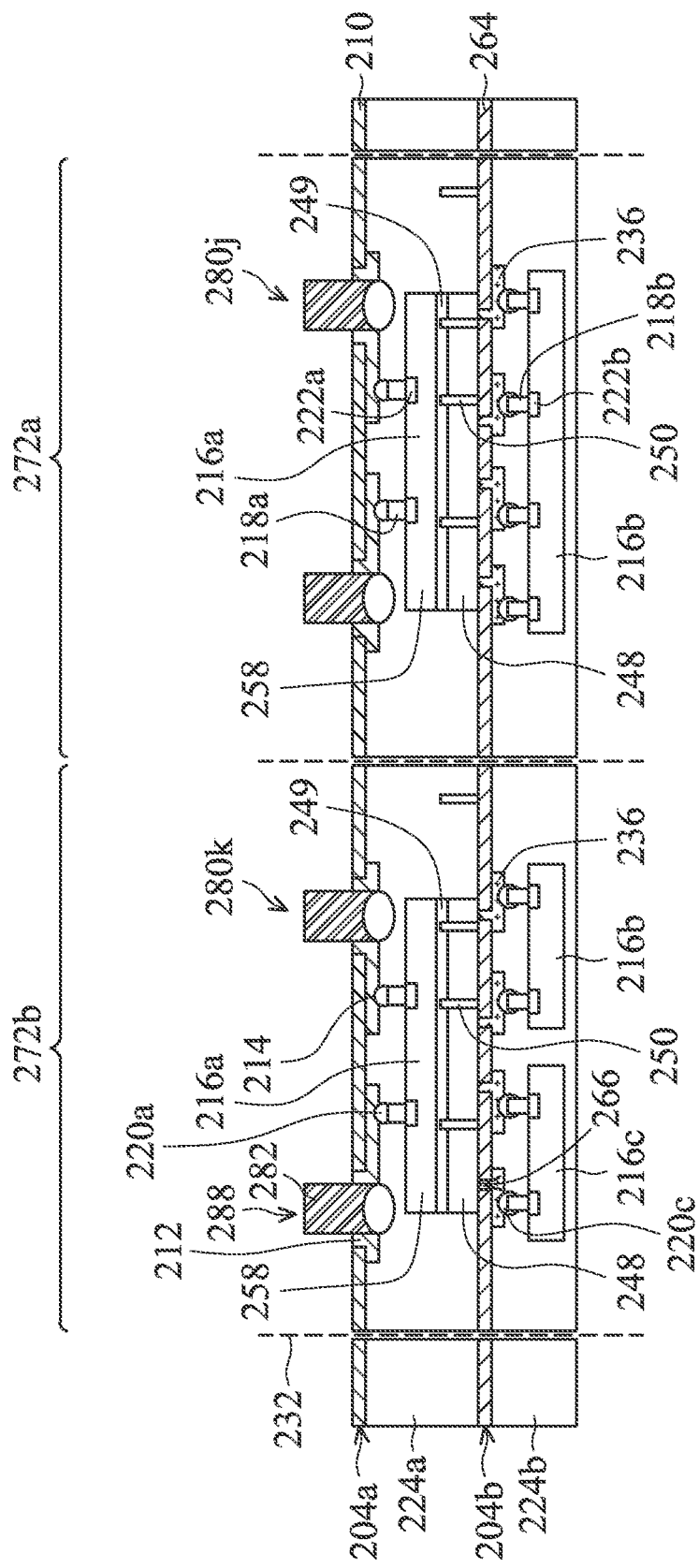
FIG. 66 shows a cross-sectional view of an alternative embodiment to the embodiment shown in FIGS. 59 through 65, wherein metal bumps of the package are formed of solder paste.

FIG. 66 shows a cross-sectional view of an alternative embodiment to the embodiment shown in FIGS. 59 through 65, wherein metal bumps 282 of the package are formed of solder paste, as described with reference to FIG. 58, forming the packaged semiconductor devices 280j and 280k shown.

Figure 67:
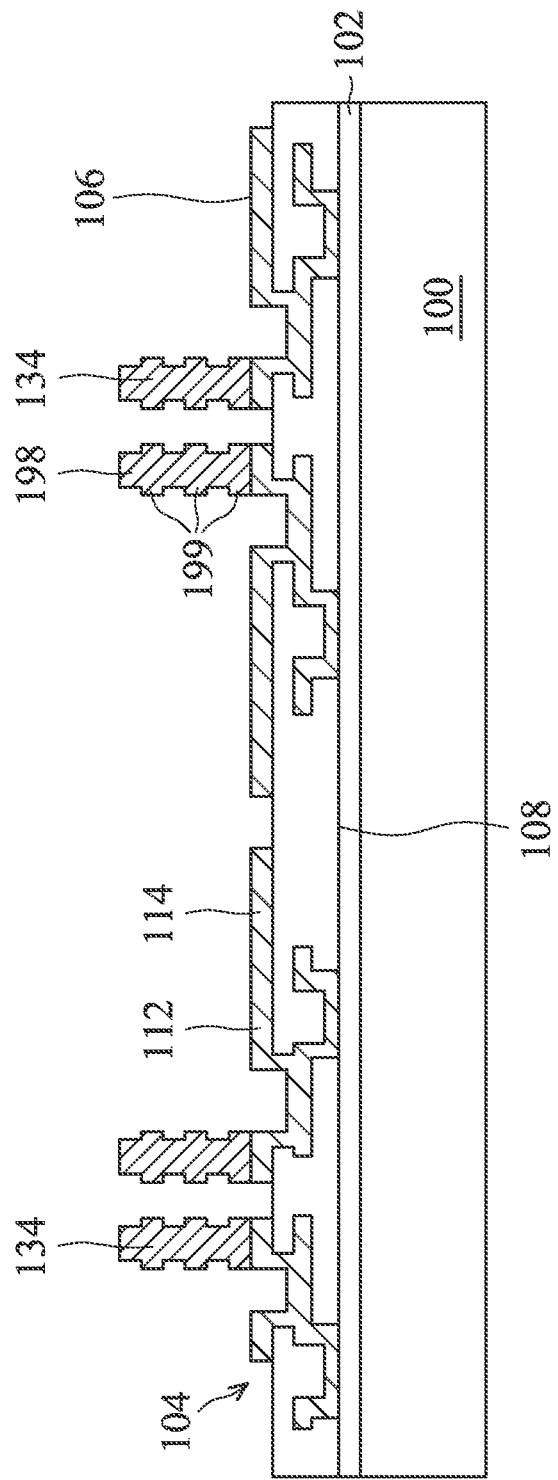
FIG. 67 shows a cross-sectional view of z-axis connections that comprise metal stud bump stackings which may be implemented in embodiments described herein.

The z-axis connections 134 described herein may alternatively comprise metal stud bump stackings, as shown in FIG. 67 in a cross-sectional view. Embodiments of the present disclosure that include z-axis connections 134 may include z-axis connections 134 that comprise the metal stud bump stackings rather than the other z-axis connection types previously described herein, for example. Each metal stud bump stacking comprises a metal stud 198 with a plurality of bumps 199 formed thereon, disposed vertically along the height of the stud 198. Two or more solder bumps 199 may be formed on each stud 198. The studs 198 may comprise Au, Cu, other metals, or combinations thereof, and the bumps 199 may comprise solder, other materials, or combinations thereof, as examples.

Advantages of embodiments of the disclosure include providing novel packaging methods and structures for semiconductor devices. In some embodiments, ICs 116, 116a, 116b, 216a, or 216b are packaged separately. In other embodiments, multiple ICs 116, 116a, 116b, 116c, 216a, 216b, or 216c are packaged in a single package and may be stacked vertically or arranged laterally within a single material layer. The ICs may include TSV ICs that provide vertical connections, or vertical connections (z axis connections) may be made using wire bonds, solder balls, metal pillars, or metal stud bump stackings. The RDLs 104, 104a, 104b, 204, 204a, and 204b may be formed using a carrier wafer or a substrate. One carrier wafer or two carrier wafers may be used to form the novel packages described herein. The novel packaging methods and structures are easily implementable in packaging and manufacturing process flows.

The novel packages methods and structures of embodiments advantageously do not require a substrate, which saves time, expense, space, and weight. The packages are highly reliable because there is no CTE mismatch concern (because there is no substrate), and have low manufacturing costs and high yields. ICs are attached and bonded using BOT techniques which results in highly reduced costs.

Embodiments described herein employ chip redistribution and molding technology to effectively re-perform a new wafer using the carrier wafers 100, 200, and 268, enlarging the chip area for RDL layout. 3D-SiP can be achieved by implementing TSV chip redistribution, by drilling vias in the molding compound. Embodiments combine 3D-TSV and fan-out wafer level processing (WLP) to achieve a high input/output fan-out. Chip redistribution modeling methods are simplified, and a high amount of die shift control is achieved. In some embodiments, a bare silicon wafer is used as a handling carrier wafer 268 and also as a sacrificial tool to form the RDL and 3D structure ball pad. The 3D structure for the ball pad in some embodiments (e.g., in the embodiments shown in FIGS. 46, 47, 57, and 65) results in improved joint reliability and facilitates the packaging of large packages. The novel package structures described herein are advantageously produced using wafer level processes in some embodiments.

SiP structures having a small form factor are achievable with embodiments described herein. More mature package types may be attached to the packages, such as free chip ball grid array (FCBGA), wire bond BGA, wafer level chip scale packages (WLCSP), or passive devices, as examples. 3D wafer level bonding (WLB) packages such as 3D eWLB packages and 3D-TSV eWLB packages, SiP, 3D-SiP, PoP structures, and fan-out WLPs are achievable by embodiments of the disclosure described herein.

Embodiments of the present disclosure include the methods of packaging semiconductor devices or die 116, 116a, 116b, 116c, and 116d described herein, and also include packaged semiconductor devices 140, 140a, 140b, 140c, 140d, 140e, 140f, 140g, 140h, 140i, 140j, 140k, 140m, 280, 280a, 280b, 280c, 280d, 280e, 280f, 280g, 280h, 280i, 280j, and 280k that have been packaged using the methods and materials described herein. Embodiments also include the packages for semiconductor devices described herein.

In accordance with one embodiment of the present disclosure, a packaged semiconductor device includes an RDL having a first surface and a second surface opposite the first surface. At least one integrated circuit is coupled to the first surface of the RDL, and a plurality of metal bumps is coupled to the second surface of the RDL. A molding compound is disposed over the at least one integrated circuit and the first surface of the RDL.

In accordance with another embodiment, a package for a semiconductor device includes an RDL that includes at least one ILD and at least one metallization layer. The at least one metallization layer is formed in the at least one ILD. A plurality of traces is disposed on a first surface of the RDL, and a plurality of landing pads is disposed on a second surface of the RDL, the second surface being opposite the first surface. The plurality of landing pads is electrically coupled respectively to the plurality of traces by wiring in the at least one metallization layer.

In accordance with yet another embodiment, a method of packaging a semiconductor device includes providing a carrier wafer and forming an RDL over the carrier wafer. The RDL includes at least one ILD and at least one metallization layer. The at least one metallization layer is formed in the at least one ILD and has a first surface and a second surface opposite the first surface. The method includes coupling at least one integrated circuit to the first surface of the RDL, and forming a molding compound over the at least one integrated circuit and the first surface of the RDL. A plurality of metal bumps is formed on the second surface of the RDL, and the carrier wafer is removed.

In accordance with another embodiment, a method includes forming a redistribution layer (RDL) comprising at least one inter-level dielectric (ILD) and at least one first metallization layer formed in the at least one ILD and coupling a first integrated circuit to a first surface of the RDL, with the first integrated circuit in electrical contact with first traces of the at least one first metallization layer. A first molding compound is formed over the first integrated circuit and the first surface of the RDL with a first surface of the first molding compound disposed above a top surface of the first integrated circuit. A second metallization layer is formed having second traces on the first surface of the first molding compound, with the second traces in electrical contact with the first traces. A second integrated circuit is coupled to the second traces, and a second molding compound is formed over the second integrated circuit and in direct contact with a portion of the first surface of the first molding compound.

In accordance with another embodiment, a method includes forming a redistribution layer (RDL) having first traces disposed in a dielectric layer, with a portion of the first traces exposed at a first surface of the RDL. Vertical connections are formed over the RDL, with the vertical connections being electrically coupled to the first traces at the first surface of the RDL. A first integrated circuit is mounted to the first surface of the RDL, with the first integrated circuit electrically coupled to the first traces. A first molding compound is formed over the first integrated circuit and the first surface of the RDL, with the first molding compound extending around the vertical connections and above the first integrated circuit. Second traces formed over the first molding compound and vertical connections, with the second traces having portions extending laterally over the first molding compound from the vertical connections. A second integrated circuit is coupled to the second traces, the second integrated circuit being electrically connected to the first traces through the second traces and the vertical connections. A second molding compound is formed over the second integrated circuit and the second traces, the second molding compound in contact with the first molding compound.

In accordance with another embodiment, a method includes forming a redistribution layer (RDL) comprising a plurality of inter-level dielectrics (ILDs) each having a metallization layer formed therein and forming vertical connectors over the RDL, with the vertical connections being electrically coupled to first traces in the metallization layers. A first molding compound is formed over the RDL, the first molding compound extending around the vertical connectors. A portion of the first molding compound is removed and first ends of the vertical connections are exposed. Wiring is formed on the first molding compound and on the first ends of the vertical connections. An integrated circuit is coupled to the second traces, with the integrated circuit being electrically connected to the traces in the RDL through the vertical connections. A second molding compound is formed over the integrated circuit and the second traces, with second molding compound in direct contact with a portion of the first molding compound.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a redistribution layer (RDL) comprising at least one inter-level dielectric (ILD) and at least one first metallization layer formed in the at least one ILD;
   coupling a first integrated circuit to a first surface of the RDL, the first integrated circuit in electrical contact with first traces of the at least one first metallization layer;
   forming a first molding compound over the first integrated circuit and the first surface of the RDL, a first surface of the first molding compound disposed above a top surface of the first integrated circuit;
   forming a second metallization layer having second traces on the first surface of the first molding compound, the second traces in electrical contact with the first traces;
   coupling a second integrated circuit to the second traces; and
   forming a second molding compound over the second integrated circuit and in direct contact with a portion of the first surface of the first molding compound.

2. The method of claim 1, further comprising forming vertical connections over the RDL prior to the forming the first molding compound;
   wherein the forming the first molding compound comprises forming the first molding compound around the vertical connections; and
   wherein the forming the second metallization layer comprises forming the second traces in electrical contact with the first traces through the vertical connections.

3. The method according to claim 1, wherein the first integrated circuit comprises through vias;

wherein the forming the first molding compound comprises removing a portion of first integrated circuit, thus exposing the through vias; and wherein the forming the second metallization layer comprises forming the second traces in electrical contact with the through vias.

4. The method of claim 1, wherein the RDL is formed on a carrier prior to the coupling the first integrated circuit to the first surface of the RDL and prior to the forming the first molding compound over the first integrated circuit.

5. The method of claim 1, wherein a portion of the second integrated circuit extends directly over a portion of the first integrated circuit.

6. The method of claim 1, further comprising forming conductive metal bumps on a second surface of the RDL opposite the first surface.

7. The method of claim 1, wherein the second molding compound extends below a topmost surface of the second traces.

8. A method comprising:
   forming a redistribution layer (RDL) having first traces disposed in a dielectric layer, a portion of the first traces exposed at a first surface of the RDL;
   forming vertical connections over the RDL, the vertical connections being electrically coupled to the first traces at the first surface of the RDL;
   mounting a first integrated circuit to the first surface of the RDL, the first integrated circuit electrically coupled to the first traces;
   forming a first molding compound over the first integrated circuit and the first surface of the RDL, the first molding compound extending around the vertical connections and above the first integrated circuit;
   forming second traces over the first molding compound and vertical connections, the second traces having portions extending laterally over the first molding compound from the vertical connections;
   coupling a second integrated circuit to the second traces, the second integrated circuit being electrically connected to the first traces through the second traces and the vertical connections; and
   forming a second molding compound over the second integrated circuit and the second traces, the second molding compound in contact with the first molding compound.

9. The method of claim 8, wherein the forming the first molding compound comprises planarizing a first surface of the first molding compound such that the first surface of the first molding compound is substantially planar with first surfaces of the vertical connections.

10. The method of claim 9, wherein the forming the second traces over the first molding compound and vertical connections comprises forming portions of the second traces in direct contact with the first surfaces of the vertical connections.

11. The method according to claim 8, wherein the first integrated circuit comprises through vias; and wherein the forming the first molding compound comprises planarizing a first surface of the first molding compound and a first surface of the first integrated circuit such that the first surface of the first molding compound is substantially planar with first surfaces of the through vias.

12. The method according to claim 11, wherein the forming the second traces comprising forming portions of the second traces in contact with the first surfaces of the through vias.

13. The method of claim 8, wherein the RDL is formed on a carrier prior to the coupling the first integrated circuit to the first surface of the RDL and prior to the forming the first molding compound over the first integrated circuit.

14. The method of claim 8, wherein a portion of the second integrated circuit extends directly over a portion of the first integrated circuit.

15. The method of claim 8, wherein the second molding compound extends between the second traces.

16. A method comprising:
   forming a redistribution layer (RDL) comprising a plurality of inter-level dielectrics (ILDs) each having a metallization layer formed therein;
   forming vertical connectors over the RDL, the vertical connections being electrically coupled to first traces in the metallization layers;
   forming a first molding compound over the RDL, the first molding compound extending around the vertical connectors;
   removing a portion of the first molding compound and exposing first ends of the vertical connections;
   forming second traces on the first molding compound and on the first ends of the vertical connections;
   coupling an integrated circuit to the second traces, the integrated circuit being electrically connected to the first traces in the RDL through the vertical connections; and
   forming a second molding compound over the integrated circuit and the second traces, second molding compound in direct contact with a portion of the first molding compound.

17. The method of claim 16, wherein a portion of the second molding compound extends between the second traces to directly contact the portion of the first molding compound.

18. The method of claim 16, wherein the forming second traces on the first molding compound and vertical connections comprises forming portions of the second traces in direct contact with the first ends of the vertical connections.

19. The method of claim 16, wherein the RDL is formed on a carrier prior the forming the first molding compound over the RDL.

20. The method of claim 16, further comprising forming conductive metal bumps on the RDL opposite the vertical connections.

* * * * *